(12) United States Patent
Irie et al.

(10) Patent No.: US 8,394,569 B2
(45) Date of Patent: *Mar. 12, 2013

(54) RESIST COMPOSITION FOR IMMERSION LITHOGRAPHY AND METHOD FOR FORMING RESIST PATTERN

(75) Inventors: Makiko Irie, Kawasaki (JP); Takeshi Iwai, Kawasaki (JP)

(73) Assignee: Tokyo Ohka Kogyo Co., Ltd., Kawasaki-shi (JP)

( * ) Notice: Subject to any disclaimer, the term of this patent is extended or adjusted under 35 U.S.C. 154(b) by 328 days.

This patent is subject to a terminal disclaimer.

(21) Appl. No.: 12/278,376

(22) PCT Filed: Feb. 5, 2007

(86) PCT No.: PCT/JP2007/051945
§ 371 (c)(1),
(2), (4) Date: Aug. 5, 2008

(87) PCT Pub. No.: WO2007/094192
PCT Pub. Date: Aug. 23, 2007

(65) Prior Publication Data
US 2009/0042132 A1    Feb. 12, 2009

(30) Foreign Application Priority Data

Feb. 17, 2006  (JP) ................ 2006-041116
Apr. 26, 2006  (JP) ................ 2006-122330

(51) Int. Cl.
*G03F 7/028* (2006.01)
*G03F 7/033* (2006.01)
*G03F 7/038* (2006.01)
*G03F 7/26* (2006.01)

(52) U.S. Cl. ............ 430/270.1; 430/326; 430/910

(58) Field of Classification Search ........... 430/270.1, 430/285.1, 326, 908, 913, 910
See application file for complete search history.

(56) References Cited

U.S. PATENT DOCUMENTS

| | | | |
|---|---|---|---|
| 5,945,517 A | 8/1999 | Nitta et al. | |
| 6,013,416 A | 1/2000 | Nozaki et al. | |
| 6,180,313 B1 | 1/2001 | Yukawa et al. | |
| 6,329,125 B2 | 12/2001 | Takechi et al. | |
| 6,402,503 B1 | 6/2002 | Hickman | |
| 6,525,153 B1 | 2/2003 | Jayaraman et al. | |
| 6,784,312 B2 | 8/2004 | Miyazawa et al. | |
| 6,962,768 B2 | 11/2005 | Kim et al. | |
| 7,799,507 B2 * | 9/2010 | Endo et al. ............. | 430/270.1 |
| 2003/0195298 A1 | 10/2003 | Jayaraman et al. | |
| 2005/0250898 A1 | 11/2005 | Maeda et al. | |
| 2006/0008736 A1 | 1/2006 | Kanda et al. | |
| 2006/0051702 A1* | 3/2006 | Endo et al. ............. | 430/270.1 |
| 2006/0110677 A1 | 5/2006 | Houlihan et al. | |
| 2006/0166130 A1 | 7/2006 | Ogata et al. | |
| 2006/0210913 A1 | 9/2006 | Ogata et al. | |
| 2007/0148589 A1* | 6/2007 | Kanda et al. ............ | 430/270.1 |
| 2007/0172769 A1 | 7/2007 | Kanna et al. | |
| 2007/0178405 A1* | 8/2007 | Kanda et al. ............ | 430/270.1 |
| 2007/0190448 A1 | 8/2007 | Ishiduka et al. | |
| 2008/0003517 A1 | 1/2008 | Komoriya et al. | |
| 2009/0053650 A1 | 2/2009 | Irie et al. | |
| 2010/0068661 A1 | 3/2010 | Kanna et al. | |

FOREIGN PATENT DOCUMENTS

| | | |
|---|---|---|
| EP | 1 736 827 A1 | 12/2006 |
| JP | H09-208554 | 8/1997 |
| JP | H10-161313 | 6/1998 |
| JP | H11-35551 | 2/1999 |
| JP | H11-35552 | 2/1999 |
| JP | H11-35573 | 2/1999 |
| JP | H11-322707 | 11/1999 |
| JP | 2000-235263 | 8/2000 |
| JP | 2003-40840 | 2/2003 |
| JP | A-2003-262952 | 9/2003 |
| JP | 2005-232095 | 9/2005 |
| JP | 2005-284238 | 10/2005 |
| JP | 2005-316352 | 11/2005 |
| JP | 2005-351942 A | 12/2005 |
| JP | 2006-48029 | 2/2006 |
| JP | 2006-071889 A | 3/2006 |
| JP | 2007-065024 A | 3/2007 |
| JP | A-2007-219471 | 8/2007 |
| TW | 200741347 A | 11/2007 |
| WO | WO 2004/074242 | 9/2004 |
| WO | WO 2007/039346 A2 | 4/2007 |

OTHER PUBLICATIONS

Hoffangle et al., "Liquid Immersion Deep-ultraviolet Interferometric Lithography", Journal of Vacuum Science & Technology B, vol. 17, No. 6, pp. 3306-3309 (1999).
Switkes et al., "Immersion Lithography at 157 nm", Journal of Vacuum Science & Technology B, vol. 19, No. 6, pp. 2353-2356, (2001).
Switkes et al., "Resolution Enhancement of 157 nm Lithography by Liquid Immersion", Proceedings of SPIE, vol. 4691, pp. 459-465, (2002).
International Search Report in connection with corresponding PCT Application No. PCT/JP2007/051945, dated Mar. 13, 2007.
International Search Report issued for PCT Application No. PCT/JP2007/058759, dated May 22, 2007.
Office Action issued on counterpart Taiwanese Patent Application No. 096105296, dated Feb. 9, 2011.
Office Action issued in corresponding Japanese Patent Application No. JP 2006-122330, mailed on Apr. 5, 2011.

* cited by examiner

*Primary Examiner* — Anca Eoff
(74) *Attorney, Agent, or Firm* — Knobbe Martens Olson & Bear LLP

(57) ABSTRACT

A resist composition for immersion lithography of the present invention includes a resin component (A) which exhibits changed alkali solubility under the action of acid; and an acid generator component (B) which generates acid on exposure, wherein the resin component (A) includes a resin (A1) containing a fluorine atom and no acid-dissociable group, and a resin (A2) containing a structural unit (a') derived from an acrylic acid and no fluorine atom.

9 Claims, 2 Drawing Sheets

RESIST COMPOSITION FOR IMMERSION LITHOGRAPHY AND METHOD FOR FORMING RESIST PATTERN

RELATED APPLICATIONS

This application is the U.S. National Phase filing under 35 U.S.C. §371 of PCT/JP2007/051945, filed Feb. 5, 2007, which designated the United States and was published in a language other than English, which claims priority under 35 U.S.C. §119(a)-(d) to Japanese Patent Application No. 2006-041116, filed Feb. 17, 2006, and Japanese Patent Application No. 2006-122330, filed Apr. 26, 2006. The content of these applications is incorporated herein by reference in their entireties.

TECHNICAL FIELD

The present invention relates to a resist composition for immersion lithography which is used in immersion lithography, and a method for forming a resist pattern.

BACKGROUND ART

Lithography methods are widely used in the production of microscopic structures in a variety of electronic devices such as semiconductor devices and liquid crystal devices, and ongoing miniaturization of the structures of these devices has lead to demands for further miniaturization of the resist patterns used in these lithography processes. With current lithography methods, using the most up-to-date ArF excimer lasers, fine resist patterns with a line width of approximately 90 nm are able to be formed, but in the future, even finer pattern formation will be required.

In order to enable the formation of these types of ultra fine patterns, the development of appropriate exposure apparatus and corresponding resists is the first requirement.

In the case of resists, chemically amplified resists, which enable high levels of resolution to be achieved, are able to utilize a catalytic reaction or chain reaction of an acid generated by irradiation, exhibit a quantum yield of 1 or greater, and are capable of achieving high sensitivity, are attracting considerable attention, and development of these resists is flourishing.

In positive chemically amplified resists, resins having acid-dissociable, dissolution-inhibiting groups are the most commonly used. Examples of known acid-dissociable, dissolution-inhibiting groups include acetal groups such as ethoxyethyl groups, tertiary alkyl groups such as tert-butyl groups, as well as tert-butoxycarbonyl groups and tert-butoxycarbonylmethyl groups. Furthermore, structural units derived from tertiary ester compounds of (meth)acrylic acid, such as 2-alkyl-2-adamantyl(meth)acrylates, are widely used as the structural units containing an acid-dissociable, dissolution-inhibiting group within the resin component of conventional ArF resist compositions, as disclosed in the patent reference 1 listed below.

On the other hand, in the case of the exposure apparatus, techniques such as shortening the wavelength of the light source used, and increasing the diameter of the lens aperture (NA) (namely, increasing NA) are common. For example, for a resist resolution of approximately 0.5 μm, a mercury lamp for which the main spectrum is the 436 nm g-line is used, for a resolution of approximately 0.5 to 0.30 μm, a similar mercury lamp for which the main spectrum is the 365 nm i-line is used, for a resolution of approximately 0.30 to 0.15 μm, 248 nm KrF excimer laser light is used, and for resolutions of approximately 0.15 μm or less, 193 nm ArF excimer laser light is used. In order to achieve even greater miniaturization, the use of $F_2$ excimer laser light (157 nm), $Ar_2$ excimer laser light (126 nm), EUV (extreme ultraviolet radiation: 13.5 nm), EB (electron beams), and X-rays and the like is also being investigated.

However, shortening the wavelength of the light source requires a new and expensive exposure apparatus. Furthermore, if the NA value is increased, then because the resolution and the depth of focus range exist in a trade-off type relationship, even if the resolution is increased, a problem arises in that the depth of focus reduces.

Against this background, a method known as immersion exposure has been reported (for example, see non-patent references 1 to 3). This method includes a step in which exposure (immersion exposure) is conducted with the region between the lens and the resist film disposed on top of the wafer, which has conventionally been filled with air or an inert gas such as nitrogen, filled with a solvent (an immersion medium) that has a larger refractive index than the refractive index of air.

According to this type of immersion exposure, it is claimed that higher resolutions equivalent to those obtained using a shorter wavelength light source or a larger NA lens can be obtained using the same exposure light source wavelength, with no reduction in the depth of focus. Furthermore, immersion exposure can be conducted using existing exposure apparatus. As a result, it is predicted that immersion exposure will enable the formation of resist patterns of higher resolution and superior depth of focus at lower costs. Also, in the production of semiconductor elements, which requires enormous capital investment, immersion exposure is attracting considerable attention as a method that offers significant potential to the semiconductor industry, both in terms of cost and in terms of lithography properties such as resolution. Currently, water is mainly used as the immersion medium for immersion lithography.

[Patent Reference 1]
Japanese Unexamined Patent Application, First Publication No. Hei 10-161313

[Non-Patent Reference 1]
Journal of Vacuum Science & Technology B (U.S.), 1999, vol. 17, issue 6, pp. 3306 to 3309.

[Non-Patent Reference 2]
Journal of Vacuum Science & Technology B (U.S.), 2001, vol. 19, issue 6, pp. 2353 to 2356.

[Non-Patent Reference 3]
Proceedings of SPIE (U.S.), 2002, vol. 4691, pp. 459 to 465.

DISCLOSURE OF INVENTION

However, many factors associated with immersion lithography remain unknown, and the formation of an ultra fine resist pattern of a level suitable for actual use remains problematic. For example, in immersion lithography, an immersion medium comes into contact with a resist film and a lens during immersion exposure as described previously.

Therefore, it is assumed that materials in a resist are eluted into an immersion medium so as to change the quality of a resist film and to deteriorate the performance thereof. Also, it is assumed that eluted materials cause the local change in refractive index of an immersion medium and the contamination of lens surface. For these reasons, it is afraid that the lithography properties are subject to adverse effects. In other words, the problems are predicted, in which sensitivity would be deteriorated, a resulting resist pattern would be T-top shaped, and surface roughness and selling of a resist pattern would occur.

As a method to solve the aforementioned problems, for example, it is studied to grow the resistance of a resist film to an immersion medium (immersion medium resistance). Currently, an aqueous solvent such as water is mainly studied as an immersion medium, it is speculated that the improvement of hydrophobicity of a resist film would be effective for the improvement of immersion medium resistance.

However, the improvement of hydrophobicity of a resist film requires the change of the composition of a resist which usually deteriorate lithography properties. Therefore, although the hydrophobicity of a resist film is improved to use for immersion lithography, it is difficult to form a fine pattern at a level for practical use.

The present invention takes these problems into consideration, with an object of providing a resist composition for immersion lithography which is suitable for immersion lithography and excellent in lithography properties, and a method for forming a resist pattern.

As a result of intensive investigation, the inventors of the present invention discovered that by simultaneously using an acrylic resin and a specific fluorine atom-containing resin, the above object could be achieved, and they were therefore able to complete the present invention.

In other words, a first aspect of the present invention is a resist composition for immersion lithography that includes a resin component (A) which exhibits changed alkali solubility under the action of acid; and an acid generator component (B) which generates acid on exposure, wherein the resin component (A) includes a resin (A1) containing a fluorine atom and no acid-dissociable group, and a resin (A2) containing a structural unit (a') derived from an acrylic acid and no fluorine atom.

Moreover, a second aspect of the present invention is a method for forming a resist pattern that includes forming a resist film on a substrate using the resist composition for immersion exposure of the first aspect, conducting immersion exposure of the resist film, and developing the resist film to form a resist pattern.

In the present invention, the term "structural unit" refers to a monomer unit that contributes to the formation of a polymer (resin).

The term "alkyl group", unless stated otherwise, refers to a straight-chain, branched-chain, or cyclic alkyl group.

The term "lower alkyl group" refers to an alkyl group having 1 to 5 carbon atoms.

The term "exposure" is not limited to irradiation with light, but describes a general concept that includes irradiation with any form of radiation, such as an electron beam.

The present invention is able to provide a resist composition for immersion lithography which is suitable for immersion lithography and excellent in lithography properties, and a method for forming a resist pattern.

BEST MODE FOR CARRYING OUT THE INVENTION

Figure 1:
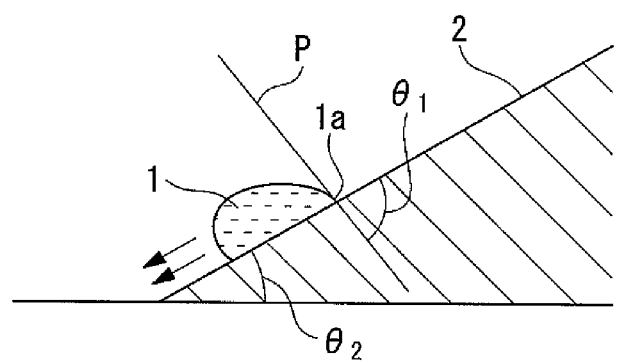
FIG. 1 is a schematic diagram describing a receding angle ($\theta_1$) and a sliding angle ($\theta_2$).

As follows is a more detailed description of the present invention.

<<Resist Composition for Immersion Lithography>>

A resist composition for immersion lithography of the present invention includes a resin component (A) which exhibits changed alkali solubility under the action of acid (hereinafter referred to as the component (A)); and an acid generator component (B) which generates acid on exposure (hereinafter referred to as the component (B)).

In the present invention, the resin component (A) needs to include a resin (A1) containing a fluorine atom and no acid-dissociable group, and a resin (A2) containing a structural unit (a') derived from an acrylic acid and no fluorine atom.

In the present description and claims, the term "acid-dissociable group" refers to a group which is dissociated under the action of acid generated from the component (B). Examples of an acid-dissociable group dose not include a lactone-containing cyclic group in a structural unit (a'2), a polar group-containing aliphatic hydrocarbon group in a structural unit (a'3), and a polycyclic aliphatic hydrocarbon group in a structural unit (a'4), which are described below.

An acid-dissociable group is not particularly limited as long as it is dissociated under the action of acid generated from the component (B), and for example, it is possible to use any groups that have been proposed as acid-dissociable, dissolution-inhibiting groups for the base resins of chemically amplified resists. Specific examples of acid-dissociable, dissolution-inhibiting groups include groups exemplified as acid-dissociable, dissolution-inhibiting groups in a structural unit (a'1) described below.

Herein, the term "dissolution-inhibiting" of acid-dissociable, dissolution-inhibiting groups means that the acid-dissociable, dissolution-inhibiting groups have an effect of inhibiting the dissolubility of the component (A) to an alkali such as an alkali developing solution (dissolution-inhibiting effect). In the present invention, an "acid-dissociable group" may have a dissolution-inhibiting effect, or not.

A resist composition for immersion lithography of the present invention may be either a positive resist composition or a negative resist composition, and is preferably a positive resist composition.

When a resist composition for immersion lithography of the present invention is a negative resist composition, the component (A) is an alkali-soluble resin, and a cross-linking agent (C) is blended therein. In the negative resist composition, when acid is generated from the component (B) upon exposure during resist pattern formation, the action of this acid causes cross-linking between the alkali-soluble resin and the cross-linking agent, causing the composition to become alkali-insoluble.

As the alkali-soluble resin, a resin containing a structural unit derived from at least one selected from an α-(hydroxyalkyl)acrylic acid and lower alkylate esters of an α-(hydroxyalkyl)acrylic acid is preferred because a good resist pattern with small swelling can be formed. Herein, an α-(hydroxyalkyl)acrylic acid refers to one or both of an acrylic acid, in which a hydrogen atom is bonded to the α-position carbon atom to which a carboxyl group is bonded, and an α-(hydroxyalkyl)acrylic acid, in which a hydroxyalkyl group (preferably a hydroxyalkyl group having 1 to 5 carbon atoms) is bonded to this α-position carbon atom.

As the cross-linking agent (C), an amino-based cross-linking agent such as glycoluril containing a methylol group or alkoxymethyl group is usually preferably used because a good resist pattern with small swelling can be formed. The blending quantity of the cross-linking agent (C) is preferably within a range from 1 to 50 parts by mass relative to 100 parts by mass of the alkali-soluble resin.

When a resist composition for immersion lithography of the present invention is a positive resist composition, the resin, which contains an acid-dissociable, dissolution-inhibiting group and exhibits increased alkali solubility under the action of acid, is used as a component (A). In the negative resist composition including this component (A), when acid is generated from the component (B) upon exposure during resist pattern formation, this acid causes the dissociation of the acid-dissociable, dissolution-inhibiting groups, making the resin component (A) alkali-soluble. Therefore, when selective exposure is conducted to the resist composition coated on a substrate, the alkali-solubility of the exposed portion is increased, and alkali-developing can be conducted.

[Resin (A1)]

The resin (A1) is not particularly limited as long as it contains a fluorine atom and no acid-dissociable group.

In the present invention, a resin (A1) preferably contains an alkali-soluble group in each case of a positive or negative resist composition. By containing an alkali-soluble group, the alkali-solubility of the component (A) is enhanced, which contributes the improvement of various lithography characteristics such as resolution and a resist pattern shape, etc. In particular, by containing a fluorine atom-containing alkali-soluble group such as a fluorinated hydroxyalkyl group described below, hydrophobicity of a resist film is improved, and the effect of inhibiting material elution during immersion lithography is excellent, resulting in remarkable improvement of the usability for immersion lithography.

The alkali-soluble group is a group that enhances the alkali-solubility of the resin. A group having relatively small pKa (Ka: acid dissociation constant) is preferred, and a group having pKa within a range from 6 to 12 is more preferred although there is no particular limitation.

Specific examples of the alkali-soluble group include a group containing —OH at the terminal, such as a group containing a hydroxide group (a phenolic hydroxide group or alcoholic hydroxide group) or a carboxylic group. Specific examples of the group containing —OH at the terminal include an alcoholic hydroxide group; a hydroxyalkyl group, in which a hydrogen atom is bonded to a carbon atom (α-position carbon atom) to which a hydroxyl group is bonded, is substituted with an electron-withdrawing group (electron-withdrawing group-substituted hydroxyalkyl group); and a carboxyl group.

Among these, as the alkali-soluble group, an electron-withdrawing group-substituted hydroxyalkyl group is preferred.

In the electron-withdrawing group-substituted hydroxyalkyl group, the alkyl group is preferably straight-chain or branched-chain. The number of carbon atoms within the electron-withdrawing group-substituted hydroxyalkyl group is not particularly limited, but is preferably 1 to 20, more preferably 4 to 16, and most preferably 4 to 12.

The number of the hydroxyl group is not particularly limited, but is preferably 1.

Examples of the electron-withdrawing group include a halogen atom or a halogenated alkyl group, and a halogen atom is preferred.

Examples of the halogen atom include a fluorine atom or a chlorine atom, and a fluorine atom is preferred.

In the halogenated alkyl group, halogen means the same as the aforementioned halogen atom, and an alkyl group is preferably a lower alkyl group such as a methyl group, an ethyl group, or a propyl group, preferably a methyl group or an ethyl group, and most preferably a methyl group.

The number of the electron-withdrawing group is 1 or 2, and preferably 2.

More specific and preferable examples of the electron-withdrawing group-substituted hydroxyalkyl group include an electron-withdrawing group containing a —$CR^{71}R^{72}OH$ group in which $R^{71}$ and $R^{72}$ each independently represents an alkyl group, a halogen atom, or a halogenated alkyl group, and at least one thereof is selected from a halogen atom and a halogenated alkyl group.

The resin (A1) preferably contains a fluorinated hydroxyalkyl group in each case of a positive or negative resist composition. The effects of the present invention are enhanced due to this group. Moreover, this group is effective for the reduction in defect and LER (line edge roughness: unevenness of line side wall). The defect refers to general abnormalities detected by inspection of the resist pattern following developing, from directly above the resist pattern, using a surface defect inspection device such as that manufactured by KLA Tencor Corporation (trade name: KLA). Examples of these abnormalities include post-developing scum, foam, dust, bridges across different portions of the resist pattern, color irregularities, and precipitated deposits.

Herein, the term "fluorinated hydroxyalkyl group" refers to a hydroxyalkyl group in which at least one of hydrogen atoms are substituted with a hydroxyl group and at least one or all or the rest hydrogen atoms (which are not substituted with hydroxyl groups in an alkyl group) is substituted with fluorine atoms. In the fluorinated hydroxyalkyl group, the hydrogen atom of the hydroxyl group is likely to be released by fluorination.

In the fluorinated hydroxyalkyl group, the alkyl group is preferably straight-chain or branched-chain. The number of carbon atoms within the alkyl group is not particularly limited, but is preferably within a range from 1 to 20, more preferably from 4 to 16, and most preferably from 4 to 12. The number of the hydroxyl group is not particularly limited, but is preferably 1.

Among these, preferable examples of the fluorinated hydroxyalkyl group include a group in which a fluorinated alkyl group and/or a fluorine atom are bonded to a carbon atom to which a hydroxyl group is bonded (which refers to the α-position carbon atom of the hydroxyalkyl group herein).

In particular, the fluorinated alkyl group bonded to the α-position is preferably a perfluoroalkyl group in which all of the hydrogen atoms of the alkyl group are substituted with fluorine atoms.

In the present invention, it is particularly preferable that the resin (A1) be a group represented by the following general formula (I).

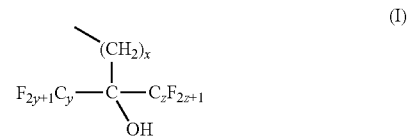

(I)

[In the above formula, x represents an integer of 0 to 5, y and z each independently represents an integer of 1 to 5.]

In the above formula, x preferably represents an integer of 0 to 3, and particularly preferably 0 or 1.

y and z preferably represents an integer of 1 to 3, and most preferably 1.

The resin (A1) preferably contains a structural unit (a) derived from an acrylic acid in each case of a positive or negative resist composition.

In the present specification and claims, the term "acrylic acid" refers to generic concept that includes a narrowly-defined acrylic acid ($CH_2$=CHCOOH), and derivatives thereof in which at least one or all of the hydrogen atoms are substituted with other groups or atoms.

Examples of the acrylic acid derivatives include an α-substitution acrylic acid in which a substituent group (an atom or group other than a hydrogen atom) is bonded to the α-position carbon atom of the narrowly-defined acrylic acid, and an acrylate ester in which a hydrogen atom of a carboxyl group in the acrylic acid is substituted with an organic group.

The term "organic group" refers to a carbon atom-containing group, and is not particularly limited as an organic group in an acrylate ester. Examples thereof include groups bonded to the ester side chain portion of the acrylate ester in the structural units exemplified in the structural units (a0) and (a'1) to (a'4) described below (a group containing the fluorinated hydroxyalkyl group, an acid-dissociable, dissolution-inhibiting group, a lactone-containing cyclic group, a polar group-containing aliphatic hydrocarbon group, and a polycyclic aliphatic hydrocarbon group, etc).

The term "α-position (α-position carbon atom) of the acrylic acid", unless stated otherwise, refers to the carbon atom to which a carbonyl group is bonded.

Examples of the substituent groups of the α-substitution acrylic acid include a halogen atom, a lower alkyl group, and a halogenated lower alkyl group.

Examples of the halogen atom as the α-position substituent group include a fluorine atom, a chlorine atom, a bromine atom, and an iodine atom, and a fluorine atom is particularly preferable.

Specific examples of the lower alkyl group as the α-position substituent group include lower straight-chain or branched alkyl groups such as a methyl group, an ethyl group, a propyl group, an isopropyl group, an n-butyl group, an isobutyl group, tert-butyl group, a pentyl group, an isopentyl group, and a neopentyl group.

The halogenated lower alkyl group as the α-position substituent group is the aforementioned lower alkyl group in which at least one or all of hydrogen atoms are substituted with the aforementioned halogen atoms.

What is bonded to the α-position of the acrylic acid is preferably a hydrogen atom, a halogen atom, a lower alkyl group, or a halogenated lower alkyl group, more preferably a hydrogen atom, a fluorine atom, a lower alkyl group, or a halogenated lower alkyl group, and most preferably a hydrogen atom and a methyl group in terms of industrial availability.

The term "structural unit derived from an acrylic acid" refers to a structural unit formed by cleavage of the ethylene based double bond of an acrylic acid.

The term "structural unit derived from an acrylate ester" refers to a structural unit formed by cleavage of the ethylene based double bond of an acrylate ester.

Examples of the structural unit (a) include structural units represented by the following general formula (a).

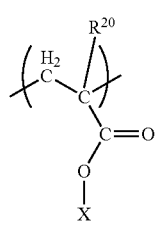

(a)

[In the above formula, $R^{20}$ represents a hydrogen atom, a halogen atom, a lower alkyl group, or a halogenated lower alkyl group; X represents a hydrogen atom or a monovalent organic group.]

Examples of a halogen atom, a lower alkyl group, and a halogenated lower alkyl group as $R^{20}$ include the same as the halogen atom, the lower alkyl group, and the halogenated lower alkyl group as the aforementioned α-position substituent group.

Examples of an organic group as X include the same as the aforementioned the aforementioned "organic group in an acrylate ester".

The resin (A1) preferably contains the structural unit (a) within a range from 50 to 100 mol %, and more preferably from 70 to 100 mol %, relative to the combined total of all the structural units that constitute the component (A1). It is particularly preferable that the resin (A1) consist of the structural units (a) derived from an acrylic acid because this resin is excellent in the effects of the present invention.

Herein, the term "consist of the structural units (a)" refers to the main chain of the resin (A1) that is made of only the structural units (a) and contains no other structural units.

In the present invention, the resin (A1) preferably contains a structural unit (a0) derived from an acrylate ester containing a fluorinated hydroxyalkyl group at a side chain portion.

In the present specification and claims, the term "side chain portion" refers to the portion that does not constitute the main chain.

Examples of the structural unit (a0) include a structural unit represented by the aforementioned general formula (a) in which X represents a group containing a fluorinated hydroxyalkyl group.

In the present invention, the structural unit (a0) preferably contains at least one of structural units represented by the general formulas (a0-1) and (a0-2).

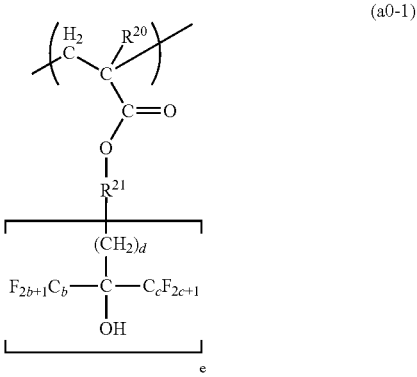

(a0-1)

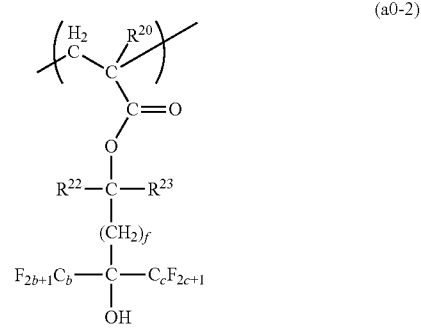

(a0-2)

[In the above formulas, $R^{20}$ represents a hydrogen atom, an alkyl group, a halogen atom, or a halogenated alkyl group; $R^{21}$ represents an (e+1)-valent aliphatic cyclic group or (e+1)-valent chain-like saturated aliphatic hydrocarbon group; $R^{22}$ and $R^{23}$ each independently represents a hydrogen atom or a monovalent aliphatic cyclic group, and at least one of $R^{22}$ and $R^{23}$ represent the aliphatic cyclic group; d and f each independently represents an integer of 0 to 5; b and c each independently represents an integer of 1 to 5; and e represents an integer of 1 to 3.]

Examples of $R^{20}$ in the general formula (a0-1) include the same ones as those defined for the group $R^{20}$ in the aforementioned formula (a). $R^{20}$ in the general formula (a0-1) preferably represents a hydrogen atom or an alkyl group, and particularly preferably a hydrogen atom or a methyl group.

$R^{21}$ represents an (e+1)-valent aliphatic cyclic group or (e+1)-valent chain-like saturated aliphatic hydrocarbon group.

In the present specification and claims, the term "aliphatic" is a relative concept used in relation to the term "aromatic", and defines a group or compound or the like that contains no aromaticity.

The term "(e+1)-valent aliphatic cyclic group" refers to an aliphatic cyclic group in which (e+1) of hydrogen atoms, which are boded to the carbon atom that constitutes the ring structure, have been removed.

The term "(e+1)-valent chain-like saturated aliphatic hydrocarbon group" refers to a chain-like (straight-chain or branched-chain) saturated aliphatic hydrocarbon group in which (e+1) of hydrogen atoms have been removed.

The aliphatic cyclic group may be a monocyclic or polycyclic group. The term "aliphatic monocyclic group" describes a monocyclic group that contains no aromaticity. The term "aliphatic polycyclic group" describes a polycyclic group that contains no aromaticity.

The aliphatic cyclic group includes both hydrocarbon groups formed solely from carbon and hydrogen (alicyclic groups), and heterocyclic groups in which at least one of the carbon atoms that constitute the ring structure of the alicyclic group have been substituted with a hetero atom such as an oxygen atom, nitrogen atom, or sulfur atom. As the aliphatic cyclic group, alicyclic groups are preferred.

The aliphatic cyclic group may be either saturated or unsaturated, although a saturated group is preferred, as such groups exhibit superior transparency to ArF excimer lasers and the like, and also exhibit excellent resolution and depth of focus (DOF).

The number of carbon atoms within the aliphatic cyclic group is preferably within a range from 3 to 20, more preferably within from 4 to 15, and still more preferably from 5 to 15.

Specific examples of the aliphatic cyclic group include the groups described below. Examples of suitable monocyclic groups include groups in which (e+1) or more hydrogen atoms, which include the hydrogen atoms substituted with the fluorinated hydroxyalkyl groups hereinafter, the same applies), have been removed from a cycloalkane. Specific examples include groups in which (e+1) or more hydrogen atoms have been removed from cyclopentane or cyclohexane, and groups in which (e+1) hydrogen atoms have been removed from cyclohexane are particularly preferred.

Examples of suitable polycyclic groups include groups in which (e+1) or more hydrogen atoms have been removed from a bicycloalkane, a tricycloalkane or a tetracycloalkane, etc. Specific examples include groups in which (e+1) or more hydrogen atoms have been removed from a polycycloalkane such as adamantane, norbornane, isobornane, tricyclodecane or tetracyclododecane.

These types of polycyclic groups can be selected appropriately from the multitude of groups have been proposed as ones that constitute acid-dissociable, dissolution-inhibiting groups in the resins of positive photoresist compositions used within ArF excimer laser processes.

In terms of industrial availability, as the monocyclic group, groups in which (e+1) or more hydrogen atoms have been removed from cyclopentane or cyclohexane are preferred, and groups in which (e+1) or more hydrogen atoms have been removed from cyclohexane are particularly preferred. As the polycyclic group, groups in which (e+1) or more hydrogen atoms have been removed from adamantane, norbornane or tetracyclododecane are preferred, and groups in which (c+1) or more hydrogen atoms have been removed from norbornane are particularly preferred.

As the aliphatic cyclic group represented by $R^{21}$, groups in which (e+1) hydrogen atoms have been removed from cyclopentane, cyclohexane, adamantane, norbornane, isobornane, tricyclodecane or tetracyclododecane are preferred, and groups in which (e+1) hydrogen atoms have been removed from norbornane or cyclohexane are particularly preferred.

The (e+1)-valent chain-like saturated aliphatic hydrocarbon group represented by $R^{21}$ may be either straight-chain or branched, and the number of carbon atoms is preferably within a range from 1 to 10, and more preferably from 1 to 8.

Specific examples include groups in which (e+1) hydrogen atoms have been removed from methane, ethane, propane, butane, 2-methylpropane, or 2-methylbutane.

In the general formula (a0-1), b and c each independently represents an integer of 1 to 5, preferably an integer of 1 to 3, and most preferably 1.

d represents an integer of 0 to 5, preferably an integer of 0 to 3, and most preferably 0 or 1.

e represents an integer of 1 to 3, and preferably 1 or 2.

As the structural unit represented by the general formula (a0-11) (hereinafter, referred to as the structural unit (a0-1)), the structural units represented by the general formula (a0-1) in which $R^{21}$ represents an aliphatic cyclic group are preferred, and the structural units represented by the general formulas (a0-1) and (a0-1-2) are particularly preferred.

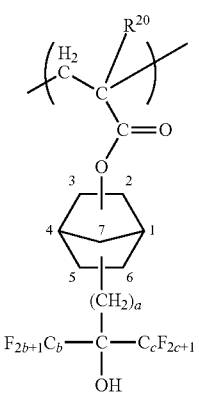

(a0-1-1)

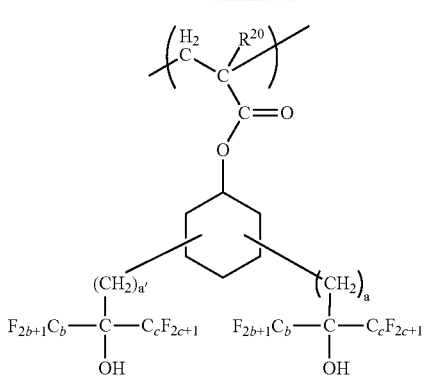

(a0-1-2)

[In the above formulas, $R^{20}$, b, and c represent the same as the aforementioned, and a and a' each independently represents an integer of 0 to 5.]

The structural units represented by the general formula (a0-1-1) are structural units that contains the group in which one of hydrogen atoms of a norbornenyl group has been substituted with a specific fluorinated hydroxyalkyl group $[—(CH_2)_a—C(C_bF_{2b+1})(C_cF_{2c+1})—OH]$.

$R^{20}$ in the formula (a0-1-1) preferably represents a hydrogen atom or a lower alkyl group, particularly preferably a hydrogen atom or a methyl group, and most preferably a hydrogen atom.

a represents an integer of 0 to 5, preferably an integer of 0 to 3, and most preferably 1.

In the formula (a0-1-1), it is particularly preferable that $—(CH_2)_a—C(C_bF_{2b+1})(C_cF_{2c+1})—OH$ be bonded to 5-position or 6-position of a 2-norbonyl group because significant effects of the present invention, easy synthesis, and high etching resistance can be achieved.

The structural units represented by the general formula (a0-1-2) are structural units that contains the group in which two of hydrogen atoms of a cyclohexyl group have been substituted with $—(CH_2)_{a'}—C(C_bF_{2b+1})(C_cF_{2c+1})—OH$.

$R^{20}$ in the formula (a0-1-2) preferably represents a hydrogen atom or a lower alkyl group, particularly preferably a hydrogen atom or a methyl group, and most preferably a methyl group.

a' represents an integer of 0 to 5, preferably an integer of 0 to 3, and most preferably 0.

In the formula (a0-1-2), it is particularly preferable that $—(CH_2)_{a'}—C(C_bF_{2b+1})(C_cF_{2c+1})—OH$ be bonded to 3-position or 5-position of a cyclohexyl group because significant effects of the present invention, easy synthesis, and high etching resistance can be achieved.

The structural units represented by the general formula (a0-2) (hereinafter, referred to as the structural unit (a0-2)) are structural units that contains the group in which hydrogen atoms of a methyl group have been substituted with one $—(CH_2)_f—C(C_bF_{2b+1})(C_cF_{2c+1})—OH$ and one or two aliphatic cyclic groups.

$R^{20}$ in the general formula (a0-2) preferably represents a hydrogen atom or a lower alkyl group, particularly preferably a hydrogen atom or a methyl group, and most preferably a methyl group.

b and c represents the same as b and c in the aforementioned formula (a0-1).

f preferably represent an integer of 1 to 5, more preferably an integer of 1 to 3, and most preferably 1.

$R^{22}$ and $R^{23}$ each independently represents a hydrogen atom or a monovalent aliphatic cyclic group, and at least one of $R^{22}$ and $R^{23}$ represent the aliphatic cyclic group In the present invention, one of $R^{22}$ and $R^{23}$ preferably represents the hydrogen atom and the other preferably represents the aliphatic cyclic group.

Examples of the aliphatic cyclic group represented by $R^{22}$ and $R^{23}$ include the same as ones exemplified as the aforementioned "aliphatic cyclic group", and may be monocyclic or polycyclic.

The number of carbon atoms within the aliphatic cyclic group represented by $R^{22}$ and $R^{23}$ is preferably within a range from 5 to 15, and more preferably from 6 to 12. In particular, as the aliphatic cyclic group represented by $R^{22}$ and $R^{23}$, groups in which one or more hydrogen atoms have been removed from cyclohexane, cyclopentane, norbornane, tricyclodecane or tetracyclododecane are preferred, and groups in which one or more hydrogen atoms have been removed from norbornane are particularly preferred.

In the present invention, as the structural unit (a0-2), the structural units represented by the general formulas (a0-2-1) and (a0-2-2) shown below are particularly preferred because significant effects of the present invention, easy synthesis, and high etching resistance can be achieved.

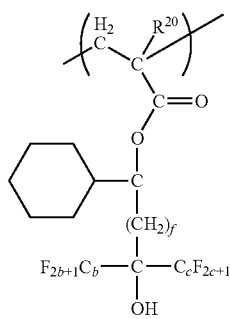

(a0-2-1)

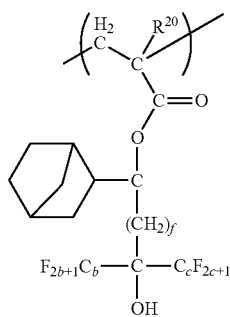

(a0-2-2)

[In the above formulas, $R^{20}$, f, b, and c represent the same as the aforementioned.]

In the present invention, the structural unit (a0) is preferably the structural unit represented by the aforementioned general formula (a0-1) in which $R^{21}$ represents the aliphatic cyclic group, and the structural unit containing the fluorinated hydroxyalkyl group and the monocyclic or polycyclic, aliphatic cyclic group at the side-chain portion as described in the aforementioned structural unit (a0-2). In particular, the structural units represented by the aforementioned general formulas (a0-1-1), (a0-1-2), (a0-2-1) or (a0-2-2) are preferred.

The structural unit (a0) may be used alone or in a combination of two or more kinds thereof.

Within the resin (A1), the proportion of the structural unit (a0) is preferably within a range from 30 to 100 mol %, more preferably from 50 to 100 mol %, even more preferably from 70 to 100 mol %, and most preferably 100 mol %, relative to the combined total of all the structural units that constitute the component (A1). When the proportion of the structural unit (a0) is 30 mol % or more, the effect due to the structural unit (a0) is significant, and high immersion medium resistance can be obtained and lithography characteristics are improved even though the proportion of the resin (A1) within the component (A) is small.

—Another Structural Unit

The resin (A1) may contain another structural unit other than the aforementioned structural unit (a0), without detracting from the effects of the present invention.

There are no particular limitations on such another structural unit as long as it is not classified into the aforementioned structural unit (a0) and contains no acid-dissociable group. The multitude of conventionally known units for use in resist resins for use with an ArF excimer laser or a KrF positive excimer laser, etc (preferably an ArF excimer laser) can be used. Specific examples of such another structural unit include the structural units (a'2) to (a'4) which are exemplified in the resin (A2) described below The resin (A1) can be obtained by polymerizing monomers that derive each of the structural units in a normal method such as a known radical polymerization using a radical polymerization initiator such as azobisisobutyronitrile (AIBN) or dimethyl-2,2'-azobis(2-methylpropionate).

The weight average molecular weight (Mw; the polystyrene equivalent weight average molecular weight determined using gel permeation chromatography (GPC)) of the component (A) is not particularly limited, and is preferably within a range from 2000 to 30000, more preferably from 2000 to 10000, and more preferably from 3000 to 7000. Within the above range, a suitable dissolution rate for an alkali developing solution can be obtained, and the range is preferred in terms of high level of resolution. Within the above range, lower molecular weight tends to give good properties.

Moreover, the polydispersity (Mw/Mn) is preferably within a range from about 1.0 to 5.0, and more preferably from 1.0 to 3.0.

The content of the resin (A1) in the component (A) is preferably at 0.1 mass % or more, more preferably within a range from 0.1 to 50 mass %, still more preferably from 0.1 to 25 mass %, and most preferably from 0.1 to 10 mass %. When the content of the resin (A1) is 0.1 mass % or more, immersion medium resistance is improved. Also, at 50 mass % or less, the balance of the resins (A1) and (A2) is favorable so as to improve lithography characteristics.

[Resin (A2)]

The resin (A2) is not particularly limited as long as it contains a structural unit (a') derived from an acrylic acid and no fluorine atom, and it is possible to use one, or two or more of the alkali-soluble resins or potential resins to be alkali-soluble which have been proposed as base resins for chemically amplified resists. The former is for so-called negative resist compositions, and the latter is for so-called positive resist composition.

Examples of the structural unit (a') include the structural units represented by the aforementioned general formula (a) in which $R^{20}$ represents a hydrogen atom, a halogen atom other than a fluorine atom, a lower alkyl group, or a lower alkyl group in which at least one hydrogen atom is substituted with a halogen atom other than a fluorine atom (a halogenated lower alkyl group); and X represents a hydrogen atom or a monovalent organic group containing no fluorine atom.

The resin (A2) preferably contains the structural unit (a') within a range from 50 to 100 mol %, and more preferably from 70 to 100 mol %, relative to the combined total of all the structural units that constitute the component (A2). It is particularly preferable that the resin (A2) consist of the structural units (a') derived from an acrylic acid because this resin is excellent in the effects of the present invention.

Herein, the term "consist of the structural units (a')" refers to the resin (A2) that is formed solely from the structural units (a') and contains no other structural units.

—Structural Unit (a'1)

When a resist composition for immersion lithography of the present invention is a positive resist composition, the resin (A2) preferably contains a structural unit (a'1) derived from an acrylate ester containing no fluorine atom and an acid-dissociable, dissolution-inhibiting group.

As the acid-dissociable, dissolution-inhibiting group in the structural unit (a'1), it is possible to use any groups that have been proposed as acid-dissociable, dissolution-inhibiting groups for the base resins of chemically amplified resists, as long as the groups exhibit an alkali dissolution-inhibiting effect that renders the resin (A2) insoluble in alkali prior to dissociation, but then causes the resin (A2) to become alkali-soluble upon dissociation. Generally, groups that form either a cyclic or chain-like tertiary alkyl ester with a carboxyl group of (meth)acrylic acid, etc; and an acetal-based, acid-dissociable, dissolution-inhibiting group such as an alkoxyalkyl group are the most widely known. Herein, the term "(meth) acrylic acid" is a generic term that includes both the acrylic acid in which a hydrogen atom is bonded to the α-position, and the methacrylic acid in which a methyl group is bonded to the α-position. Also, the term "(meth)acrylate ester" is a generic term that includes both the acrylate ester in which a hydrogen atom is bonded to the α-position, and the methacrylate ester in which a methyl group is bonded to the α-position.

Herein, the term "tertiary alkyl ester" describes a structure in which an ester is formed by substituting the hydrogen atom of a carboxyl group with a chain-like or cyclic group, and a tertiary carbon atom within the chain-like or cyclic alkyl group is bonded to the oxygen atom at the terminal of the carbonyloxy group (—C(O)—O—). In this tertiary alkyl ester, the action of acid causes cleavage of the bond between the oxygen atom and the tertiary carbon atom.

The chain-like or cyclic alkyl group may contain a substituent group.

Hereinafter, for the sake of simplicity, groups that exhibit acid dissociability as a result of the formation of a tertiary alkyl ester at a carboxyl group are referred to as "tertiary alkyl ester-based, acid-dissociable, dissolution-inhibiting groups".

Examples of these tertiary alkyl ester-based, acid-dissociable, dissolution-inhibiting groups include aliphatic branched-chain, acid-dissociable, dissolution-inhibiting groups and acid-dissociable, aliphatic cyclic group-containing, acid-dissociable, dissolution-inhibiting groups.

The "aliphatic branched-chain, acid-dissociable, dissolution-inhibiting groups" are not limited to groups formed solely from carbon and hydrogen (hydrocarbon groups), although a hydrocarbon group is preferred. In addition, "hydrocarbon groups" may be saturated or unsaturated although saturated hydrocarbon groups are usually preferred.

As the aliphatic branched-chain, acid-dissociable, dissolution-inhibiting groups, tertiary alkyl group having 4 to 8 carbon atoms, and specific examples thereof include a tert-butyl group, a tert-amyl group, and tert-heptyl group.

Examples of the "aliphatic cyclic groups" in the "aliphatic cyclic group-containing, acid-dissociable, dissolution-inhibiting groups" include the same ones as aliphatic cyclic groups exemplified in the aforementioned formula (a0-1).

Furthermore, examples of suitable aliphatic cyclic group-containing, acid-dissociable, dissolution-inhibiting groups include groups that contain a tertiary carbon atom within the ring structure of a cycloalkyl group, and specific examples include a 2-methyl-2-adamantyl group and 2-ethyl-2-adamantyl group.

Other possible examples include groups that contain an aliphatic cyclic group such as an adamantyl group, and a tertiary carbon atom-containing branched-chain alkylene group bonded thereto, such as the group bonded to the oxygen atom of the carbonyloxy group (—C(O)—O—) in the structural unit represented by the general formula (a1″) shown below.

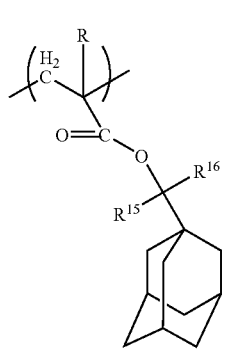

(a1″)

[In the above formula, R represents a hydrogen atom, a halogen atom other than a fluorine atom, a lower alkyl group, or a lower alkyl group in which at least one hydrogen atom is substituted with a halogen atom other than a fluorine atom (a halogenated lower alkyl group); and $R^{15}$ and $R^{16}$ each independently represents a lower alkyl group (which may be either a straight-chain or branched-chain group, and preferably contains 1 to 5 carbon atoms).]

As halogen atoms, lower alkyl groups, and lower alkyl groups represented by R, the same ones as the halogen atoms, the lower alkyl groups, and the lower alkyl groups defined for the group $R^{20}$ in the aforementioned general formula (a) are exemplified, respectively (wherein, a fluorine atom and a fluorinated alkyl group are excluded).

The "acetal-based, acid-dissociable, dissolution-inhibiting group" is generally substituted for the hydrogen atom at the terminal of an alkali-soluble group such as a carboxyl group or a hydroxyl group, and is bonded to the oxygen atom. When acid is produced on exposure, the action of acid causes cleavage of the bond between the acetal-based, acid-dissociable, dissolution-inhibiting group and the oxygen atom to which the acetal-based, acid-dissociable, dissolution-inhibiting group is bonded.

As the acetal-based, acid-dissociable, dissolution-inhibiting group, the groups represented by the general formula (p1) shown below are exemplified.

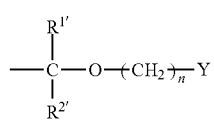

(p1)

[In the above formula, $R^{1'}$ and $R^{2'}$ each independently represents a hydrogen atom or a lower alkyl group, n represents an integer of 0 to 3, and Y represents a lower alkyl group or a aliphatic cyclic group.]

In the above formula, n preferably represents an integer of 0 to 2, more preferably 0 or 1, and most preferably 0.

As lower alkyl groups represented by $R1'$ and $R2'$, the same ones as the lower alkyl groups defined for the aforementioned group R are exemplified, and a methyl group or a ethyl group are preferred, and a methyl group is most preferred.

In the present invention, at least one of $R1'$ and $R2'$ preferably represents a hydrogen atom. In other words, the acid-dissociable, dissolution-inhibiting group (p1) is preferably groups represented by the general formula (p1-1) shown below.

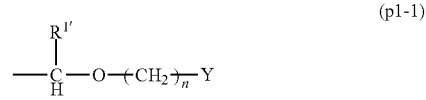

(p1-1)

[In the above formula, $R^{1'}$, n, and Y represents the same as the aforementioned.]

As lower alkyl groups represented by Y, the same ones as the lower alkyl groups defined for the aforementioned group R are exemplified.

As aliphatic cyclic groups represented by Y, it is possible to use any of groups selected from the multitude of monocyclic or polycyclic aliphatic groups that have been proposed in ArF resists, and the same ones as the aforementioned "aliphatic cyclic groups" are exemplified.

As the acetal-based, acid-dissociable, dissolution-inhibiting group, the groups represented by the general formula (p2) shown below are exemplified.

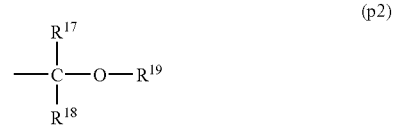

(p2)

[In the above formula, $R^{17}$ and $R^{18}$ each independently represents a straight-chain or branched-chain lower alkyl group or a hydrogen atom, and $R^{19}$ represents a straight-chain, branched-chain, or cyclic alkyl group. In addition, $R^{17}$ and $R^{19}$ each may independently represent a straight-chain or branched-chain alkylene group in which the terminals of $R^{17}$ and $R^{19}$ are bonded together so as to form a ring.]

In $R^{17}$ and $R^{18}$, the alkyl group preferably has 1 to 15 carbon atoms, and may be either straight-chain or branched-chain. Also, an ethyl group and a methyl group are preferred, and a methyl group is most preferred. Furthermore, it is particularly preferable that one of $R^{17}$ and $R^{18}$ represent a hydrogen atom and the other represent a methyl group.

$R^{19}$ represents a straight-chain, branched-chain, or cyclic alkyl group which preferably has 1 to 15 carbon atoms, and may be either straight-chain, branched-chain, or cyclic.

When $R^{19}$ represents a straight-chain or branched-chain alkyl group, the number of carbon atoms therein is preferably within a range from 1 to 5, an ethyl group and a methyl group are more preferred, and an ethyl group is most preferred.

When $R^{19}$ represents a cyclic alkyl group, the number of carbon atoms therein is preferably within a range from 4 to 15, more preferably from 4 to 12, and most preferably from 5 to 10. Specific examples thereof include groups in which one or more hydrogen atoms have been removed from a polycycloalkane such as a monocycloalkane, a bicycloalkane, a tricycloalkane or a tetracycloalkane, etc which may be substituted with a fluorine atom or a fluorinated alkyl group or not. More specific examples thereof include groups in which one or more hydrogen atoms have been removed from a monocycloalkane such as cyclopentane or cyclohexane, or a polycycloalkane such as adamantane, norbornane, isobornane, tricyclodecane or tetracyclododecane. Among these, groups in which one or more hydrogen atoms have been removed from adamantane are preferred.

In the aforementioned formula, $R^{17}$ and $R^{19}$ each may independently represent a straight-chain or branched-chain alkylene group (preferably an alkylene group having 1 to 5 carbon atoms) in which the terminals of $R^{17}$ and $R^{19}$ are bonded together. In such cases, a cyclic group is formed from the groups $R^{17}$ and $R^{19}$, the oxygen atom to which $R^{19}$ is bonded, and the carbon atom to which the oxygen atom and the group $R^{17}$ are bonded. This type of cyclic group is preferably 4- to 7-membered rings, and more preferably 4- to 6-membered rings. Specific examples of these cyclic groups include a tetrahydropyranyl group and a tetrahydrofuranyl group.

As the structural unit (a1), it is preferable to use at least one selected from the group consisting of the structural units represented by the general formulas (a1-0-1) and (a1-0-2) shown below.

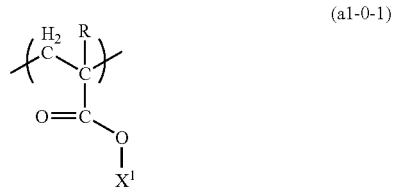
(a1-0-1)

[In the above formula, R represents the same as the aforementioned; and $X^1$ represents an acid-dissociable, dissolution-inhibiting group.]

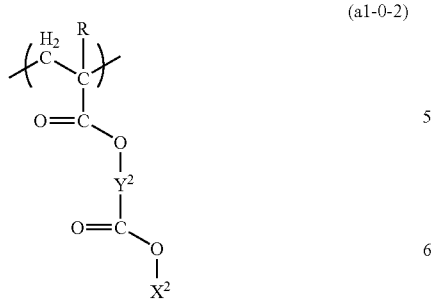
(a1-0-2)

[In the above formula, R represents the same as the aforementioned; $X^1$ represents an acid-dissociable, dissolution-inhibiting group; and $Y^2$ represents an alkylene group or an aliphatic cyclic group.]

In the general formula (a1-0-1), R represents the same as the aforementioned.

$X^1$ is not particularly limited as long as it is an acid-dissociable, dissolution-inhibiting group, examples thereof include the aforementioned tertiary alkyl ester-based, acid-dissociable, dissolution-inhibiting groups, acetal-based and acid-dissociable, dissolution-inhibiting groups, and tertiary alkyl ester-based, acid-dissociable, dissolution-inhibiting groups are preferred.

In the general formula (a1-0-2), R represents the same as the aforementioned.

$X^2$ is the same as $X^1$ in the formula (a1-0-1).

$Y^2$ preferably represents an alkylene group having 1 to 4 carbon atoms or a divalent aliphatic cyclic group, and examples of the aliphatic cyclic group include the same ones as the aforementioned "aliphatic cyclic group" except that groups in which two or more hydrogen atoms have been removed are used.

More specific examples of the structural unit (a1) include the structural units represented by the general formulas (a1-1) to (a1-4) shown below.

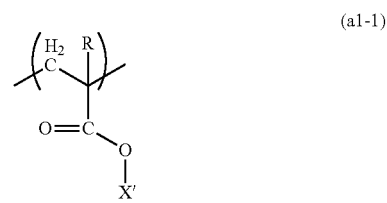
(a1-1)

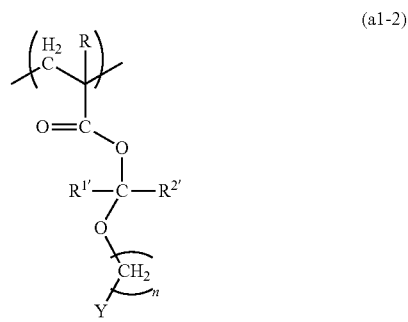
(a1-2)

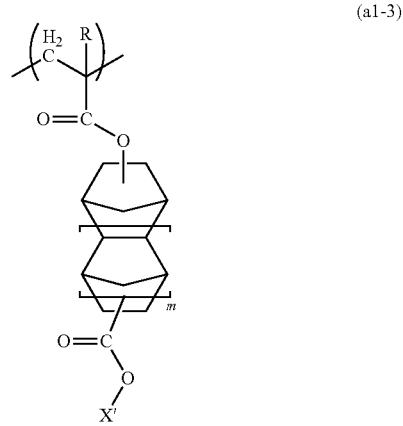
(a1-3)

[In the above formulas, X' represents a tertiary alkyl ester-based, acid-dissociable, dissolution-inhibiting group; Y represents a lower alkyl group having 1 to 5 carbon atoms or an aliphatic cyclic group; n represents an integer from 0 to 3; m represents 0 or 1; R represents the same as the aforementioned; and $R^{1'}$ and $R^{2'}$ each independently represent a hydrogen atom or a lower alkyl group of 1 to 5 carbon atoms.]

At least one of the groups $R^{1'}$ and $R^{2'}$ is preferably a hydrogen atom, and those cases in which both groups are hydrogen atoms are particularly preferred. n is preferably either 0 or 1.

X' represents the same tertiary alkyl ester-based acid-dissociable, dissolution-inhibiting groups as those described above for $X^1$.

Examples of the aliphatic cyclic group represented by Y include the same groups as those exemplified above in the description relating to "aliphatic cyclic groups".

Specific examples of the structural units represented by the above general formulas (a1-1) to (a1-4) are shown below.

(a1-1-10) 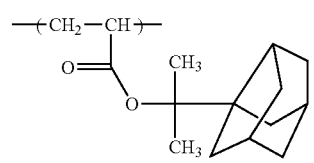
(a1-1-11) 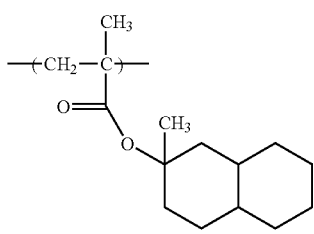
(a1-1-12) 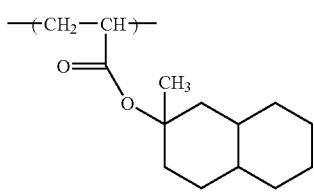
(a1-1-13) 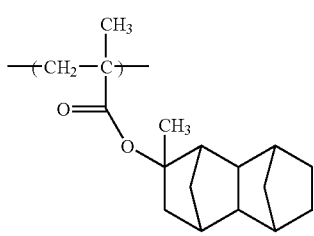
(a1-1-14) 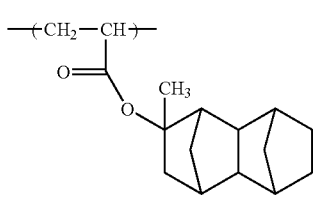
(a1-1-15) 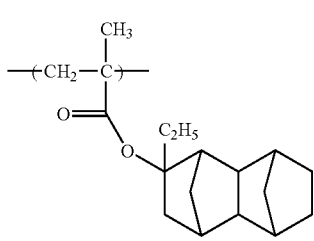
(a1-1-16) 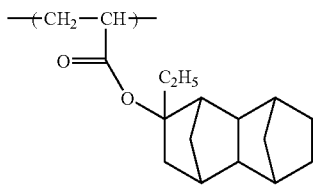
(a1-1-17) 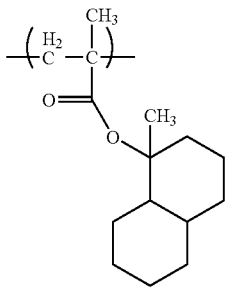
(a1-1-18) 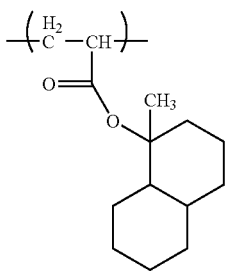
(a1-1-19) 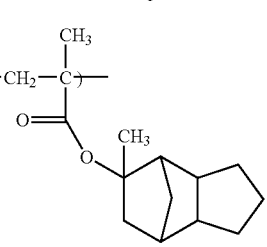
(a1-1-20) 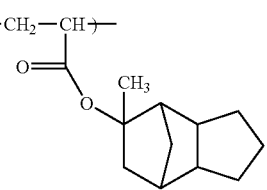
(a1-1-21) 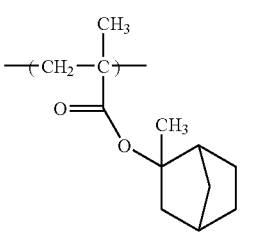
(a1-1-22) 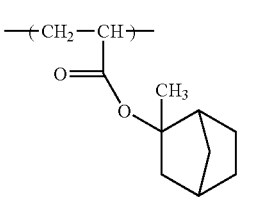
(a1-1-23) 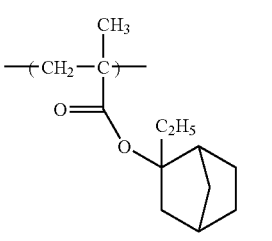

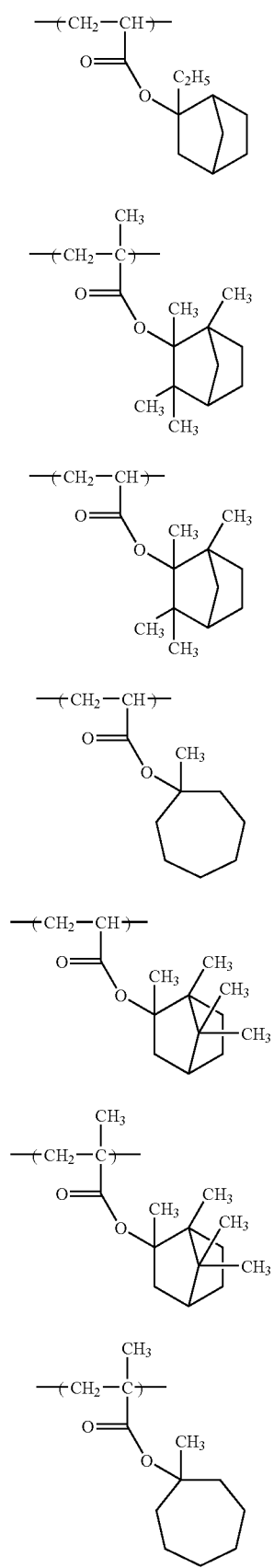
(a1-1-24)
(a1-1-25)
(a1-1-26)
(a1-1-27)
(a1-1-28)
(a1-1-29)
(a1-1-30)
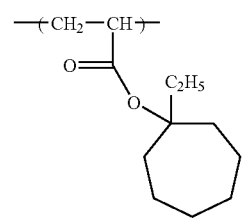
(a1-1-31)
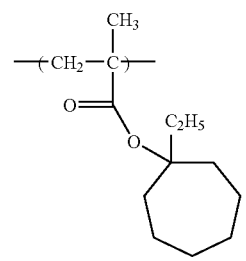
(a1-1-32)
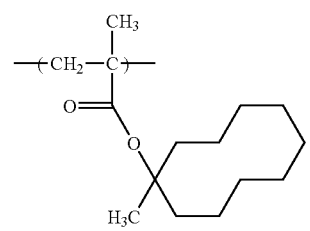
(a1-1-33)
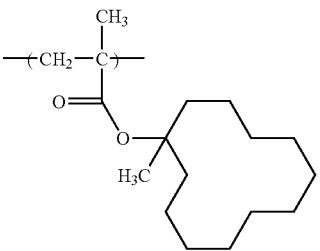
(a1-1-34)
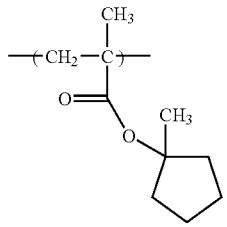
(a1-1-35)
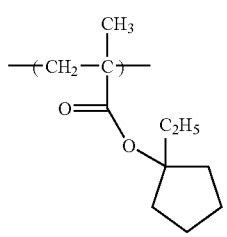
(a1-1-36)

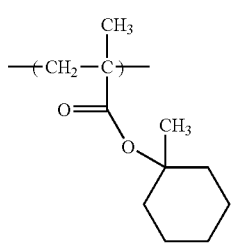
(a1-1-37)
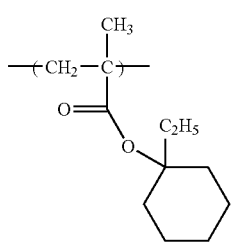
(a1-1-38)
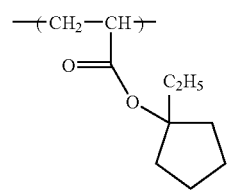
(a1-1-39)
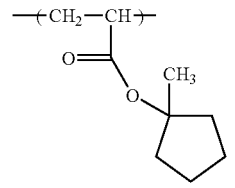
(a1-1-40)
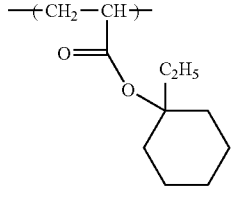
(a1-1-41)
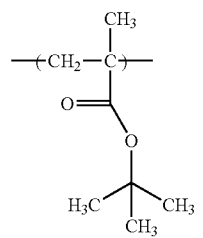
(a1-1-42)
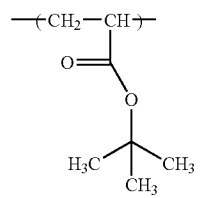
(a1-1-43)
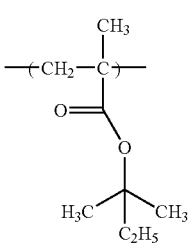
(a1-1-44)
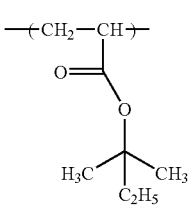
(a1-1-45)
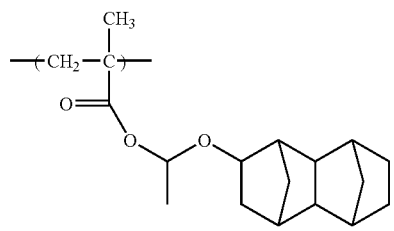
(a1-2-1)
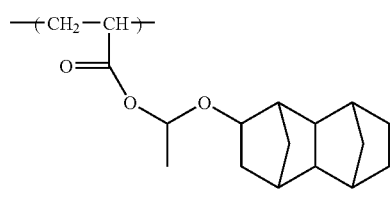
(a1-2-2)
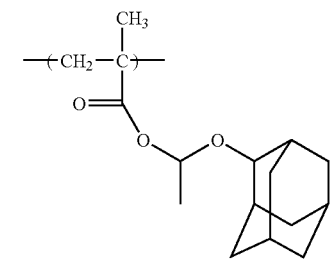
(a1-2-3)
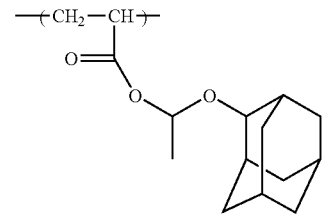
(a1-2-4)
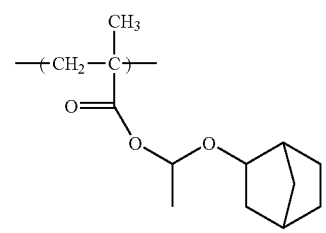
(a1-2-5)

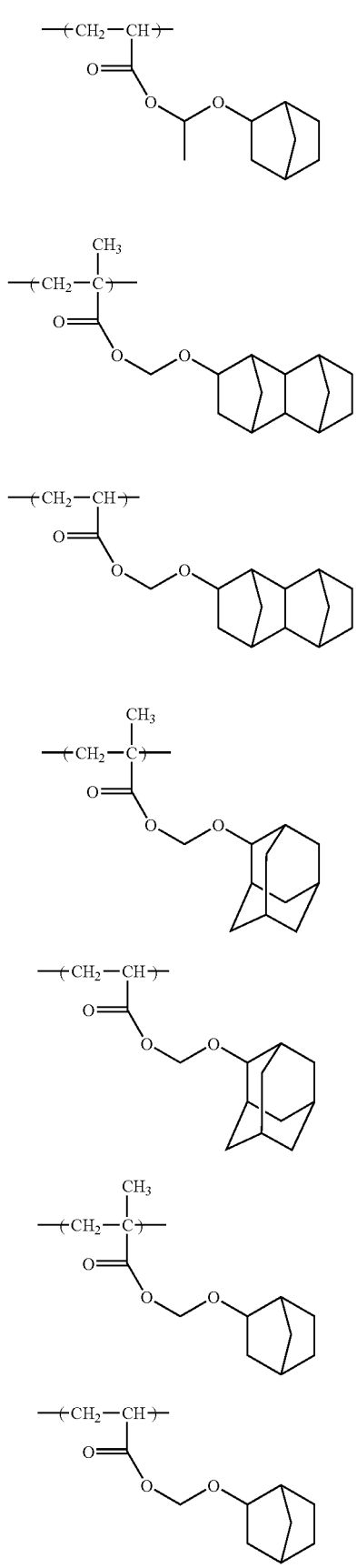
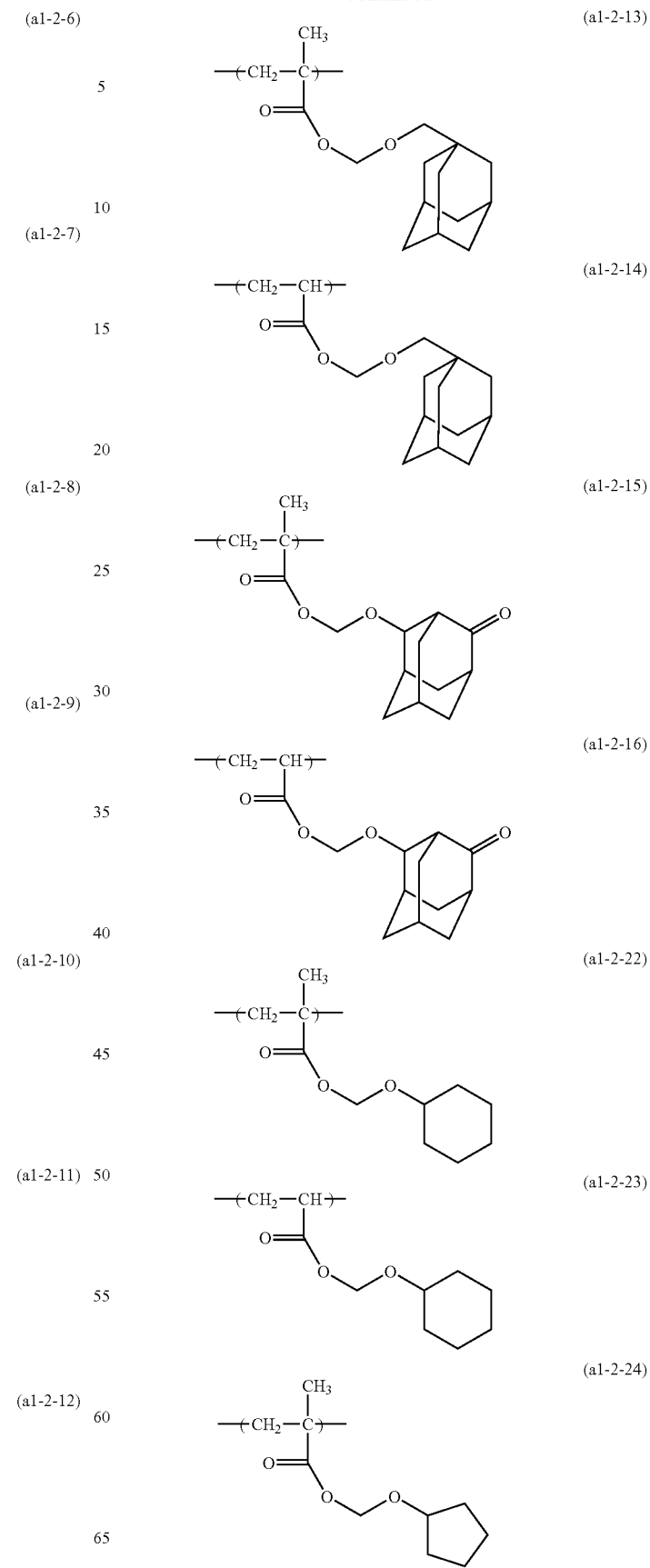

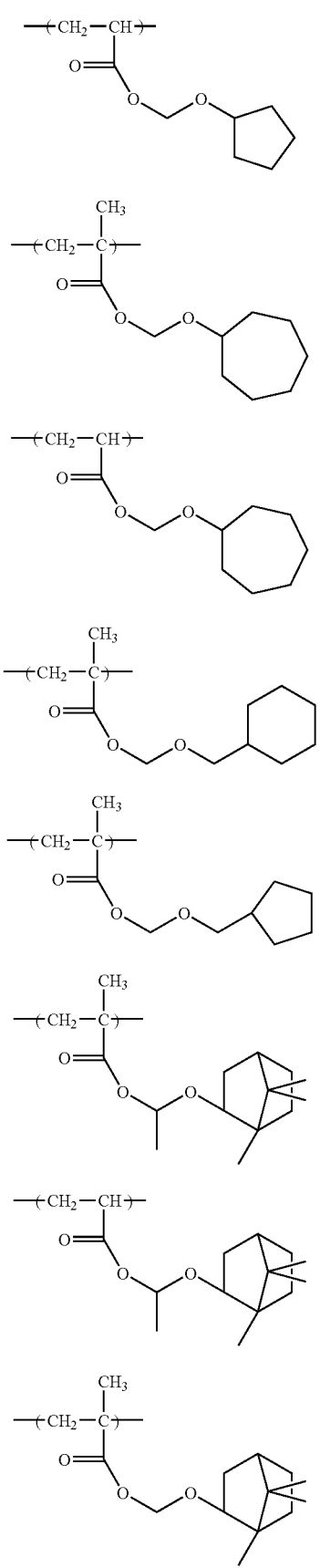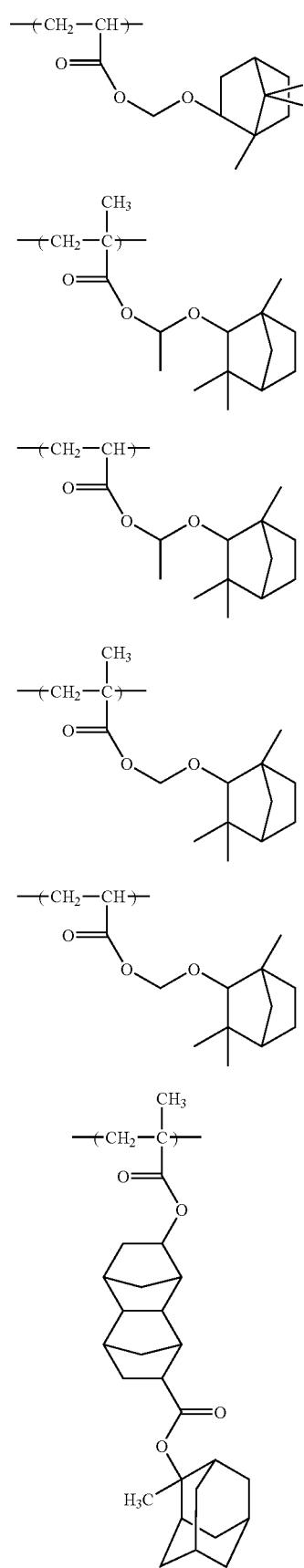

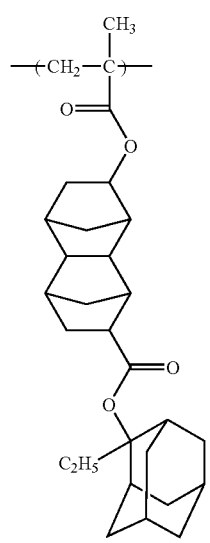
(a1-3-2)
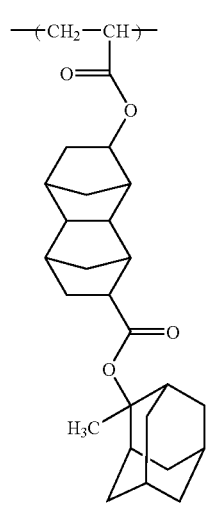
(a1-3-3)
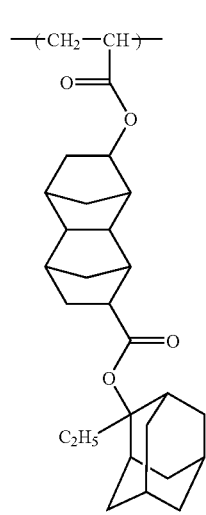
(a1-3-4)
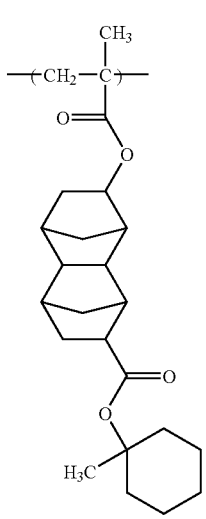
(a1-3-5)
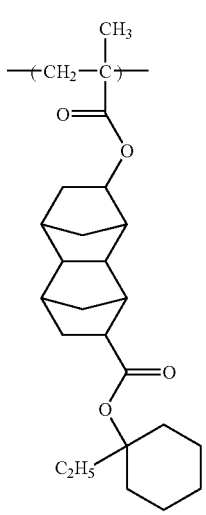
(a1-3-6)
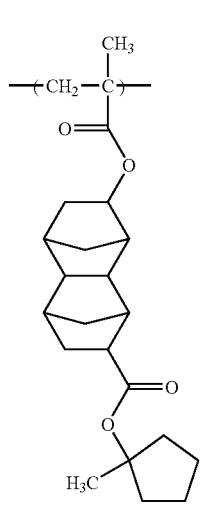
(a1-3-7)

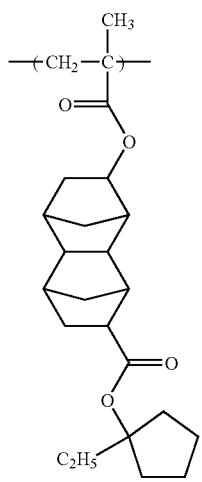
(a1-3-8)
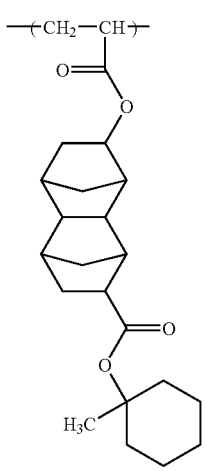
(a1-3-9)
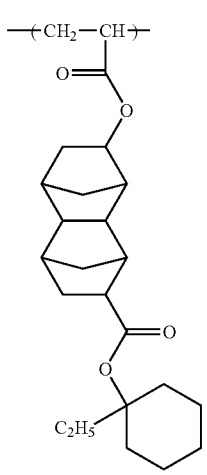
(a1-3-10)
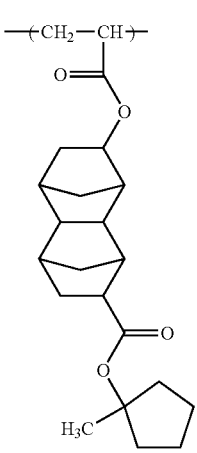
(a1-3-11)
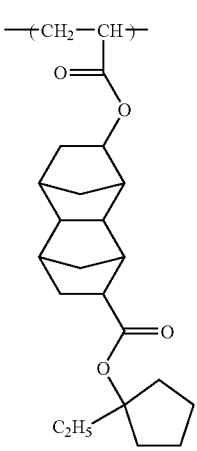
(a1-3-12)
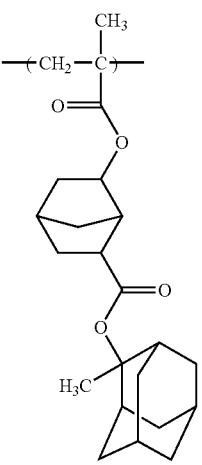
(a1-3-13)

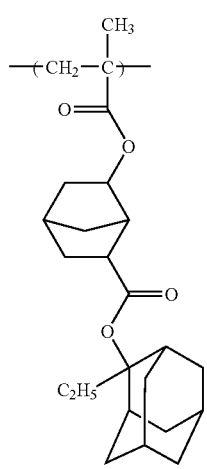
(a1-3-14)
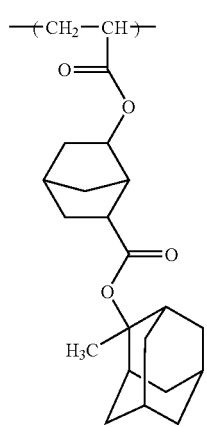
(a1-3-15)
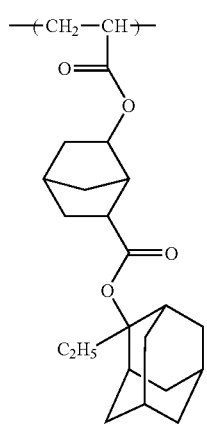
(a1-3-16)
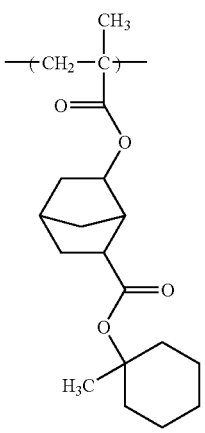
(a1-3-17)
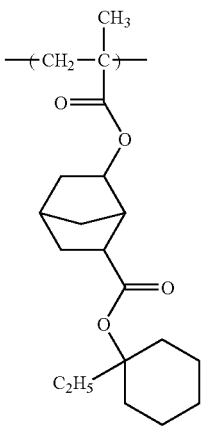
(a1-3-18)
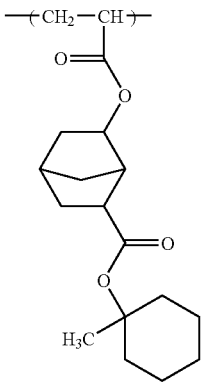
(a1-3-19)
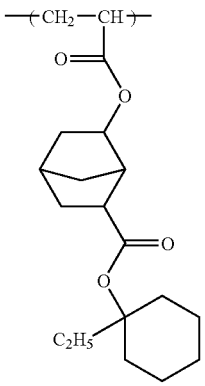
(a1-3-20)

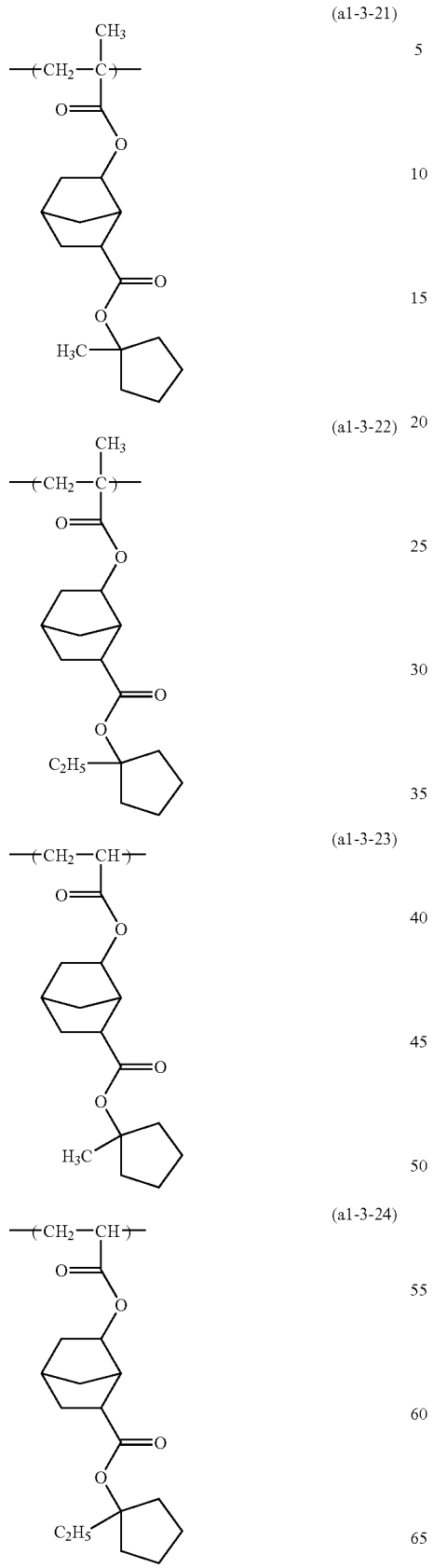
(a1-3-21)
(a1-3-22)
(a1-3-23)
(a1-3-24)
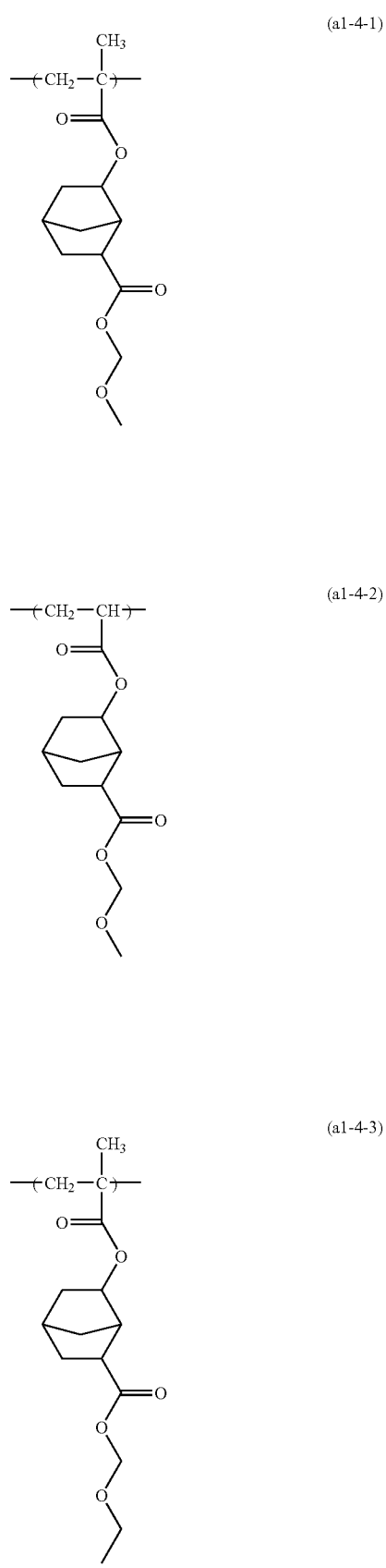
(a1-4-1)
(a1-4-2)
(a1-4-3)

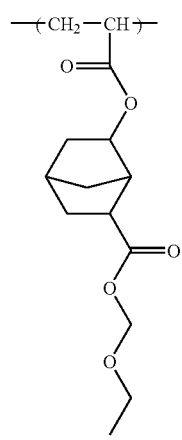
(a1-4-4)
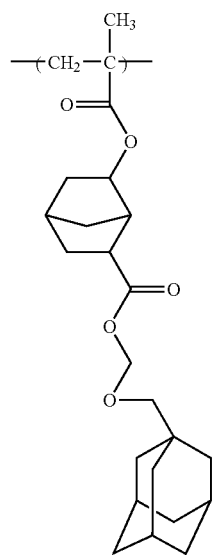
(a1-4-7)
(a1-4-5)
(a1-4-8)
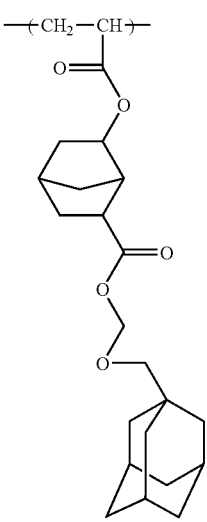
(a1-4-6)
(a1-4-9)
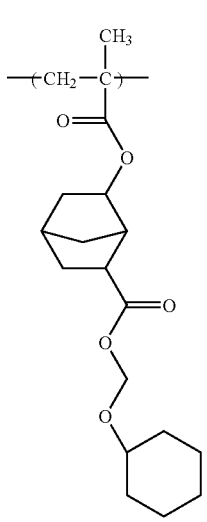

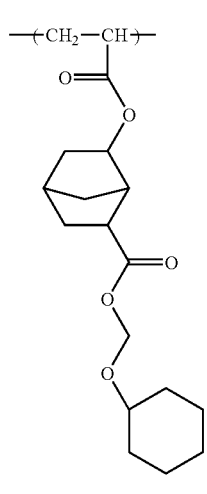
(a1-4-10)
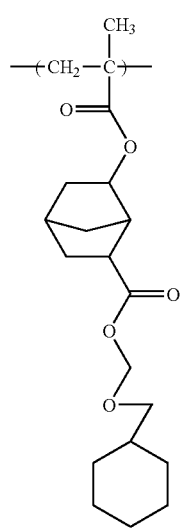
(a1-4-11)
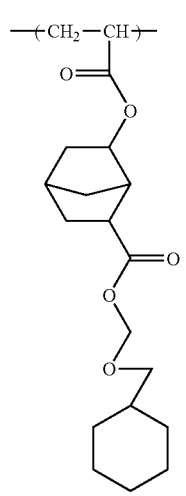
(a1-4-12)
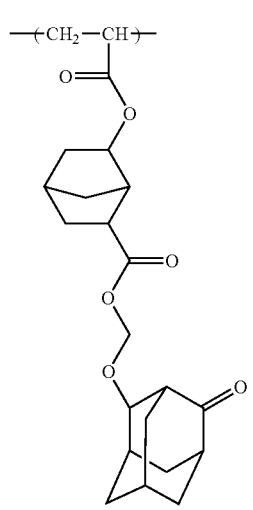
(a1-4-13)
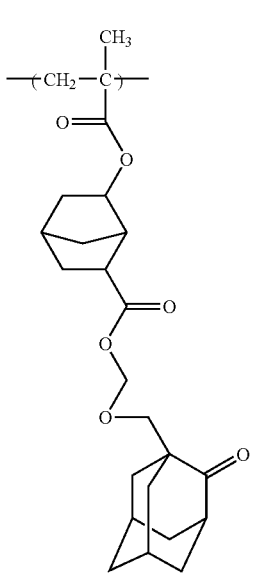
(a1-4-14)
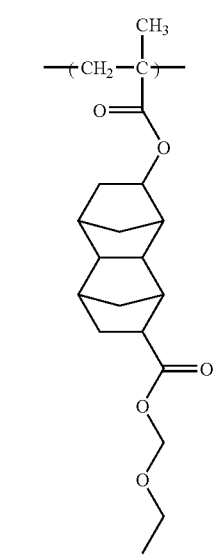
(a1-4-15)

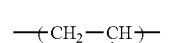
(a1-4-16)
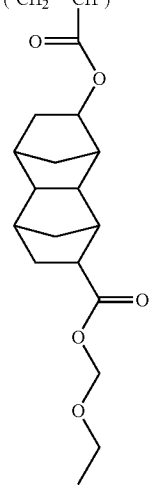
(a1-4-17)
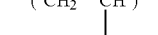
(a1-4-18)
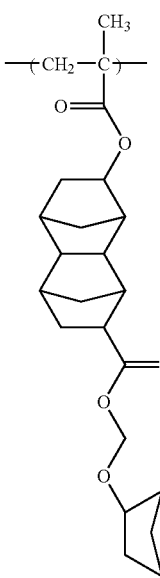
(a1-4-19)
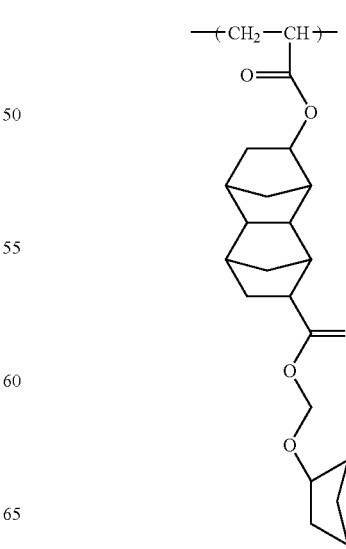
(a1-4-20)

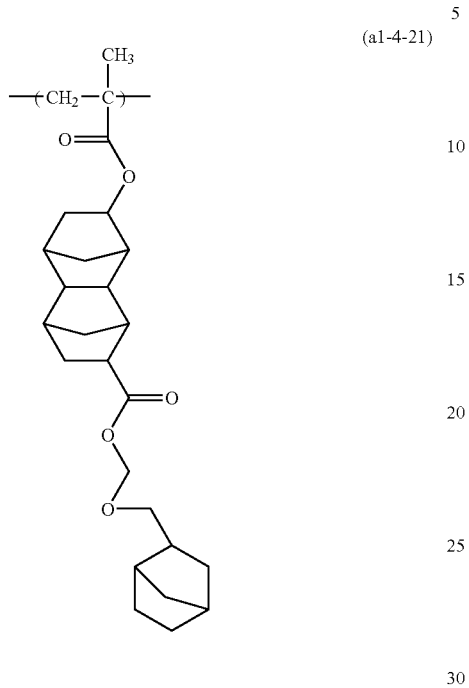
(a1-4-21)
(a1-4-22)
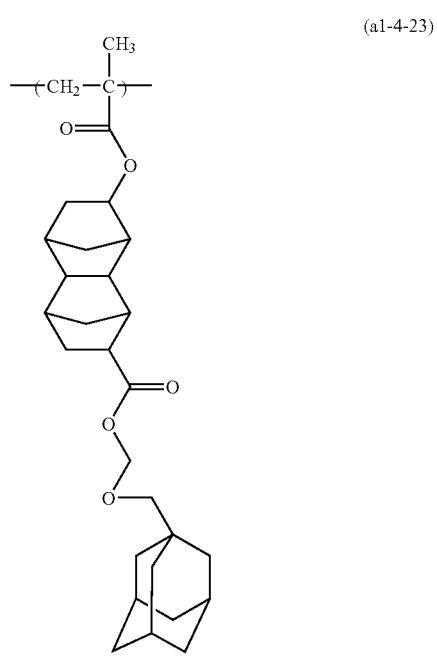
(a1-4-23)
(a1-4-24)

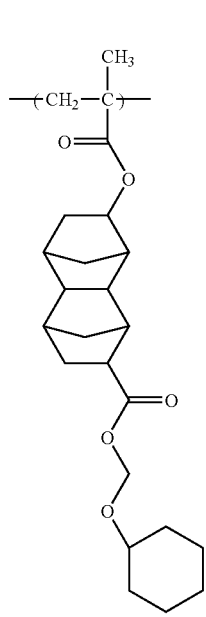 (a1-4-25)
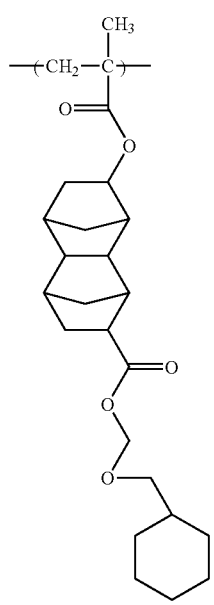 (a1-4-27)
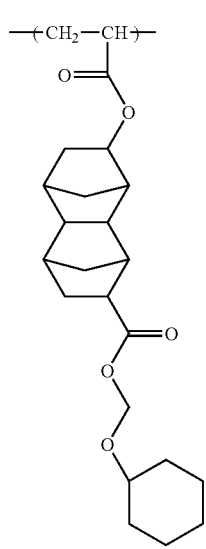 (a1-4-26)
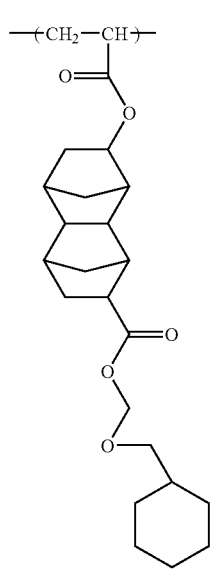 (a1-4-28)

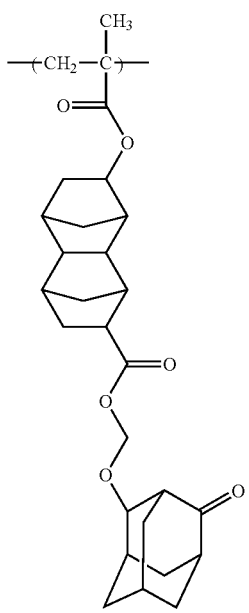

(a1-4-29)

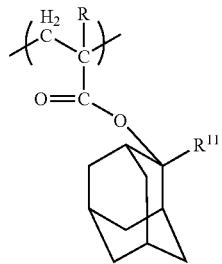

(a1-1-01)

[In the above formula, R represents the same as the aforementioned, and $R^{11}$ represents a lower alkyl group.]

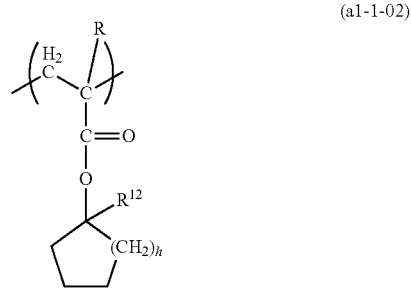

(a1-1-02)

[In the above formula, R represents the same as the aforementioned, $R^{12}$ represents a lower alkyl group, and h represents an integer of 1 to 3.]

In the general formula (a1-1-01), R represents the same as the aforementioned. The lower alkyl group of $R^{11}$ is the same as the lower alkyl group defined for the group R, and is preferably a methyl group or an ethyl group.

In the general formula (a1-1-02), R represents the same as the aforementioned. The lower alkyl group of $R^{12}$ is the same as the lower alkyl group defined for the group R, and is preferably a methyl group or an ethyl group, and most preferably an ethyl group. h preferably represents 1 or 2, and most preferably 2.

In the resin (A2), the structural unit (a'1) may be used alone, or in a combination of two or more kinds thereof.

The proportion of the structural unit (a'1) within the resin (A2), relative to the combined total of all the structural units that constitute the resin (A2), is preferably within a range from 10 to 80 mol %, more preferably from 20 to 70 mol %, and even more preferably from 30 to 60 mol %. Ensuring that this proportion is at least as large as the lower limit of the above range enables a pattern to be easily obtained when the component is used in a resist composition, whereas ensuring that the proportion is no greater than the upper limit enables a more good balance to be achieved with the other structural units.

—Structural Unit (a'2)

The resin (A2) preferably contains, in addition to the structural unit (a'1), a structural unit (a'2) derived from an acrylate ester containing no fluorine atom and a lactone-containing cyclic group.

In this description, the term "lactone-containing cyclic group" refers to a cyclic group that contains a ring containing a —O—C(O)— structure (namely, a lactone ring). This lactone ring is counted as the first ring, and groups that contain only the lactone ring are referred to as monocyclic groups,

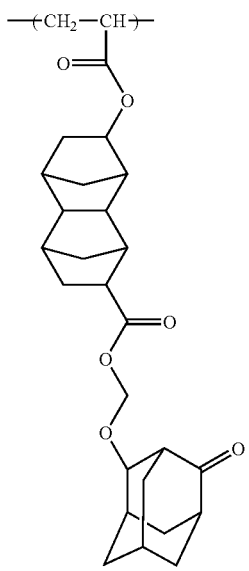

(a1-4-30)

Among these, the structural units represented by the general formula (a1-1) are preferred, and it is more preferable to use one or more units selected from the structural units represented by the formulas (a1-1-1) to (a1-1-6) and the formulas (a1-1-35) to (a1-1-41).

Moreover, as the structural unit (a'1), the structural units represented by the general formula (a1-1-01) shown below, which includes the structural units represented by the formulas (a1-1-1) to (a1-1-4), and the structural units represented by the general formula (a1-1-02) shown below, which includes the structural units represented by the formulas (a1-1-35) to (a1-1-41) are particularly preferred.

whereas groups that also contain other ring structures are described as polycyclic groups regardless of the structure of the other rings.

When the resin (A2) is used in the formation of a resist film, the lactone-containing cyclic group of the structural unit (a'2) is effective in improving the adhesion between the resist film and the substrate, and enhancing the affinity of the resist film relative to the water-containing developing solution.

As the structural unit (a'2), any group can be used without any particular restrictions.

Specifically, examples of the lactone-containing monocyclic group include the groups in which one or more hydrogen atoms have been removed from γ-butyrolactone. Also, examples of the lactone-containing polycyclic group include the groups in which one or more hydrogen atoms have been removed from a lactone ring-containing bicycloalkane, tricycloalkane, or tetracycloalkane.

More specific examples of the structural unit (a'2) include the structural units represented by the general formula (a2-1) to (a2-5) shown below.

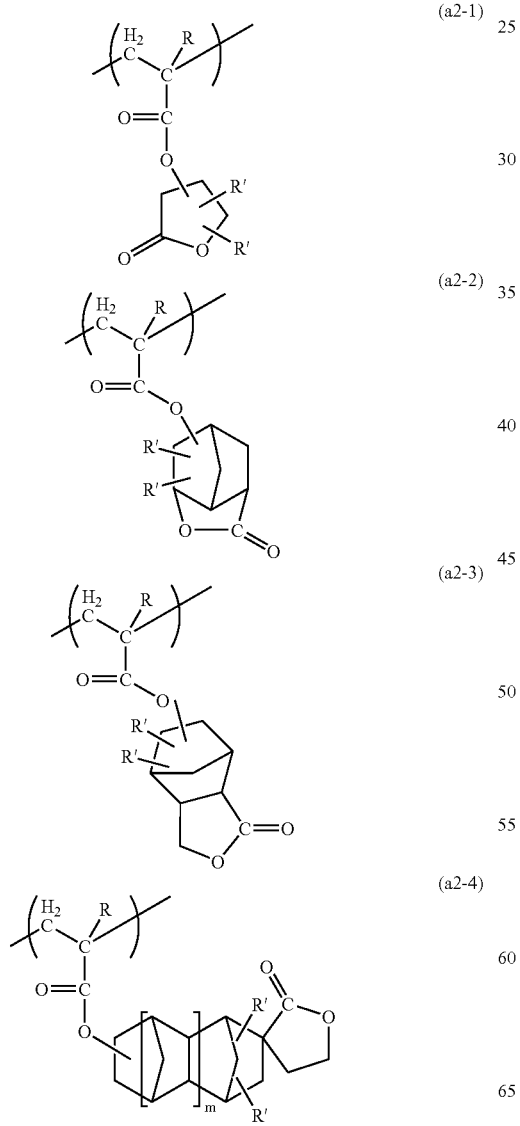

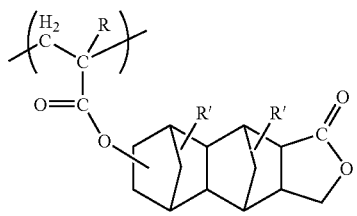

[In the above formula, R represents the same as the aforementioned, R' represents a hydrogen atom, a lower alkyl group, or an alkoxy group having 1 to 5 carbon atoms, and m represents an integer of 0 or 1.]

R in the general formulas (a2-1) to (a2-5) is the same as R in the aforementioned structural unit (a'1).

The lower alkyl groups represented by R' are the same as the lower alkyl groups defined for the group R in the aforementioned structural unit (a'1).

In the general formulas (a2-1) to (a2-5), for reasons including industrial availability, R' preferably represents a hydrogen atom.

Specific examples of the structural units represented by the general formulas (a2-1) to (a2-5) are shown below.

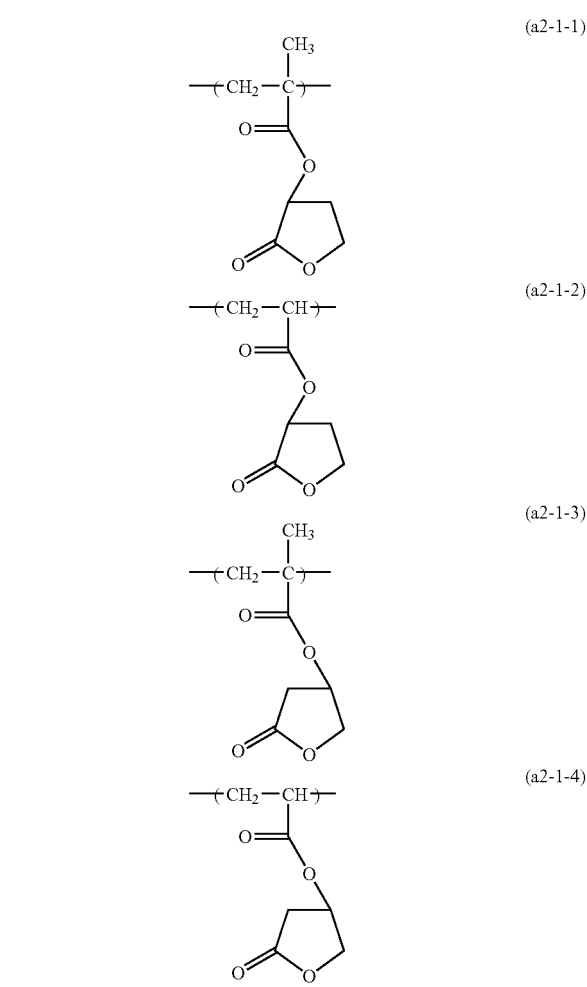

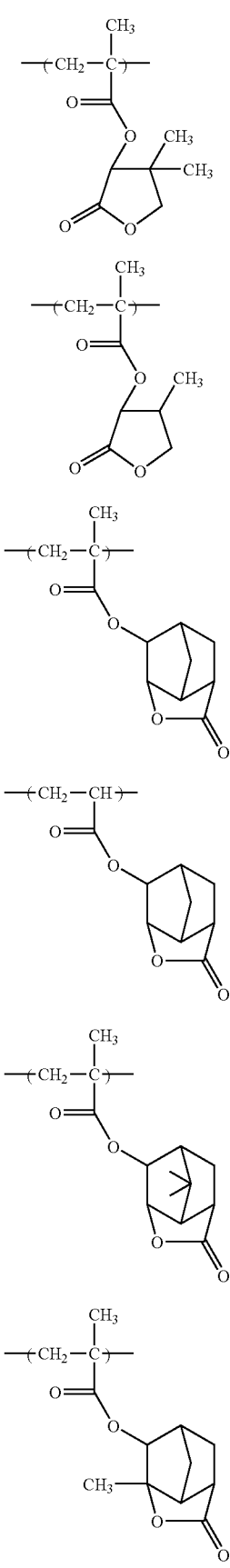
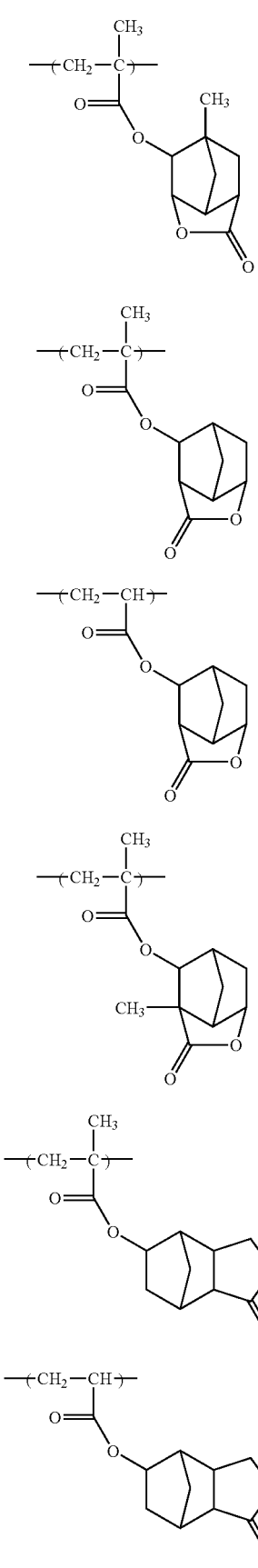

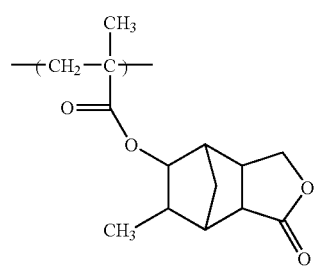
(a2-3-3)
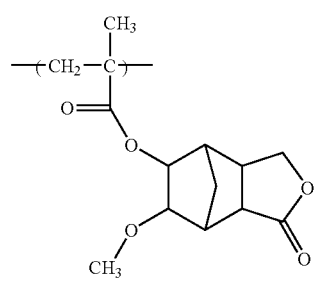
(a2-3-4)
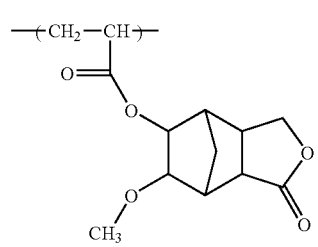
(a2-3-5)
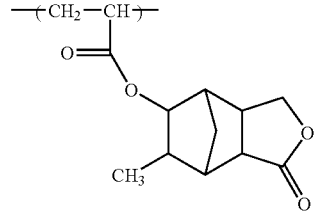
(a2-3-6)
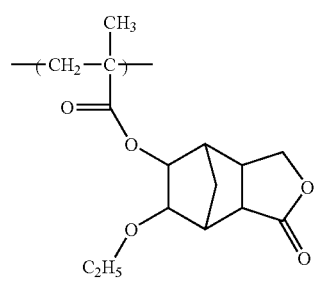
(a2-3-7)
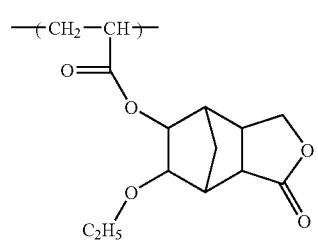
(a2-3-8)
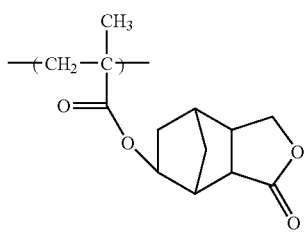
(a2-3-9)
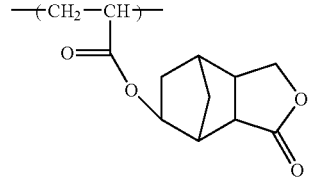
(a2-3-10)
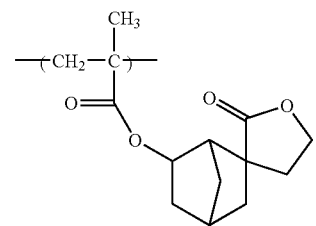
(a2-4-1)
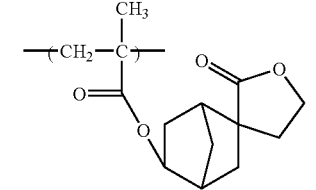
(a2-4-2)
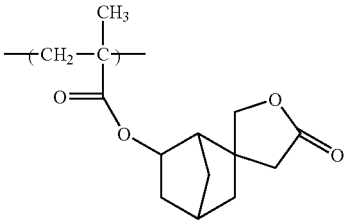
(a2-4-3)
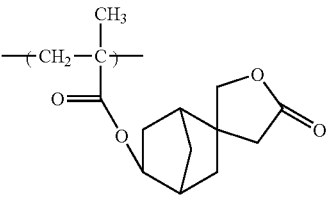
(a2-4-4)
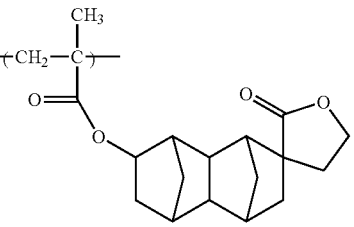
(a2-4-5)

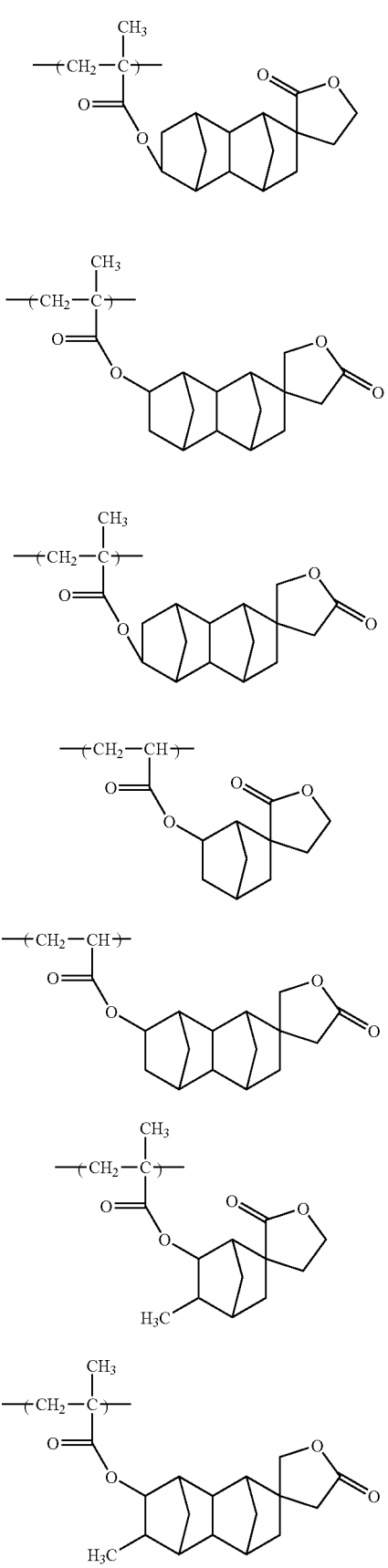
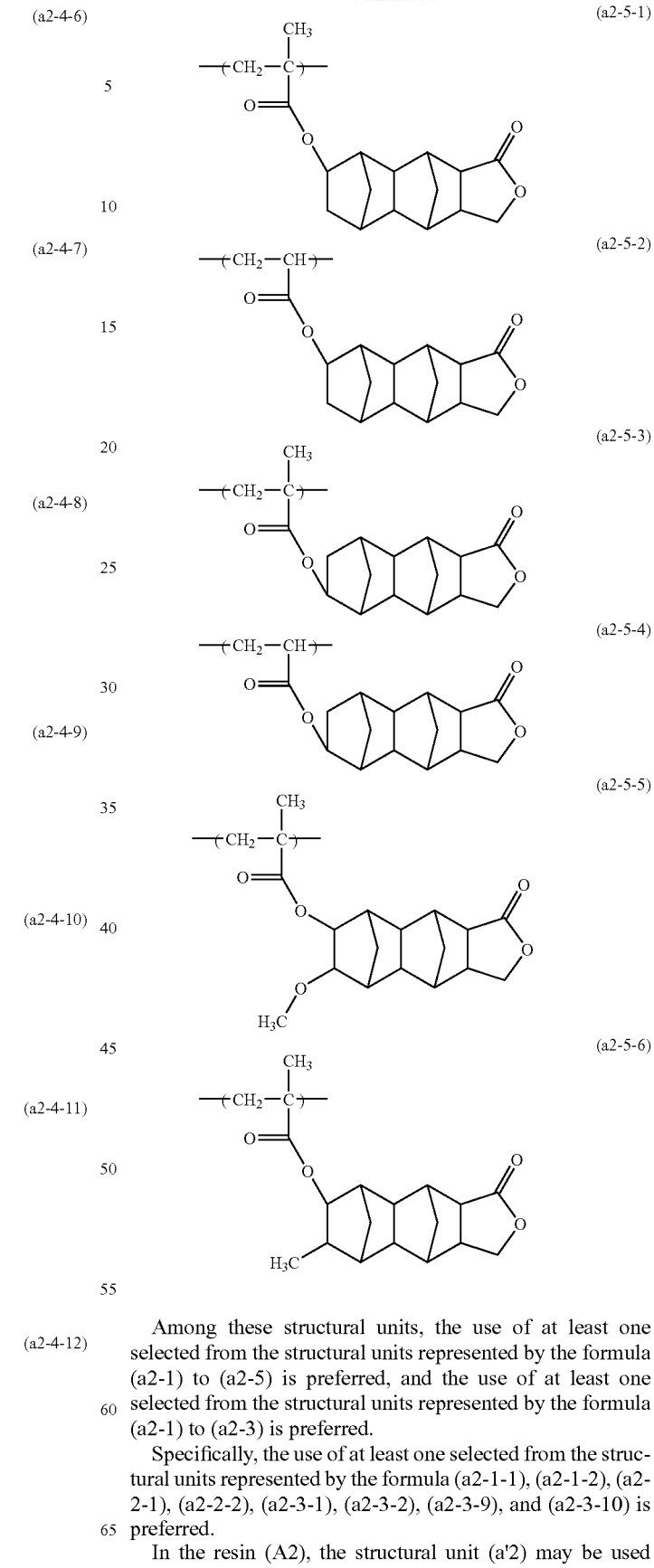

Among these structural units, the use of at least one selected from the structural units represented by the formula (a2-1) to (a2-5) is preferred, and the use of at least one selected from the structural units represented by the formula (a2-1) to (a2-3) is preferred.

Specifically, the use of at least one selected from the structural units represented by the formula (a2-1-1), (a2-1-2), (a2-2-1), (a2-2-2), (a2-3-1), (a2-3-2), (a2-3-9), and (a2-3-10) is preferred.

In the resin (A2), the structural unit (a'2) may be used alone, or in a combination of two or more kinds thereof.

The proportion of the structural unit (a'2) within the resin (A2), relative to the combined total of all the structural units that constitute the resin (A2), is preferably within a range from 5 to 70 mol %, more preferably from 10 to 60 mol %, and even more preferably from 20 to 50 mol %. Ensuring that this proportion is at least as large as the lower limit of the above range enables the effects due to the inclusion of the structural unit (a'2) to be obtained satisfactorily, whereas ensuring that the proportion is no greater than the upper limit enables a more favorable balance to be achieved with the other structural units.

—Structural Unit (a'3)

The resin (A2) preferably includes, in addition to the structural unit (a'1) or to the combination of the structural units (a'1) and (a'2), a structural unit (a'3) derived from an acrylate ester that contains no fluorine atom and a polar group-containing aliphatic hydrocarbon group. The inclusion of the structural unit (a'3) enhances the hydrophilicity of the component (A), to thereby enhance the affinity with the developing solution. Then, the alkali solubility within the exposed portions of the resist is improved to thereby contribute to an improvement in the resolution.

Preferable examples of the polar group include a hydroxyl group, a cyano group, and a carboxyl group, and a hydroxyl group is particularly preferred.

Examples of the aliphatic hydrocarbon group include straight-chain or branched hydrocarbon groups (preferably alkylene groups) having 1 to 10 carbon atoms, and polycyclic aliphatic hydrocarbon groups (polycyclic groups). As these polycyclic groups, it is possible to use any groups selected appropriately from the multitude of groups that have been proposed for the resins of resist compositions designed for use with ArF excimer lasers. The polycyclic groups preferably have 7 to 30 carbon atoms.

Among these, structural units derived from an acrylate ester that includes an aliphatic polycyclic group containing a hydroxyl group, a cyano group, or a carboxyl group are particularly preferred. Examples of suitable polycyclic groups include groups in which one or more hydrogen atoms have been removed from a bicycloalkane, a tricycloalkane or a tetracycloalkane, etc. Specific examples include groups in which one or more hydrogen atoms have been removed from a polycycloalkane such as adamantane, norbornane, isobornane, tricyclodecane or tetracyclododecane. Among these polycyclic groups, groups in which two or more hydrogen atoms have been removed from adamantane, groups in which two or more hydrogen atoms have been removed from norbornane, and groups in which two or more hydrogen atoms have been removed from tetracyclododecane are preferred industrially.

When the hydrocarbon group within the polar group-containing aliphatic hydrocarbon group is a straight-chain or branched hydrocarbon group having 1 to 10 carbon atoms, the structural unit (a'3) is preferably a structural unit derived from the hydroxyethyl ester of the acrylic acid, whereas when the hydrocarbon group is a polycyclic group, examples of preferred structural units include the structural units represented by a formula (a3-1) and the structural units represented by a formula (a3-2), all of which are shown below.

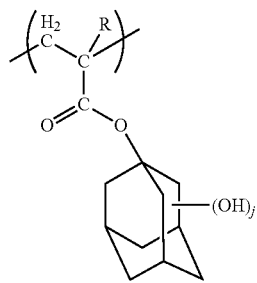
(a3-1)

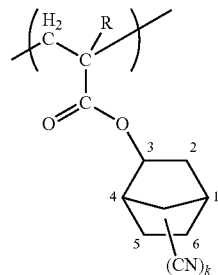
(a3-2)

[In the above formula, R represents the same as the aforementioned, j represents an integer of 1 to 3, and k represents an integer of 1 to 3]

In the formula (a3-1), j preferably represents 1 or 2, and is most preferably 1. In those cases where j represents 2, the hydroxyl groups are preferably bonded to 3-position and 5-position of the adamantyl group. In those cases where j represents 1, the hydroxyl group is preferably bonded to 3-position of the adamantyl group.

In the formula (a3-2), k preferably represents 1. The cyano group is preferably bonded to 5-position or 6-position of the norbornyl group.

The structural unit (a'3) may be used alone, or in a combination of two or more kinds thereof.

The proportion of the structural unit (a'3) within the resin (A2), relative to the combined total of all the structural units that constitute the component (A2), is preferably within a range from 5 to 50 mol %, even more preferably from 5 to 40 mol %, and even more preferably from 5 to 25 mol %.

—Structural Unit (a'4)

The resin (A2) may include other structural units (a'4) in addition to the aforementioned structural units (a'1) to (a'3) as long as the inclusion of these other structural units does not impair the effects of the present invention.

As the structural unit (a'4), any other structural unit that contains no fluorine atom and cannot be classified as one of the aforementioned structural units (a'1) to (a'3) can be used without any particular limitations, and any of the multitude of conventional structural units used within resist resins for ArF excimer lasers or KrF excimer lasers (preferably for ArF excimer lasers) can be used.

Preferable examples of the structural unit (a'4) include the structural units derived from an acrylate ester containing a non-acid-dissociable aliphatic polycyclic group. Examples of the polycyclic group include the same groups as those described above in relation to the structural unit (a1), and any of the multitude of conventional polycyclic groups used within the resin component of resist compositions for ArF excimer lasers or KrF excimer lasers (preferably for ArF excimer lasers) can be used.

In particular, at least one group selected from a tricyclodecanyl group, an adamantyl group, a tetracyclododecanyl group, an isobornyl group, and a norbornyl group is preferred in terms of factors such as industrial availability. The hydrogen atoms of these polycyclic groups may be substituted with straight-chain or branched alkyl groups having 1 to 5 carbon atoms.

Specific examples of the structural unit (a'4) include units with structures represented by general formulas (a4-1) to (a4-5) shown below.

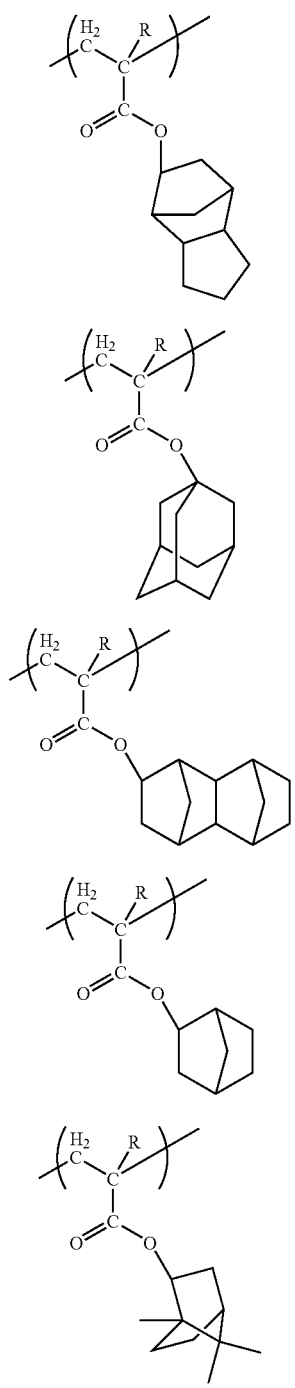

[In the above formula, R represents the same as the aforementioned.]

The structural unit (a'4) may be used alone, or in a combination of two or more kinds thereof.

When the structural unit (a'4) is included in the resin (A2), the proportion of the structural unit (a'4), relative to the combined total of all the structural units that constitute the resin (A2), is preferably within a range from 1 to 30 mol %, and more preferably from 10 to 20 mol %.

In the present invention, the resin (A2) is preferably a copolymer containing at least the structural units (a'1), (a'2) and (a'3). As such a copolymer, a copolymer formed solely from the aforementioned structural units (a'1), (a'2) and (a'3), and a copolymer formed solely from the aforementioned structural units (a'1), (a'2), (a'3) and (a'4) are exemplified.

In the present invention, particularly preferable examples of the resin (A2) include the resins containing three kinds of the structural units, which are represented by the general formulas (A2-11), (A2-12) and (A2-13) described below.

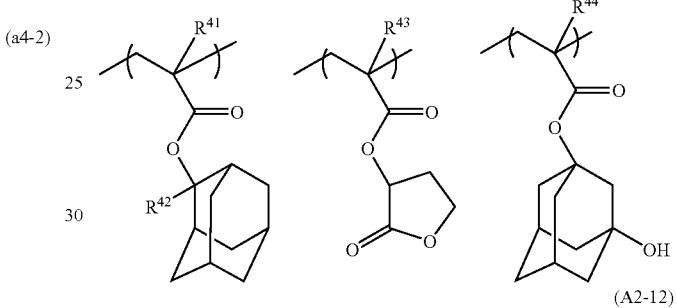

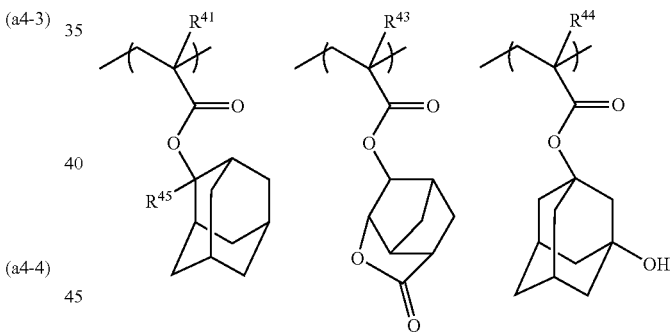

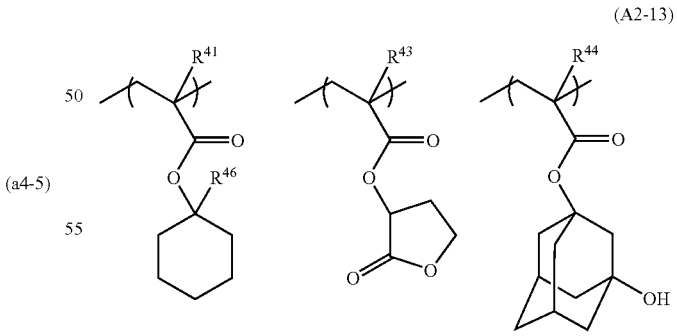

[In the above formula, $R^{41}$, $R^{43}$, and $R^{44}$ each independently represents a hydrogen atom, a halogen atom other than a fluorine atom, a lower alkyl group, or a lower alkyl group in which a hydrogen atom is substituted with a halogen atom other than a fluorine atom (a halogenated lower alkyl group), $R^{42}$ represents a lower alkyl group, $R^{45}$ represent a lower alkyl group, and $R^{46}$ represents a lower alkyl group.]

In the formula (A2-11), lower alkyl groups represented by $R^{41}$, $R^{43}$, and $R^{44}$ are the same as the lower alkyl groups defined for the aforementioned group R. $R^{41}$, $R^{43}$, and $R^{44}$ preferably represent a hydrogen atom or a lower alkyl group, and more preferably a hydrogen atom or a methyl group. Lower alkyl groups represented by $R^{42}$ are the same as the lower alkyl groups defined for the aforementioned group R. $R^{42}$ preferably represents a methyl group or an ethyl group, and most preferably a methyl group.

In the formula (A2-12), lower alkyl groups represented by $R^{41}$, $R^{43}$, and $R^{44}$ are the same as the aforementioned. Lower alkyl groups represented by $R^{45}$ are the same as the lower alkyl groups defined for the aforementioned group R. $R^{45}$ preferably represents a methyl group or an ethyl group, and most preferably a methyl group.

In the formula (A2-13), lower alkyl groups represented by $R^{41}$, $R^{43}$, and $R^{44}$ are the same as the aforementioned. Lower alkyl groups represented by $R^{46}$ are the same as the lower alkyl groups defined for the aforementioned group R. $R^{46}$ preferably represents a methyl group or an ethyl group, and most preferably an ethyl group.

The resin (A2) can be obtained by polymerizing monomers that derive each of the structural units in a normal method such as a known radical polymerization using a radical polymerization initiator such as azobisisobutyronitrile (AIBN).

Although there are no particular limitations on the weight average molecular weight (Mw) (the polystyrene equivalent value determined by gel permeation chromatography) of the resin (A2), the weight average molecular weight is preferably within a range from 2,000 to 50,000, more preferably from 3,000 to 30,000, and is most preferably from 5,000 to 20,000. Provided the weight average molecular weight is lower than the upper limit of this range, the level of solubility within resist solvents is adequate for use within a resist, whereas values larger than the lower limit of the above range ensure that favorable levels of dry etching resistance and resist pattern cross-sectional shape can be obtained.

Furthermore, the degree of dispersion (Mw/Mn) is preferably within a range from 1.0 to 5.0, even more preferably from 1.0 to 3.0, and is most preferably from 1.2 to 2.5.

In the component (A), the resin (A2) may be used alone, or in a combination of two or more kinds thereof.

The content of the resin (A2) in the component (A) is preferably within a range from 50 to 99.9 mass %, more preferably from 80 to 99.9 mass %, and still more preferably from 90 to 99.9 mass %. When the content of the resin (A2) is 50 mass % or more, lithography characteristics are improved. Also, at 99.9 mass % or less, the balance of the resins (A1) and (A2) is favorable so as to improve immersion medium resistance.

<Component (B)>

As the component (B), any acid generators that have been proposed for use within conventional chemically amplified positive resist compositions can be used without particular limitations. Examples of these acid generators are numerous, and include onium salt-based acid generators such as iodonium salts and sulfonium salts, oxime sulfonate-based acid generators, diazomethane-based acid generators such as bisalkyl or bisaryl sulfonyl diazomethanes and poly(bis-sulfonyl)diazomethanes, nitrobenzyl sulfonate-based acid generators, iminosulfonate-based acid generators, and disulfone-based acid generators.

Examples of onium salt-based acid generators include compounds represented by a general formula (b-0) shown below.

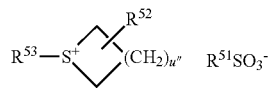

(b-0)

[wherein $R^{51}$ represents a straight-chain, branched-chain or cyclic alkyl group, or a straight-chain, branched-chain or cyclic fluorinated alkyl group; $R^{52}$ represents a hydrogen atom, a hydroxyl group, a halogen atom, a straight-chain or branched-chain alkyl group, a straight-chain or branched halogenated alkyl group, or a straight-chain or branched-chain alkoxy group; $R^{53}$ represents an aryl group that may have a substituent; and u" represents an integer of 1 to 3.]

In the general formula (b-0), $R^{51}$ represents a straight-chain, branched-chain or cyclic alkyl group, or a straight-chain, branched-chain or cyclic fluorinated alkyl group.

The straight-chain or branched-chain alkyl group preferably has 1 to 10 carbon atoms, more preferably 1 to 8 carbon atoms, and most preferably 1 to 4 carbon atoms.

The cyclic alkyl group preferably has 4 to 12 carbon atoms, more preferably 5 to 10 carbon atoms, and most preferably 6 to 10 carbon atoms.

The straight-chain, branched-chain or cyclic fluorinated alkyl group preferably has the same number of carbon atoms as that within the aforementioned straight-chain, branched-chain or cyclic alkyl group. The fluorination rate of the fluorinated alkyl group (the proportion of the fluorine atoms in the alkyl group) is preferably 10 to 100%, more preferably 50 to 100%, and particularly those in which all of the hydrogen atoms have been substituted with fluorine atoms, thus giving strong acidity, are preferred.

$R^{51}$ is most preferably a straight-chain alkyl group or a fluorinated alkyl group.

$R^{52}$ is a hydrogen atom, a hydroxyl group, a halogen atom, a straight-chain or branched-chain alkyl group, a straight-chain or branched-chain halogenated alkyl group, or a straight-chain or branched-chain alkoxy group.

Examples of the halogen atom as $R^{52}$ include a fluorine atom, a bromine atom, a chlorine atom, and an iodine atom, and among these, a fluorine atom is preferred.

The alkyl group as $R^{52}$ is straight-chain or branched-chain, and preferably has 1 to 5 carbon atoms, more preferably 1 to 4 carbon atoms, and still more preferably 1 to 3 carbon atoms.

The halogenated alkyl group as $R^{52}$ is a group in which at least one or all of the hydrogen atoms of the alkyl group have been substituted with fluorine atoms. Herein, examples of the alkyl group include the same "alkyl groups" mentioned above as $R^{52}$. Examples of the substituting halogen atoms include the same as those mentioned above in the description of the "halogen atom". For the halogenated alkyl group, it is preferable that 50 to 100% of the total hydrogen atoms be substituted with halogen atoms, and it is more preferable that all of the total hydrogen atoms be substituted with halogen atoms.

The alkoxy group as $R^{52}$ is straight-chain or branched-chain, and preferably it has 1 to 5 carbon atoms, more preferably 1 to 4 carbon atoms, and still more preferably 1 to 3 carbon atoms.

Among these, a hydrogen atom is preferred as $R^{52}$.

$R^{53}$ is an aryl group that may have a substituent, and examples of the structure of its basic ring in which the substituent is excluded include a naphthyl group, a phenyl group, and an anthracenyl group, and among these, a phenyl group is preferred, from the viewpoints of the effect of the present invention, or absorption of exposure light of an ArF excimer laser, etc.

Examples of the substituent include a hydroxyl group, and a lower alkyl group (which is straight-chained or branched-chain, and preferably has 1 or more and 5 or less carbon atoms, and among these, a methyl group is particularly preferred).

The aryl group of $R^{53}$ fiber preferably has no substituent.

u" is an integer of 1 to 3, preferably 2 or 3, and particularly preferably 3.

Preferable examples of the acid generator represented by the general formula (b-0) are as follows.

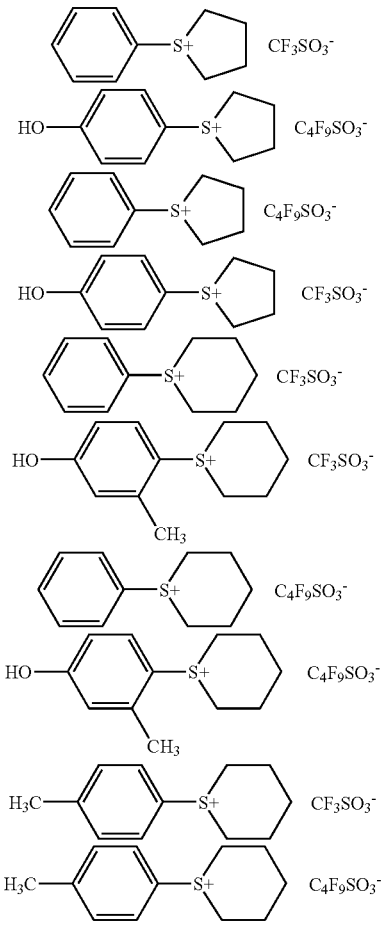

Further, examples of other onium salt-based acid generators as the acid generator represented by the general formula (b-0) include the compound represented by the following general formula (b-1) or (b-2).

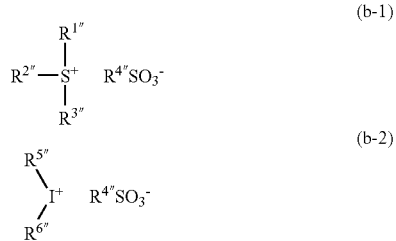

[In the above formula, $R^{1"}$ to $R^{3"}$, and $R^{5"}$ to $R^{6"}$ each independently represents an aryl group or an alkyl group; $R^{4"}$ represents a straight-chain, branched or cyclic alkyl group, or a fluorinated alkyl group; at least one of $R^{1"}$ to $R^{3"}$ represents an aryl group; and at least one of $R^{5"}$ to $R^{6"}$ represents an aryl group.]

In the formula (b-1), $R^{1"}$ to $R^{3"}$ each independently represents an aryl group or an alkyl group. At least one of $R^{1"}$ to $R^{3"}$ represents an aryl group. It is preferable that at least two of $R^{1"}$ to $R^{3"}$ be aryl groups, and it is most preferable that all of $R^{1"}$ to $R^{3"}$ be aryl groups.

The aryl groups of $R^{1"}$ to $R^{3"}$ are not particularly limited, and examples thereof include an aryl group having 6 to 20 carbon atoms. In the aryl group, at least one or all of the hydrogen atoms may or may not be substituted with an alkyl group, an alkoxy group, a halogen atom, etc. As the aryl group, an aryl group having 6 to 110 carbon atoms is preferred, in view of inexpensive synthesis. Specific examples thereof include a phenyl group, and a naphthyl group.

As the alkyl group that may substitute the hydrogen atom of the aryl group, an alkyl group having 1 to 5 carbon atoms is preferred, and a methyl group, an ethyl group, a propyl group, an n-butyl group, or a tert-butyl group is most preferred.

As the alkoxy group that may substitute the hydrogen atom of the aryl group, an alkoxy group having 1 to 5 carbon atoms is preferred, and a methoxy group or an ethoxy group is most preferred.

As the halogen atom that may substitute the hydrogen atom of the aryl group, a fluorine atom is preferred.

The alkyl group of $R^{1"}$ to $R^{3"}$ is not particularly limited, and examples thereof include a straight-chain, branched or cyclic alkyl group having 1 to 110 carbon atoms. It is preferable that the alkyl group have 1 to 5 carbon atoms, in view of excellent resolution. Specific examples thereof include a methyl group, an ethyl group, an n-propyl group, an isopropyl group, an n-butyl group, an isobutyl group, an n-pentyl group, a cyclopentyl group, a hexyl group, a cyclohexyl group, a nonyl group, and a decanyl group, and among these, a methyl group is preferred, in view of excellent resolution and inexpensive synthesis.

Among these, it is most preferred that each of $R^{1"}$ to $R^{3"}$ be a phenyl group or a naphthyl group.

$R^{4"}$ represents a straight-chain, branched or cyclic alkyl group or fluorinated alkyl group.

The straight-chain or branched alkyl group preferably has 1 to 10 carbon atoms, more preferably 1 to 8 carbon atoms, and most preferably 1 to 4 carbon atoms.

The cyclic alkyl group may be a cyclic group represented by the aforementioned $R^{1"}$, and preferably has 4 to 15 carbon atoms, more preferably 4 to 10 carbon atoms carbon atoms, and most preferably 6 to 10 carbon atoms.

The fluorinated alkyl group preferably has 1 to 10 carbon atoms, more preferably 1 to 8 carbon atoms, and most preferably 1 to 4 carbon atoms. The fluorination rate of the fluorinated alkyl group (the proportion of the fluorine atoms in the alkyl group) is preferably 10% to 100%, still more preferably 50% to 100%, and particularly those in which all of the hydrogen atoms have been substituted with fluorine atoms, thus giving strong acidity, are preferred.

As $R^{4"}$, a straight-chain or cyclic alkyl group, or a fluorinated alkyl group is most preferred.

In the formula (b-2), $R^{5"}$ to $R^{6"}$ each independently represents an aryl group or an alkyl group. At least one of $R^{5"}$ to $R^{6"}$ represents an aryl group. Preferably, all of $R^{5"}$ to $R^{6"}$ are aryl groups.

Examples of the aryl group of $R^{5"}$ to $R^{6"}$ include the same as those mentioned for the aryl group of $R^{1"}$ to $R^{3"}$.

Examples of the alkyl group of R⁵" to R⁶" include the same as those mentioned for the alkyl group of R¹" to R³".

Among these, it is most preferable that all of R⁵" to R⁶" be phenyl groups.

Examples of R⁴" in the formula (b-2) include the same as those mentioned for R⁴" in the formula (b-1).

Specific examples of the onium salt-based acid generator represented by the formula (b-1) or (b-2) include diphenyliodonium trifluoromethanesulfonate or nonafluorobutanesulfonate; bis(4-tert-butylphenyl)iodonium trifluoromethanesulfonate or nonafluorobutanesulfonate; triphenylsulfonium trifluoromethanesulfonate, heptafluoropropanesulfonate or nonafluorobutanesulfonate; tri(4-methylphenyl)sulfonium trifluoromethanesulfonate, heptafluoropropanesulfonate or nonafluorobutanesulfonate; dimethyl(4-hydroxynaphthyl)sulfonium trifluoromethanesulfonate, heptafluoropropanesulfonate or nonafluorobutanesulfonate; monophenyldimethylsulfonium trifluoromethanesulfonate, heptafluoropropanesulfonate or nonafluorobutanesulfonate; diphenylmonomethylsulfonium trifluoromethanesulfonate, heptafluoropropanesulfonate or nonafluorobutanesulfonate; (4-methylphenyl)diphenylsulfonium trifluoromethanesulfonate, heptafluoropropanesulfonate or nonafluorobutanesulfonate; (4-methoxyphenyl)diphenylsulfonium trifluoromethanesulfonate, heptafluoropropanesulfonate or nonafluorobutanesulfonate; tri(4-tert-butyl)phenylsulfonium trifluoromethanesulfonate, heptafluoropropanesulfonate or nonafluorobutanesulfonate; diphenyl(1-(4-methoxy)naphthyl)sulfonium trifluoromethanesulfonate, heptafluoropropanesulfonate or nonafluorobutanesulfonate; di(1-naphthyl)phenylsulfonium trifluoromethanesulfonate, heptafluoropropanesulfonate or nonafluorobutanesulfonate; and the like. Also, the onium salts in which the anionic part has been substituted with methanesulfonate, n-propanesulfonate, n-butanesulfonate, or n-octanesulfonate can be used.

Further, in the general formula (b-1) or (b-2), the onium salt-based acid generator in which in the anionic part has been substituted with the anionic part represented by the following general formula (b-3) or (b-4) can also be used (the cationic part is the same as for (b-1) or (b-2)).

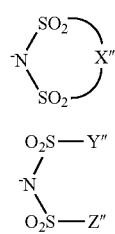

[In the above formula, X" represents an alkylene group having 2 to 6 carbon atoms in which at least one hydrogen atom has been substituted with a fluorine atom; and Y" and Z" each independently represents an alkyl group having 1 to 10 carbon atoms in which at least one hydrogen atom has been substituted with a fluorine atom.]

X" is a straight-chain or branched alkylene group in which at least one hydrogen atom has been substituted with a fluorine atom, and the alkylene group has 2 to 6 carbon atoms, preferably 3 to 5 carbon atoms, and most preferably 3 carbon atoms.

Y" and Z" are each independently a straight-chain or branched alkyl group in which at least one hydrogen atom has been substituted with a fluorine atom, and the alkyl group has 1 to 10 carbon atoms, preferably 1 to 7 carbon atoms, and most preferably 1 to 3 carbon atoms.

It is preferable that the alkylene group of X", or the alkyl group of Y" and Z" have a smaller number of carbon atoms within the above-described range, in view of good solubility in a resist solvent.

Further, it is preferable that the alkylene group of X", or the alkyl group of Y" and Z" have a larger number of the hydrogen atoms substituted with fluorine atoms in view of stronger acidity and higher transparency to an electron beam or a high-energy light at 200 nm or less. The proportion of the fluorine atoms in the alkylene group or alkyl group, that is, the fluorination rate is preferably 70% to 100%, still more preferably 90% to 100%, and a perfluoroalkylene group or perfluoroalkyl group in which all of the hydrogen atoms are substituted with fluorine atoms, is particularly preferred.

As used in the present invention, the oxime sulfonate-based acid generator is a compound having at least one group represented by the following general formula (B-1), which is characterized by generation of an acid upon irradiation with radiation. The oxime sulfonate-based acid generator is widely used for a chemically amplified resist composition, and thus can be optionally selected and used.

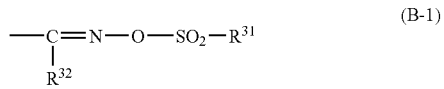

[In the above formula, R³¹ and R³² each independently represents an organic group.]

The organic group of R³¹ and R³² is a carbon atom-containing group, and may contain atoms other than the carbon atom (for example, a hydrogen atom, an oxygen atom, a nitrogen atom, a sulfur atom, and a halogen atom (such as a fluorine atom, and a chlorine atom)).

The organic group of R³¹ is preferably a straight-chained, branched, or cyclic alkyl group or an aryl group. The alkyl group or the aryl group may have a substituent. The substituent is not particularly limited, and examples thereof include a fluorine atom, and a straight-chained, branched, or cyclic alkyl group having 1 to 6 carbon atoms. As used herein, the expression "having a substituent" means that at least one or all of the hydrogen atoms of the alkyl group or the aryl group are substituted with substituents.

The alkyl group preferably has 1 to 20 carbon atoms, more preferably 1 to 10 carbon atoms, still more preferably 1 to 8 carbon atoms, particularly preferably 1 to 6 carbon atoms, and most preferably 1 to 4 carbon atoms. The alkyl group is particularly preferably a partially or completely halogenated alkyl group (sometimes referred to as a halogenated alkyl group, hereinafter). The partially halogenated alkyl group refers to an alkyl group in which at least one of the hydrogen atoms are substituted with halogen atoms, and the completely halogenated alkyl group refers to an alkyl group in which all of the hydrogen atoms are substituted with halogen atoms. Examples of the halogen atom include a fluorine atom, a chlorine atom, a bromine atom, and an iodine atom. It is particularly preferably a fluorine atom. That is, the halogenated alkyl group is preferably a fluorinated alkyl group.

The aryl group preferably has 4 to 20 carbon atoms, more preferably 4 to 10 carbon atoms, and most preferably 6 to 10 carbon atoms. The aryl group is particularly preferably a partially or completely halogenated aryl group. Further, the partially halogenated aryl group refers to an aryl group in which at least one of the hydrogen atoms are substituted with halogen atoms, and the completely halogenated aryl group refers to an aryl group in which all of the hydrogen atoms are substituted with halogen atoms.

$R^{31}$ is particularly preferably an unsubstituted alkyl group having 1 to 4 carbon atoms, or a fluorinated alkyl group having 1 to 4 carbon atoms.

The organic group of $R^{32}$ is preferably a straight-chain, branched, or cyclic alkyl group, an aryl group, or a cyano group. Examples of the alkyl group and the aryl group of $R^{32}$ include those as mentioned for the alkyl group and the aryl group of $R^{31}$.

As $R^{32}$, an unsubstituted alkyl group having 1 to 8 carbon atoms, or a fluorinated alkyl group having 1 to 8 carbon atoms is particularly preferred.

More preferable examples of the oxime sulfonate-based acid generator include a compound represented by the following general formula (B-2) or (B-3).

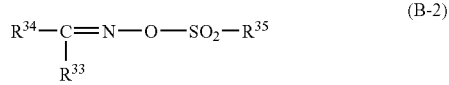

(B-2)

[In the above formula (B-2), $R^{33}$ represents a cyano group, an unsubstituted alkyl group, or a halogenated alkyl group; $R^{34}$ represents an aryl group; and $R^{35}$ represents an unsubstituted alkyl group or halogenated alkyl group.]

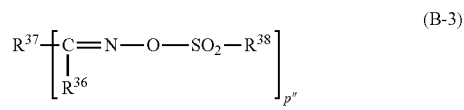

(B-3)

[In the above formula (B-3), $R^{36}$ represents a cyano group, an unsubstituted alkyl group, or a halogenated alkyl group; $R^{37}$ represents a divalent or trivalent aromatic hydrocarbon group; $R^{38}$ represents an unsubstituted alkyl group or halogenated alkyl group; and p" represents 2 or 3.]

In the general formula (B-2), the unsubstituted alkyl group or halogenated alkyl group of $R^{33}$ preferably has 1 to 10 carbon atoms, more preferably 1 to 8 carbon atoms, and most preferably 1 to 6 carbon atoms.

$R^{33}$ is preferably a halogenated alkyl group, and more preferably a fluorinated alkyl group.

The fluorinated alkyl group of $R^{33}$ is preferably one in which 50% or more of the hydrogen atoms of the alkyl group are fluorinated, more preferably one in which 70% or more of the hydrogen atoms of the alkyl group are fluorinated, and most preferably one in which 90% or more of the hydrogen atoms of the alkyl group are fluorinated.

Examples of the aryl group of $R^{34}$ include a group in which one hydrogen atom has been removed from the ring of an aromatic hydrocarbon such as a phenyl group, a biphenyl group, a fluorenyl group, a naphthyl group, an anthracyl group, and a phenanthryl group; and a heteroaryl group in which at least one of the oxygen atoms constituting those rings are substituted with heteroatoms such as an oxygen atom, a sulfur atom, and a nitrogen atom. Among these, a fluorenyl group is preferred.

The aryl group of $R^{34}$ may have a substituent such as an alkyl group having 1 to 10 carbon atoms, a halogenated alkyl group, and an alkoxy group. The alkyl group or the halogenated alkyl group as the substituent preferably has 1 to 8 carbon atoms, and more preferably 1 to 4 carbon atoms. Further, the halogenated alkyl group is preferably a fluorinated alkyl group.

The unsubstituted alkyl group or halogenated alkyl group of $R^{35}$ preferably has 1 to 10 carbon atoms, more preferably 1 to 8 carbon atoms, and most preferably 1 to 6 carbon atoms.

$R^{35}$ is preferably a halogenated alkyl group, and more preferably a fluorinated alkyl group.

The fluorinated alkyl group of $R^{35}$ is preferably one in which 50% or more of the hydrogen atoms of the alkyl group are fluorinated, more preferably one in which 70% or more of the hydrogen atoms of the alkyl group are fluorinated, and most preferably one in which 90% or more of the hydrogen atoms of the alkyl group are fluorinated, thus giving higher acidity of an acid generated. Most preferably, it is one in which 100% of the hydrogen atoms of the alkyl group are completely fluorinated.

In the general formula (B-3), examples of the unsubstituted alkyl group or halogenated alkyl group of $R^{36}$ include the same as the unsubstituted alkyl group or the halogenated alkyl group of $R^{33}$.

Examples of the divalent or trivalent aromatic hydrocarbon group of $R^{37}$ include a group in which one or two hydrogen atoms have been removed from the aryl group of $R^{34}$.

Examples of the unsubstituted alkyl group or halogenated alkyl group of $R^{38}$ include the same as those described above for the unsubstituted alkyl group or halogenated alkyl group of $R^{35}$.

p" preferably represents 2.

Specific examples of the oxime sulfonate-based acid generator include α-(p-toluenesulfonyloxyimino)-benzylcyanide, α-(p-chlorobenzenesulfonyloxyimino)-benzylcyanide, α-(4-nitrobenzenesulfonyloxyimino)-benzylcyanide, α-(4-nitro-2-trifluoromethylbenzenesulfonyloxyimino)-benzylcyanide, α-(benzenesulfonyloxyimino)-4-chlorobenzylcyanide, α-(benzenesulfonyloxyimino)-2,4-dichlorobenzylcyanide, α-(benzenesulfonyloxyimino)-2,6-dichlorobenzylcyanide, α-(benzenesulfonyloxyimino)-4-methoxybenzylcyanide, α-(2-chlorobenzenesulfonyloxyimino)-4-methoxybenzylcyanide, α-(benzenesulfonyloxyimino)-thien-2-ylacetonitrile, α-(4-dodecylbenzenesulfonyloxyimino)-benzylcyanide, α-[(p-toluenesulfonyloxyimino)-4-methoxyphenyl]acetonitrile, α-[(dodecylbenzenesulfonyloxyimino)-4-methoxyphenyl] acetonitrile, α-(tosyloxyimino)-4-thienylcyanide, α-(methylsulfonyloxyimino)-1-cyclopentenylacetonitrile, α-(methylsulfonyloxyiniino)-1-cyclohexenylacetonitrile, α-(methylsulfonyloxyimino)-1-cycloheptenylacetonitrile, α-(methylsulfonyloxyimino)-1-cyclooctenylacetonitrile, α-(trifluoromethylsulfonyloxyimino)-1-cyclopentenylacetonitrile, α-(trifluoromethylsulfonyloxyimino)-cyclohexylacetonitrile, α-(ethylsulfonyloxyimino)-ethylacetonitrile, α-(propylsulfonyloxyimino)-propylacetonitrile, α-(cyclohexylsulfonyloxyimino)-cyclopentylacetonitrile, α-(cyclohexylsulfonyloxyimino)-cyclohexylacetonitrile, α-(cyclohexylsulfonyloxyimino)-1-cyclopentenylacetonitrile, α-(ethylsulfonyloxyimino)-1-cyclopentenylacetonitrile, α-(isopropylsulfonyloxyimino)-1-cyclopentenylacetonitrile, α-(n-butylsulfonyloxyimino)-1-cyclopentenylacetonitrile, α-(ethylsulfonyloxyimino)-1-cyclohexenylacetonitrile, α-(isopropylsulfonyloxyimino)-1-cyclohexenylacetonitrile, α-(n-butylsulfonyloxyimino)-1-cyclohexenylacetonitrile, α-(methylsulfonyloxyimino)-phenylacetonitrile, α-(methylsulfonyloxyimino)-p-methoxyphenylacetonitrile, α-(trifluoromethylsulfonyloxyimino)-phenylacetonitrile, α-(trifluoromethylsulfonyloxyimino)-p-methoxyphenylacetonitrile, α-(ethylsulfonyloxyimino)-p-methoxyphenylacetonitrile, α-(propylsulfonyloxyimino)-p-methylphenylacetonitrile, and α-(methylsulfonyloxyimino)-p-bromophenylacetonitrile.

In addition, the oxime sulfonate-based acid generators as disclosed in Japanese Unexamined Patent Application, First Publication No. H09-208554 (see Paragraphs 0012 to 0014, Chemical Formulas 18 to 19), and the oxime sulfonate-based acid generators as disclosed in WO2004/074242 A2 (see pp. 65 to 85, Examples 1 to 40) can also be suitably used.

Further, examples of suitable oxime sulfonate-based acid generators include the following compounds.

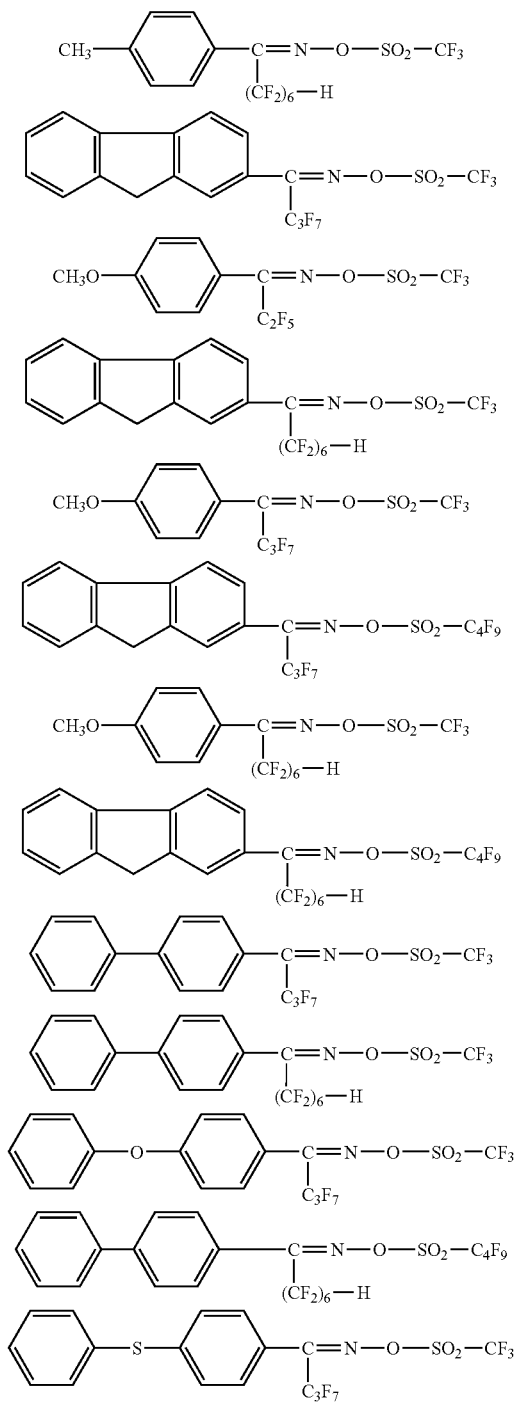

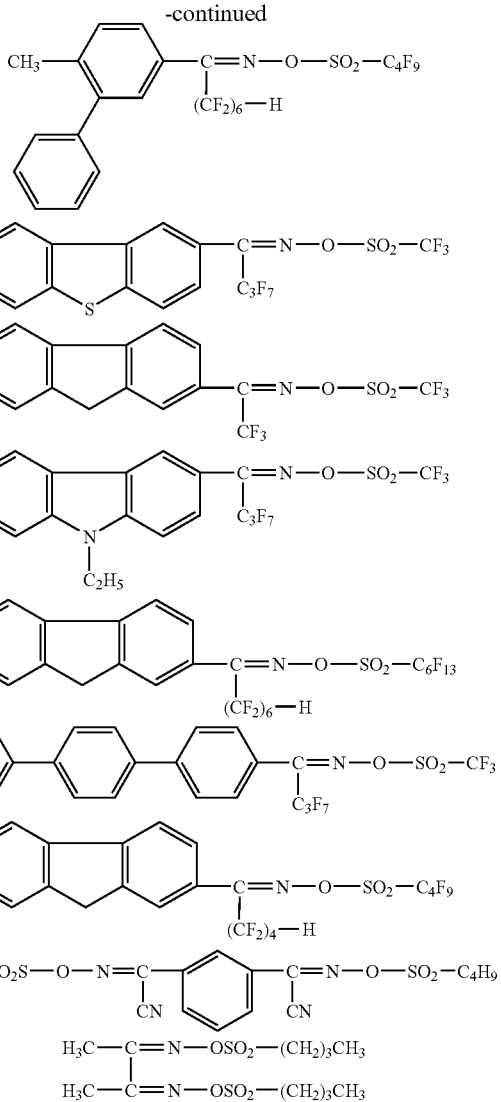

Among the above-exemplified compounds, the following four compounds are preferred.

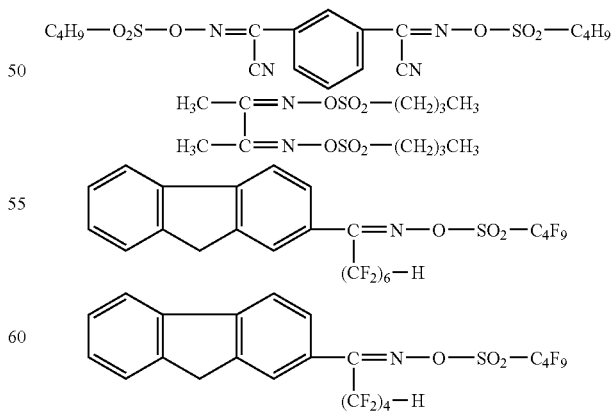

Among the diazomethane-based acid generators, specific examples of bisalkyl or bisarylsulfonyl diazomethanes include bis(isopropylsulfonyl)diazomethane, bis(p-toluenesulfonyl)diazomethane, bis(1,1-dimethylethylsulfonyl)diazomethane, bis(cyclohexylsulfonyl)diazomethane, and bis(2,4-dimethylphenylsulfonyl)diazomethane.

Further, the diazomethane-based acid generators as disclosed in Japanese Unexamined Patent Application, First Publication Nos. H11-035551, H11-035552, and H111-035573 can also be suitably used.

In addition, examples of the poly(bissulfonyl)diazomethanes include 1,3-bis(phenylsulfonyldiazomethylsulfonyl)propane, 1,4-bis(phenylsulfonyldiazomethylsulfonyl)butane, 1,6-bis(phenylsulfonyldiazomethylsulfonyl)hexane, 1,10-bis(phenylsulfonyldiazomethylsulfonyl)decane, 1,2-bis(cyclohexylsulfonyldiazomethylsulfonyl)ethane, 1,3-bis(cyclohexylsulfonyldiazomethylsulfonyl)propane, 1,6-bis(cyclohexylsulfonyldiazomethylsulfonyl)hexane, and 1,10-bis(cyclohexylsulfonyldiazomethylsulfonyl)decane, as disclosed in Japanese Unexamined Patent Application, First Publication No. H11-322707.

As the component (B), the acid generator may be used alone or in a combination of two or more kinds thereof.

In the present invention, as the component (B), an onium salt having a fluorinated alkylsulfonic acid ion as an anion is preferably used.

The content of the component (B) in a resist composition for immersion lithography of the present invention is 0.5 to 30 parts by mass, and preferably 1 to 10 parts by mass, relative to 100 parts by mass of the component (A). If the quantity is within the above range, the pattern formation is sufficiently performed. Further, a uniform solution can be obtained, and storage stability is better. Accordingly, the range is considered preferable.

<Optional Component>

The positive resist composition for immersion lithography of the present invention can further include a nitrogen-containing organic compound (D) (referred to as the component (D), hereinafter) as an optional component, in order to improve the shape of the resist pattern and the post exposure stability of the latent image formed by the pattern-wise exposure of the resist layer, etc.

A multitude of these nitrogen-containing organic compounds have already been proposed as the component (D), and any of these known compounds can be optionally used. Among these, an aliphatic amine is preferred, and a secondary aliphatic amine or tertiary aliphatic amine is particularly preferred. As used herein, the aliphatic amine refers to amine having at least one aliphatic group, and the aliphatic group preferably has 1 to 12 carbon atoms.

Examples of the aliphatic amine include an amine in which at least one hydrogen atom of ammonia, $NH_3$, is substituted with an alkyl group or hydroxyalkyl group having 1 or more and 12 or less carbon atoms (i.e. alkyl amine or alkyl alcohol amine); or a cyclic amine.

Examples of the alkylamine and the alkyl alcohol amine include monoalkylamines such as n-hexylamine, n-heptylamine, n-octylamine, n-nonylamine, and n-decylamine; dialkylamines such as diethylamine, di-n-propylamine, di-n-heptylamine, di-n-octylamine, and dicyclohexylamine; trialkylamines such as trimethylamine, triethylamine, tri-n-propylamine, tri-n-butylamine, tri-n-hexylamine, tri-n-pentylamine, tri-n-heptylamine, tri-n-octylamine, tri-n-nonylamine, tri-n-decanylamine, tri-n-dodecylamine; and alkyl alcohol amines such as diethanolamine, triethanolamine, diisopropanolamine, triisopropanolamine, di-n-octanolamine, and tri-n-octanolamine. Among these, trialkylamines having 5 to 10 carbon atoms are more preferred, and tri-n-pentylamine is most preferred.

Examples of the cyclic amine include a heterocyclic compound containing a nitrogen atom as a hetero atom. The heterocyclic compound may be a monocyclic compound (aliphatic monocyclic amine), or a polycyclic compound (aliphatic polycyclic amine).

Specific examples of the aliphatic monocyclic amine include piperidine, and piperazine.

The aliphatic polycyclic amine preferably has 6 to 10 carbon atoms, and specific examples thereof include 1,5-diazabicyclo[4.3.0]-5-nonene, 1,8-diazabicyclo[5.4.0]-7-undecene, hexamethylenetetramine, and 1,4-diazabicyclo[2.2.2]octane.

The component (D) may be used alone, or in a combination of two or more kinds thereof.

The component (D) is used in an amount within a range from usually 0.01 to 5.0 parts by mass, relative to 100 parts by mass of the component (A).

The resist composition for immersion lithography of the present invention can further include at least one compound (E) selected from the group consisting of an organic carboxylic acid, and a phosphorus oxo acid and derivatives thereof (referred to as the component (E), hereinafter) as another optional component, in order to prevent any deterioration in sensitivity, and to improve the resist pattern shape and the post exposure stability of the latent image formed by the pattern-wise exposure of the resist layer, etc.

Preferable examples of the organic carboxylic acid include acetic acid, malonic acid, citric acid, malic acid, succinic acid, benzoic acid, and salicylic acid.

Examples of the phosphorus oxo acid and derivatives thereof include phosphoric acid, phosphonic acid, and phosphinic acid, and among these, phosphonic acid is particularly preferred.

Examples of the derivatives of the phosphorus oxo acid include an ester in which a hydrogen atom of the oxo acid has been substituted with a hydrocarbon group, and examples of the hydrocarbon group include an alkyl group having 1 to 5 carbon atoms, and an aryl group having 6 to 15 carbon atoms.

Examples of the derivative of the phosphoric acid include a phosphoric acid ester such as di-n-butyl phosphate and diphenyl phosphate.

Examples of the derivative of the phosphonic acid include a phosphonic acid ester such as dimethyl phosphonate, di-n-butyl phosphonate, phenylphosphonic acid, diphenyl phosphonate, and dibenzyl phosphonate.

Examples of the derivative of the phosphinic acid include a phosphinic acid ester of phenylphosphinic acid, etc.

The component (E) may be used alone or in a combination of two or more kinds thereof.

The component (E) is typically used in an amount within a range from 0.01 to 5.0 parts by mass, relative to 100 parts by mass of the component (A).

Miscible additives such as an additional resin for improving the performances of a resist film, a surfactant for improving the applicability, a dissolution inhibitor, a plasticizer, a stabilizer, a colorant, a halation prevention agent, and a dye can also be further added to the resist composition for immersion lithography of the present invention according to need.

The resist composition for immersion lithography of the present invention can be produced by dissolving the above-described materials in an organic solvent (referred to as the component (S), hereinafter).

The component (S) may be any solvent capable of dissolving various components to generate a uniform solution, and one, or two or more solvents selected from known materials that are used as the solvents for conventional chemically amplified resists can be suitably selected and used.

Examples of the component (S) include lactones such as γ-butyrolactone; ketones such as acetone, methyl ethyl ketone, cyclohexanone, methyl-n-amylketone, methyl isoamyl ketone and 2-heptanone; polyhydric alcohols such as ethylene glycol, diethylene glycol, propylene glycol, and dipropylene glycol; the derivatives of polyhydric alcohols, including ester bond-containing compounds such as ethylene glycol monoacetate, diethylene glycol monoacetate, propylene glycol monoacetate, and dipropylene glycol monoacetate, and ether bond-containing compounds such as monoalkyl ethers and monophenyl ethers of the above-described polyhydric alcohols or ester bond-containing compounds, in which the monoalkyl ethers includes monomethyl ether, monoethyl ether, monopropyl ether, and monobutyl ether; cyclic ethers such as dioxane; esters such as methyl lactate, ethyl lactate (EL), methyl acetate, ethyl acetate, butyl acetate, methyl pyruvate, ethyl pyruvate, methyl methoxypropionate, and ethyl ethoxypropionate; and aromatic organic solvents such as anisole, ethyl benzyl ether, cresyl methyl ether, diphenyl ether, dibenzyl ether, phenetole, butyl phenyl ether, ethylbenzene, diethylbenzene, amylbenzene, isopropylbenzene, toluene, xylene, cimene, and mesitylene.

These organic solvents can be used alone, or as a mixed solvent of two or more kinds thereof. Among these, propylene glycol monomethyl ether acetate (PGMEA), propylene glycol monomethyl ether (PGME), and EL are preferred.

Further, a mixed solvent of propylene glycol monomethyl ether acetate, PGMEA, and a polar solvent is preferred. In this case, the blending ratio (mass ratio) of PGMEA to the polar solvent is suitably determined based on the compatibility between PGMEA and the polar solvent, but it is preferably within a range from 1:9 to 9:1, and more preferably from 2:8 to 8:2.

Specifically, in the case where EL is added as the polar solvent, the mass ratio of PGMEA:EL is preferably within a range from 1:9 to 9:1, and more preferably from 2:8 to 8:2. Further, in the case where PGME is added as the polar solvent, the mass ratio of PGMEA:PGME is preferably within a range from 1:9 to 9:1, more preferably from 2:8 to 8:2, and much more preferably 3:7 to 7:3.

Furthermore, as the component (S), a mixed solvent of at least one selected from PGMEA and EL, and γ-butyrolactone, is also preferred. In such cases, the mass ratio of the former and latter components in the mixed solvent is preferably within a range from 70:30 to 95:5.

The quantity of the component (S) used is not particularly limited, but it is suitably selected according to the applied film thickness at a concentration which allows application to a substrate. Generally, the amount of the organic solvent is used in an amount such that the solid concentration of the resist composition is in the range of from 2 to 20 mass %, and preferably from 5 to 15 mass %.

Dissolution of materials in the component (S) can be carried out simply by mixing and stirring each of the above-described components by a conventional method. Further, if necessary, the components may be dispersed and mixed by means of a dispersion machine such as a dissolver, a homogenizer, and a triple roll mill, further optionally followed by filtration using a mesh filter, a membrane filter, or the like.

As described above, a resist composition for immersion lithography of the present invention is excellent in immersion medium resistance such as the effect of inhibiting material elution, and moreover has favorable lithography characteristics. When a resist composition for immersion lithography of the present invention is used in immersion lithography, a resist pattern can be formed without practical problems.

The reason why the aforementioned effects are obtained in the present invention is not clear. However, the resin (A1) has the structure containing a fluorine atom and no acid-dissociable group, and the resin (A2) has the structure containing no fluorine atom. Therefore, when such a resist composition for immersion lithography is used to form a resist film, it is speculated that the resins (A1) are distributed in the vicinity of the outside surface of the resist film. As a result, the obtained resist film has an increased receding angle and a decreased sliding angle in comparison with the case where the resin (A2) is used alone, thereby improving immersion lithography resistance, for example. In addition, it is speculated that the resins (A2) containing no fluorine atom are distributed inside the resist film so as to ensure favorable lithography characteristics.

In other words, in the resist film formed using a resist composition for immersion lithography of the present invention, in comparison with the case where the resin (A2) is used alone as the component (A), a dynamic contact angle with respect to water and a sliding angle are changed. The dynamic contact angle refers to a contact angle (an advancing angle) when a water drop starts to slide by inclining a resist film, and there are a contact angle (an advancing angle) at the forward end point in the sliding direction and a contact angle (a receding angle) at the backward end point in the sliding direction. The sliding angle refers to an inclination degree of a resist film when a water drop starts to slide by inclining the resist film. For example, the contact angle is increased, whereas the sliding angle is decreased. In immersion lithography, as described above, a resist film contacts an immersion medium such as water during immersion exposure. Therefore, it is speculated that material elution is affected by the properties of the surface of a resist film (for example, hydrophilicity or hydrophobicity). Also, it is speculated in the present invention that these properties are changed by using the specific component (A) and therefore material elution rarely occur.

As used herein, the receding angle refers to an angle $\theta_1$ between an upper part $1a$ of a liquid drop $1$ and a flat surface $2$ on which the liquid drop $1$ has been placed, when the liquid drop $1$ starts to move (drop) on the flat surface $2$ by gradually inclining the flat surface $2$ as shown in FIG. 1. The sliding angle refers to an inclination degree $\theta_2$ of the flat surface $2$ when the liquid drop $1$ starts to move (drop) on the flat surface $2$.

As used in the present specification, the receding angle and the sliding angle are measured in the following manner.

First, a resist composition solution is spin-coated on a 6 inch silicone substrate, and then heated at a temperature of 90° C. for 90 seconds to form a resist film.

Thereafter, measurements for the resulting resist film can be conducted by means of a commercially available measurement apparatus such as AUTO SLIDING ANGLE: SA-30 DM (manufactured by Kyowa Interface Science Co. Ltd.) or AUTO DISPENSER: AD-31 (manufactured by Kyowa Interface Science Co. Ltd.).

The resist composition for immersion lithography of the present invention preferably has a receding angle of 45 degrees or more, more preferably 50 to 150 degrees, particularly preferably 55 to 130 degrees, and most preferably 60 to 100 degrees, as measured for the resist film obtained by using the resist composition. If the receding angle is 45 degrees or more, the effect of inhibiting the material elution during immersion exposure is enhanced. Although the reason is not clear, one of the main reasons for this is believed to be related with the hydrophobicity of the resist film. That is, it is thought that since an aqueous substance such as water is used as the immersion medium, higher hydrophobicity has an influence on the rapid removal of the immersion medium from the surface of the resist film after the immersion exposure. Further, if the receding angle is 150 degrees or less, lithography characteristics, etc. are good.

Moreover, the resist composition for immersion lithography of the present invention preferably has a sliding angle of 36 degrees or less, more preferably 10 to 36 degrees, particularly preferably 12 to 30 degrees, and most preferably 15 to 25 degrees, as measured for the resist film obtained by using the resist composition. If the sliding angle is 36 degrees or less, the effect of inhibiting the material elution during immersion exposure is enhanced. Further, if the sliding angle is 10 degrees or more, lithography characteristics, etc. are good.

The levels of the receding angle and the sliding angle can be adjusted by changing the composition of the resist composition for immersion lithography, for example, the mixture ratio of the resin (A1) and the resin (A2) in the component (A) or the proportion of the structural unit (a'3). For example, when the proportion of the resin (A1) within the component (A) is 1 mass % or more, the receding angle becomes much larger, and the sliding angle becomes smaller, in comparison with the case where the resin (A2) is used alone.

Furthermore, in the present invention, material elution into the liquid immersion solvent is inhibited, as described above. Thus, change in quality of resist films and change in refractive indices of the liquid immersion solvents can be inhibited. Accordingly, by inhibiting the change in refractive indices of liquid immersion solvents, undulation and LER can be reduced in the formed resist pattern, and lithography characteristics such as shape become good. In addition, contamination of lens of an exposure apparatus can be reduced, which in turn eliminates the need for a means for protecting them from deterioration, and contributes to simplification of the process or the exposure apparatus.

According to a resist composition for immersion lithography of the present invention, it is possible to form a resist pattern with high resolution, for example a resist pattern with a size of 120 nm or less. Also, by using a resist composition for immersion lithography of the present invention, it is possible to form a resist pattern with a good shape, in which the generation of defects and LER are suppressed.

Moreover, in a resist composition for immersion lithography of the present invention, the resin (A1) that is used as the component (A) does not contain an acid-dissociable group. Therefore, the present invention has the advantageous effects such as easy synthesis and inexpensive availability in comparison with resins that have generally been used as a base resin of a positive resist composition (a resin containing an acid-dissociable, dissolution-inhibiting group).

<<Method for Forming Resist Pattern>>

Hereinafter, the method for forming a resist pattern of the present invention is described.

The method for forming the resist pattern of the present invention includes forming a resist film on a substrate using a resist composition for immersion lithography of the present invention; conducting immersion exposure of the resist film; and developing the resist film to form a resist pattern.

One preferable embodiment of the method for forming a resist pattern of the present invention is described below.

First, the resist composition for immersion lithography of the present invention is applied onto the surface of a substrate such as a silicon wafer by using a spinner or the like, and then subjected to pre-baking (post applied bake (PAB) treatment) to form a resist film.

At this time, an organic or inorganic anti-reflective film may also be provided between the substrate and the applied layer of the resist composition, to thereby produce a double-layer laminate.

Moreover, an organic anti-reflective film may also be provided on the resist film, to thereby produce a double-layer laminate. In addition, an underlying anti-reflective film may also be provided thereto, to thereby produce a triple-layer laminate.

An anti-reflective film to be provided on the resist film is preferably soluble in an alkali developing solution.

The above-described processes can be carried out by using a well-known method. Preferably, the operating condition, etc. is suitably adjusted according to the composition and the characteristics of the used resist composition for immersion lithography.

Next, the obtained resist film is subjected to selective immersion lithography (Liquid Immersion Lithography) through a desired mask pattern. At this time, a solvent (immersion medium) having a higher refractive index than that of air is preliminarily filled between the resist film and a bottom lens of an exposure apparatus, and then exposure (immersion exposure) is carried out in such a state.

The wavelength used for exposure is not particularly limited, and exposure can be carried out using radiation such as an ArF excimer laser, a KrF excimer laser, and an $F_2$ laser. A resist composition of the present invention is effective for a KrF or an ArF excimer laser, and particularly an ArF excimer laser.

As described above, in a formation method of the present invention, during exposure, an immersion medium is filled between the resist film and a bottom lens of an exposure apparatus, and then exposure (immersion exposure) is carried out in such a state.

As the immersion medium, a solvent which has a higher refractive index than that of air, and a lower refractive index than that of a resist film formed by using the resist composition for immersion lithography is preferred. The refractive index of the solvent is not particularly limited, as long as it is within the above-described range.

Examples of the solvent which has a higher refractive index than that of air, and a lower refractive index than that of a resist film include water, a fluorine-based inactive liquid, and a silicone-based solvent.

Specific examples of the fluorine-based inactive liquid include a liquid having a fluorine-based compound such as $C_3HCl_2F_5$, $C_4F_9OCH_3$, $C_4F_9OC_2H_5$, and $C_5H_3F_7$ as a main component. Among these, those having a boiling point of 70° C. to 180° C. are preferred, and those having a boiling point of 80° C. to 160° C. are more preferred. If the fluorine-based inactive liquid has a boiling point in the above-described range, the removal of the medium used for liquid immersion after completion of exposure can be carried out by a simple method, thereby it being preferable.

As the fluorine-based inactive liquid, a perfluoroalkyl compound in which all of the hydrogen atoms of an alkyl group have been substituted with fluorine atoms is particularly preferred. Specific examples of the perfluoroalkyl compound include a perfluoroalkyl ether compound and a perfluoroalkylamine compound.

Further, specific examples of the perfluoroalkyl ether compound include perfluoro(2-butyl-tetrahydrofuran) (boiling point: 102° C.), and examples of the perfluoroalkylamine compound include perfluorotributylamine (boiling point: 174° C.).

In particular, the positive resist composition for immersion lithography of the present invention is substantially not interfered with by water, and has excellent sensitivity, and shape of a resist pattern profile. As a result, water is preferably used as a solvent that has a larger refractive index than the refractive index of air. In addition, water is preferred from viewpoints of cost, safety, environmental concern, and a diversity of uses.

Then, after completion of the immersion exposure step, post exposure baking (PEB) is conducted, and then development using an alkali developer including an aqueous alkaline solution is conducted. Further, water rinsing is conducted preferably with pure water. Water rinsing can be carried out, for example, by dropping or spraying water onto the surface of the substrate while rotating the substrate, and washing out the developer on the substrate and the resist composition for immersion lithography dissolved by the developer. Further, by drying the resultant, a resist pattern, in which the resist film (the coated film with the positive resist composition for immersion lithography) has been patterned in the shape according to a mask pattern can be obtained.

EXAMPLES

Hereinafter, the present invention will be illustrated in detail with reference to the following Examples, but these examples should not be construed as limiting the scope of the invention in any way.

The resins (A)-1 to (A)-4 used in Examples 1 to 11 and Comparative Examples 1 to 3 described below were the homopolymers that were synthesized using the monomers (1) to (4) described below with reference to Japanese Unexamined Patent Applications, First Publications No. 2003-40840, No. 2005-232095, and No. 2005-316352.

For each of the obtained resins, the GPC measurement was carried out to obtain the weight average molecular weight (Mw) and the polydispersity (Mw/Mn) thereof. The results are additionally described in Table 1.

The resins (A)-5 and (A)-6 used in Examples 1 to 11 and Comparative Examples 1 to 3 described below were the homopolymers that were copolymerized using the monomers (5) to (8) described below according to a known droplet polymerization method.

For each of the obtained resins, the GPC measurement was carried out to obtain the weight average molecular weight (Mw) and the polydispersity (Mw/Mn) thereof. The results are additionally described in Table 1.

TABLE 1

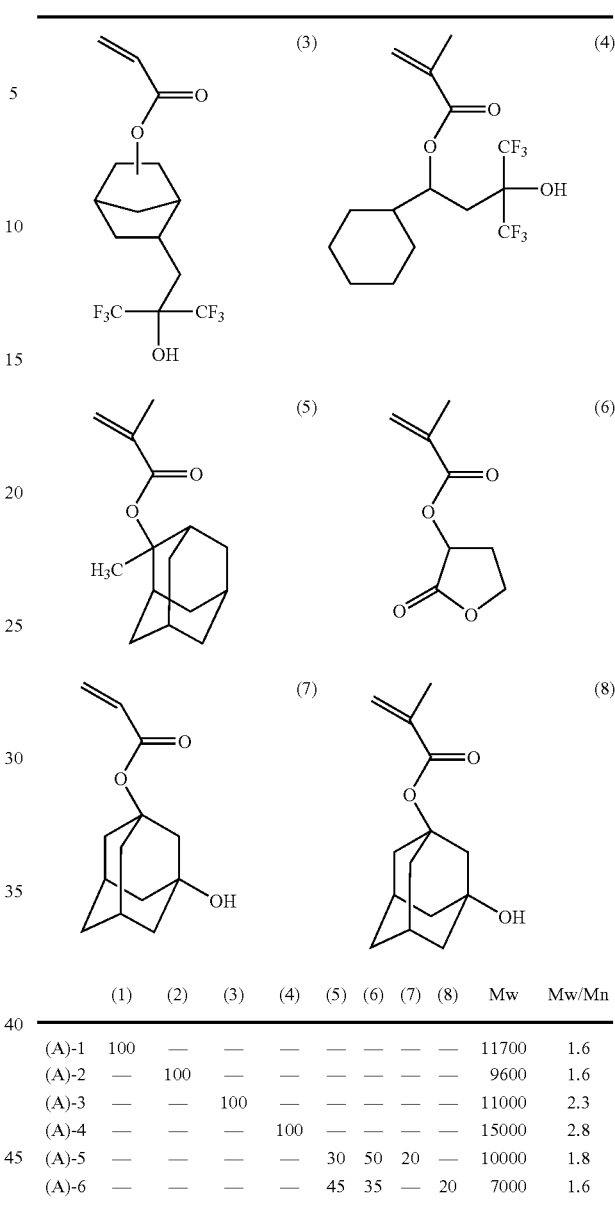

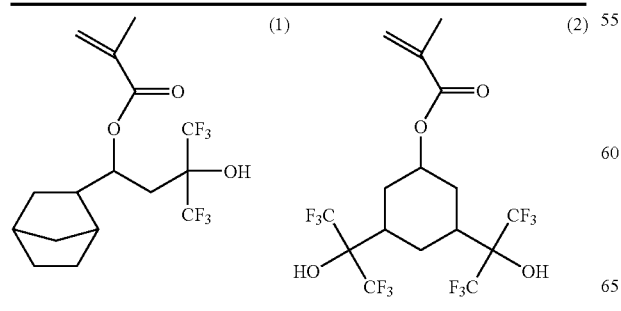

| | (1) | (2) | (3) | (4) | (5) | (6) | (7) | (8) | Mw | Mw/Mn |
|---|---|---|---|---|---|---|---|---|---|---|
| (A)-1 | 100 | — | — | — | — | — | — | — | 11700 | 1.6 |
| (A)-2 | — | 100 | — | — | — | — | — | — | 9600 | 1.6 |
| (A)-3 | — | — | 100 | — | — | — | — | — | 11000 | 2.3 |
| (A)-4 | — | — | — | 100 | — | — | — | — | 15000 | 2.8 |
| (A)-5 | — | — | — | — | 30 | 50 | 20 | — | 10000 | 1.8 |
| (A)-6 | — | — | — | — | 45 | 35 | — | 20 | 7000 | 1.6 |

The chemical structures of the resins (A)-1 to (A)-6 are shown below.

In the chemical formulas, the values that were appended to the lower right of 0 represent the ratio (mol %) of each structural unit.

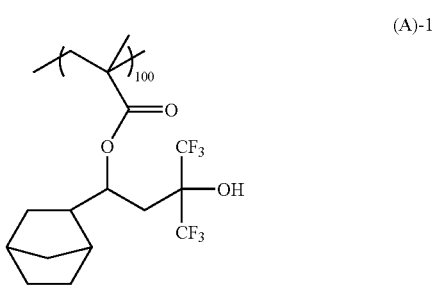

-continued

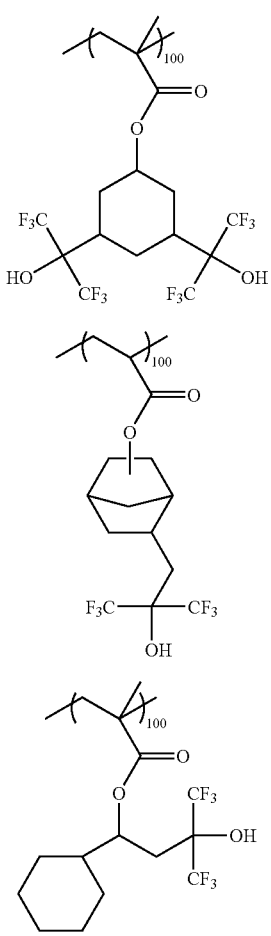

(A)-2

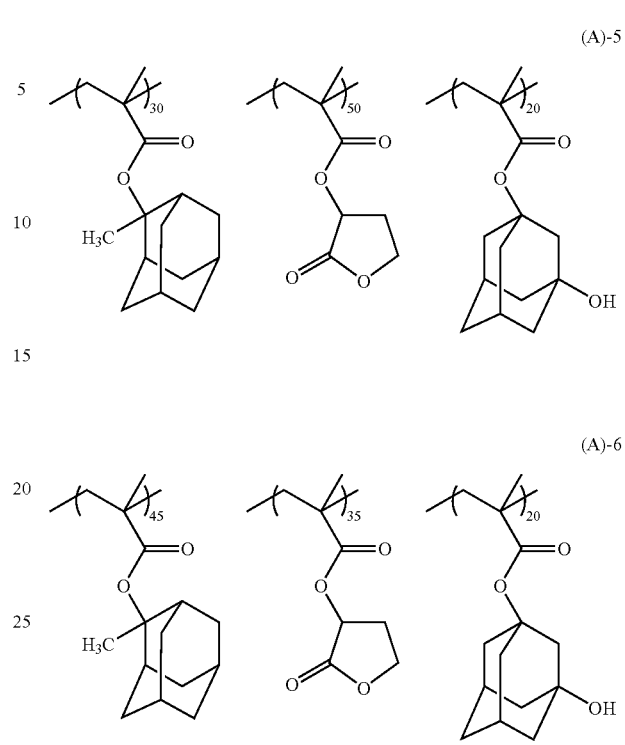

(A)-3

(A)-4

(A)-5

(A)-6

Examples 1 to 11 and Comparative Examples 1 to 3

The components as shown in Tables 2 and 3 were mixed and dissolved to prepare a positive resist composition.

TABLE 2

| | Component (A) | Component (B) | Component (D) | Component (S) |
|---|---|---|---|---|
| Comparative Example 1 | — | (A)-5 [100] | (B)-1 [3] | (D)-1 [0-2] | (S)-1 [1500] |
| Example 1 | (A)-1 [1] | (A)-5 [99] | (B)-1 [3] | (D)-1 [0.2] | (S)-1 [1500] |
| Example 2 | (A)-1 [10] | (A)-5 [90] | (B)-1 [3] | (D)-1 [0.2] | (S)-1 [1500] |
| Example 3 | (A)-1 [20] | (A)-5 [80] | (B)-1 [3] | (D)-1 [0.2] | (S)-1 [1500] |
| Example 4 | (A)-2 [10] | (A)-5 [90] | (B)-1 [3] | (D)-1 [0.2] | (S)-1 [1500] |
| Example 5 | (A)-3 [10] | (A)-5 [90] | (B)-1 [3] | (D)-1 [0.2] | (S)-1 [1500] |

TABLE 3

| | Component (A) | Component (B) | Component (D) | Component (S) |
|---|---|---|---|---|
| Comparative Example 2 | — | (A)-6 [100] | (B)-1 [3] | (D)-1 [0.2] | (S)-1 [1500] |
| Example 6 | (A)-4 [0.5] | (A)-6 [99.5] | (B)-1 [3] | (D)-1 [0.2] | (S)-1 [1500] |
| Example 7 | (A)-4 [1] | (A)-6 [99] | (B)-1 [3] | (D)-1 [0.2] | (S)-1 [1500] |
| Example 8 | (A)-4 [5] | (A)-6 [95] | (B)-1 [3] | (D)-1 [0.2] | (S)-1 [1500] |
| Example 9 | (A)-4 [10] | (A)-6 [90] | (B)-1 [3] | (D)-1 [0.2] | (S)-1 [1500] |
| Example 10 | (A)-4 [20] | (A)-6 [80] | (B)-1 [3] | (D)-1 [0.2] | (S)-1 [1500] |
| Example 11 | (A)-4 [50] | (A)-6 [50] | (B)-1 [3] | (D)-1 [0.2] | (S)-1 [1500] |
| Comparative Example 3 | (A)-4 [100] | — | (B)-1 [3] | (D)-1 [0.2] | (S)-1 [1500] |

Each of the symbols in Tables 2 and 3 has the meaning as follows, and the values in [ ] represent blending amounts (parts by mass).

(B)-1: 4-methylphenyldiphenylsulfonium nonafluoro-n-butanesulfonate
(D)-1: tri-n-pentylamine
(S)-1: mixed solvent of PGMEA/PGME=60/40 (mass ratio)

The obtained positive resist composition solutions were evaluated as follows.

<Measurement of Receding Angle and Sliding Angle>

The obtained positive resist composition solution was applied onto a silicon wafer with a diameter of 8 inch by using a spinner, and dried by prebaking at 115° C. for 60 seconds on a hot plate, to thereby form a resist film with a thickness of 175 nm. One drop (50 μl) of pure water was put onto the resist film, and then the receding angle and the sliding angle thereof (receding angle and sliding angle before exposure) were measured using the apparatus and conditions described below.

<Apparatus Name>

AUTO SLIDING ANGLE: SA-30 DM (manufactured by Kyowa Interface Science Co. Ltd.)
AUTO DISPENSER: AD-31 (manufactured by Kyowa Interface Science Co. Ltd.), <analysis software (attached to the apparatus): FAMAS>

In addition, the receding angle and the sliding angle thereof (receding angle and sliding angle after exposure) were measured in the same way as the aforementioned except that a resist film was formed in the same way as the aforementioned and open flame exposure (exposure through no mask) is conducted with ArF excimer laser (193 nm) using the simplified exposure apparatus VUVES-4500 (manufactured by Litho Tech Japan Corporation).

The results of the receding angles and the sliding angles before and after exposure are shown in Tables 4 and 5.

Figure 2:
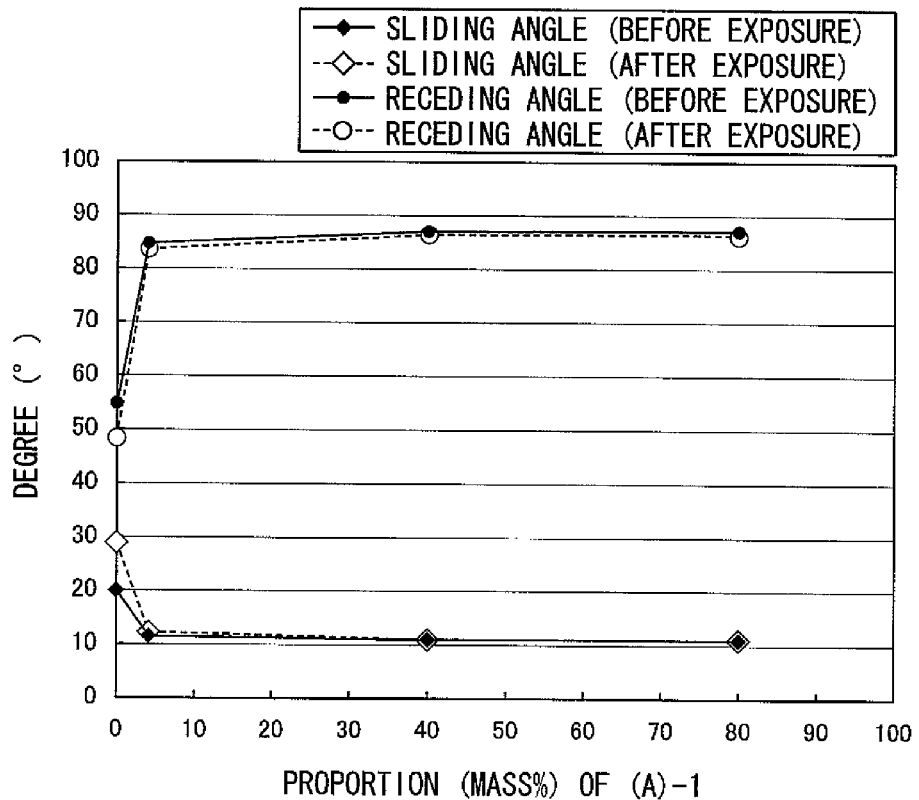
FIG. 2 is a graph showing the relationship between the proportion (mass %) of (A)-1 within the component (A), and a receding angle and a sliding angle in Example.
Figure 3:
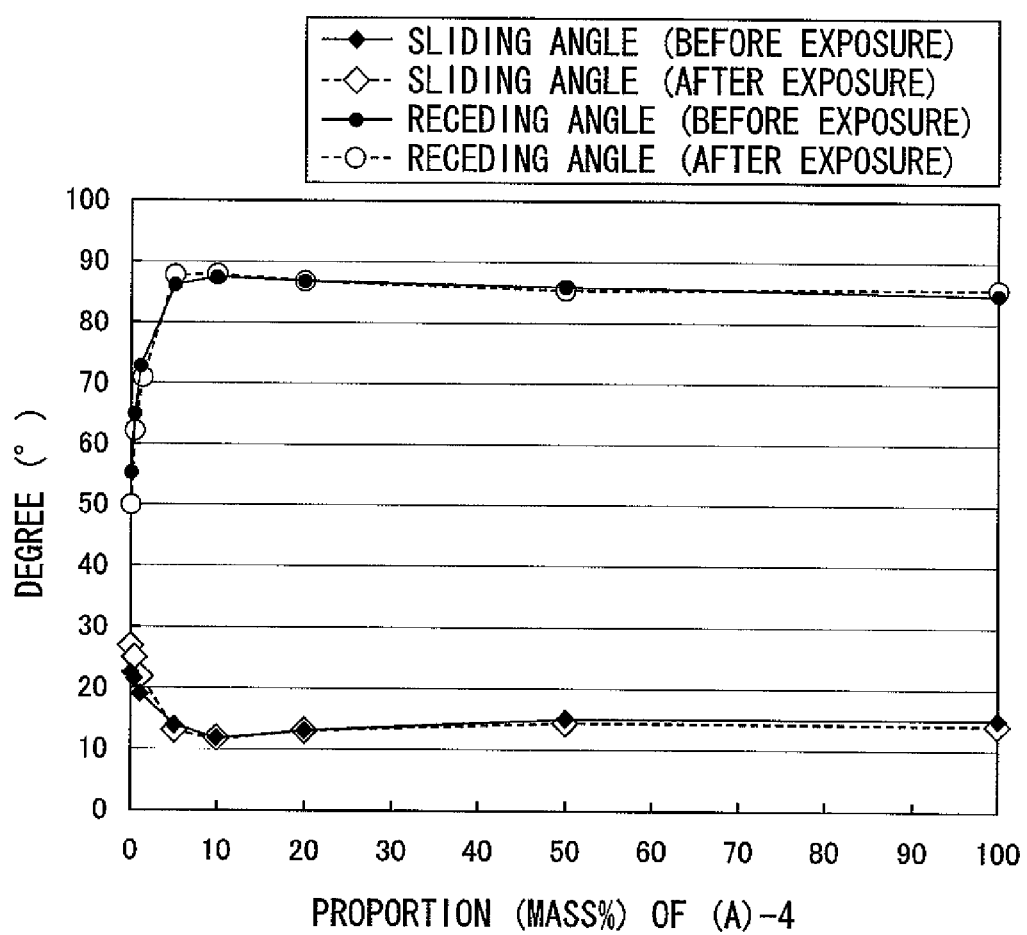
FIG. 3 is a graph showing the relationship between the proportion (mass %) of (A)-4 within the component (A), and a receding angle and a sliding angle in Example.

Furthermore, in the aforementioned results, the results of Examples 1 to 3 and Comparative Example 1 and the results of Examples 6 to 11 and Comparative Examples 2 and 3 were used to prepare the graphs in which the horizontal axis represents the ratio of (A)-1 or (A)-4 in the component (A), and the vertical axis represents the degrees (°) of the receding angles and the sliding angles. These graphs are shown in FIG. 2 and FIG. 3.

As shown by these results, in Examples 1 to 5 which used both of any one of (A)-1 to (A)-3 corresponding to the resin (A1) and (A)-5 corresponding to the resin (A2), the sliding angles became small, and the receding angles became large in both cases before and after exposure, in comparison with Comparative Example 1 which used (A)-5 alone. Also, each of the difference between the sliding angles before and after exposure and the difference between the receding angles before and after exposure became small. Among these, in the case where (A)-1 is used, the sliding angle and the receding angle were largely changed in both cases before and after exposure even though the proportion of (A)-1 within the component (A) was only a quantity of 1 mass %.

In the same way, in Examples 6 to 11 which used both of (A)-4 to corresponding to the resin (A1) and (A)-6 corresponding to the resin (A2), the sliding angles became small, and the receding angles became large in both cases before and after exposure, in comparison with Comparative Example 2 which used (A)-6 alone. Also, each of the difference between the sliding angles before and after exposure and the difference between the receding angles before and after exposure became small.

Furthermore, in Examples 8 to 11 in which the proportion of (A)-4 within the component (A) was within the range from 5 to 50 mass %, the sliding angles became small in both cases before and after exposure, in comparison with Comparative Example 3 which used (A)-4 alone. Also, in Examples 8 to 10 in which the proportion of (A)-4 within the component (A) was within the range from 5 to 20 mass %, the receding angles became large in both cases before and after exposure, in comparison with Comparative Example 3 which used (A)-4 alone.

TABLE 4

| | Sliding Angle (°) | | Receding Angle (°) | |
|---|---|---|---|---|
| | Before exposure | After exposure | Before exposure | After exposure |
| Comparative Example 1 | 20.0 | 29.0 | 54.9 | 48.1 |
| Example 1 | 12.0 | 12.5 | 84.7 | 83.4 |
| Example 2 | 11.0 | 11.0 | 87.0 | 86.4 |
| Example 3 | 11.0 | 11.0 | 87.4 | 86.4 |
| Example 4 | 19.0 | 19.0 | 62.9 | 63.7 |
| Example 5 | 17.0 | 17.0 | 69.0 | 69.4 |

TABLE 5

| | Sliding Angle (°) | | Receding Angle (°) | |
|---|---|---|---|---|
| | Before exposure | After exposure | Before exposure | After exposure |
| Comparative Example 2 | 22.5 | 27.0 | 55.4 | 50.6 |
| Example 6 | 21.5 | 25.0 | 65.1 | 62.4 |
| Example 7 | 19.0 | 22.0 | 72.8 | 71.1 |
| Example 8 | 14.0 | 13.0 | 86.6 | 88.0 |
| Example 9 | 12.0 | 12.0 | 87.4 | 88.1 |
| Example 10 | 13.0 | 13.0 | 87.3 | 86.9 |
| Example 11 | 15.0 | 14.5 | 86.2 | 85.8 |
| Comparative Example 3 | 15.0 | 14.0 | 84.6 | 85.6 |

<Measurement of Eluted Materials>

The resist films were formed using the positive resist composition solutions of Example 1 and Comparative Example 1 in the same manner as the aforementioned. Subsequently, by using VRC310S (manufactured by S.E.S. Co., Ltd.), one liquid drop (50 μL) of pure water was moved in a constant linear velocity in a circular motion from the center of wafer at room temperature (the total contact area of the resist film with which the liquid drop came in contact: 221.56 cm$^2$).

Then, the liquid drop was collected and analyzed with the analytical device "Agilent-HP1100 LC-MSD (manufactured by Agilent Technologies Inc.)", to thereby measure the elution quantities (mol/cm$^2$) of the cation portion and the anion portion of the component (B) and the elution quantities (mol/cm$^2$) of the component (D) from the unexposed resist films, and to obtain the total thereof (the elution quantities (mol/cm$^2$) before exposure).

Also, the resist films were formed in the same manner as the aforementioned, and the open flame exposure (exposure through no mask) was conducted with ArF excimer laser (193 nm) using the simplified exposure device "VUVES4500 (manufactured by Litho Tech Japan Corporation)".

Subsequently, the exposed resist films were analyzed in the same manner as the aforementioned, to thereby measure the elution quantities (mol/cm$^2$) of the cation portion and the anion portion of the component (B) and the elution quantities (mol/cm$^2$) of the component (D) from the exposed resist films, and to obtain the total thereof (the elution quantities (mol/cm$^2$) before exposure).

These results were shown in Table 6.

TABLE 6

| | Sliding Angle (°) | |
|---|---|---|
| | Before exposure | After exposure |
| Comparative Example 1 | 7.64 | 9.06 |
| Example 1 | 15.05 | 14.22 |

As is clear from the above results, when the positive resist composition of Example 1 which used both of (A)-1 and (A)-5, the elutions of the components (B) and (D) into the immersion medium (water) before and after the exposure process were inhibited in comparison with the positive resist composition of Comparative Example 1 which used only (A)-5, and the effect of inhibiting the elution of components in resist film was confirmed.

In the aforementioned evaluation, the elution quantity before exposure is for evaluating the elution quantity at the unexposed portion when selective exposure is conducted to form a resist pattern. Whereas, the elution quantity after exposure is for evaluating the elution quantity at the exposed portion. From the result that the elution quantities into the immersion medium (water) were small both before and after exposure, it was able to be confirmed that a resist composition for immersion lithography of the present invention can be preferably used for immersion lithography used in a method of forming a resist pattern including an immersion exposure step.

In addition, from the measurement results of receding angles and sliding angles and the measurement results of eluted materials, it was confirmed that there was the correlation between the increase in receding angle and the decrease in sliding angle, and the effect of inhibiting material elution.

<Lithography Characteristics>

An organic anti-reflective film composition "ARC-29" (trademark, manufactured by Brewer Science, Inc.) was applied onto an 8-inch silicon wafer by using a spinner, and sintered at 205° C. for 60 seconds on a hot plate to form an organic anti-reflective film having a film thickness of 77 nm. Each of the positive resist composition solutions of Examples 1 to 11 and Comparative Examples 1 and 2 was applied onto the anti-reflective film by using a spinner, and dried by prebaking it on a hot plate at 115° C. for 60 seconds to form a resist film having a film thickness of 175 nm.

Subsequently, the obtained resist film was selectively irradiated with an ArF excimer laser (193 nm) via a mask pattern by using an ArF exposure apparatus NSR-S302 (manufactured by Nikon Corporation, NA (numerical aperture)=0.60, 2/3 annular illumination). Then, PEB treatment was conducted at 115° C. for 60 seconds, developing was conducted for 30 seconds in an aqueous solution of tetramethylammonium hydroxide (TMAH) with a concentration of 2.38% by mass at 23° C., and then water rinsing was conducted with pure water for 30 seconds followed by shaken dry.

As a result, in any case of Examples 1 to 11 and Comparative Examples 1 and 2, a line and space resist pattern (referred to as L/S pattern, hereinafter) having a line width of 120 nm and a pitch of 240 nm was formed.

In addition, when the obtained L/S patterns were observed using a scanning electron microscopy (SEM), good shape was found for each of the L/S patterns obtained using the positive resist composition of Examples 1 to 11 and Comparative Examples 1 and 2.

The resins (A)-7 to (A)-11 used in Examples 12 to 16 and Comparative Examples 4 to 6 described below were obtained by copolymerizing the aforementioned monomers (5) to (8) and the monomers (9) to (11) described below according to a known droplet polymerization method.

For each of the obtained resins, the GPC measurement was carried out to obtain the weight average molecular weight (Mw) and the polydispersity (Mw/Mn) thereof. The results are additionally described in Table 7.

TABLE 7

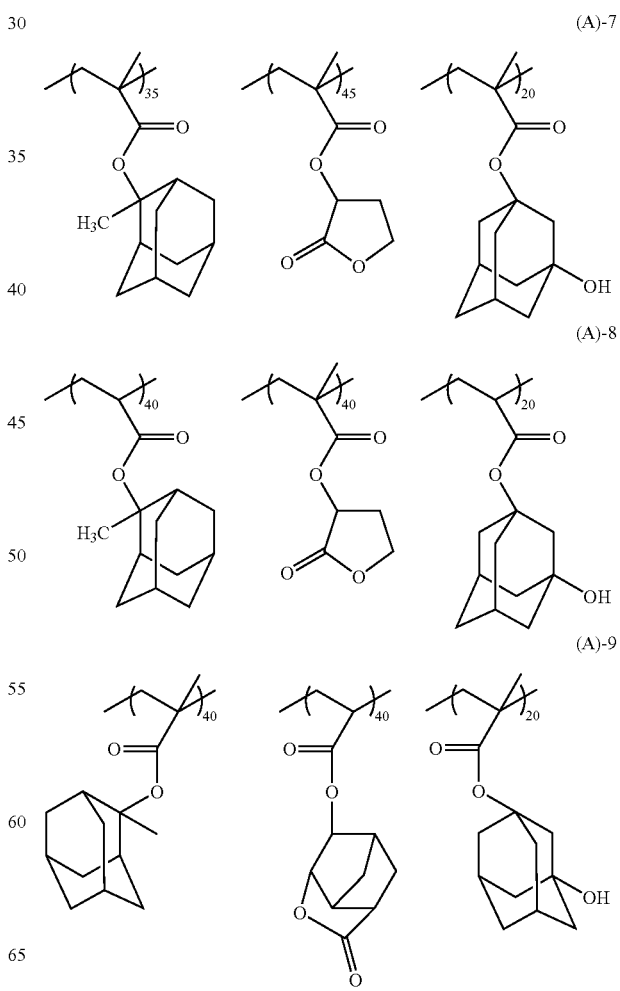

| | (5) | (6) | (7) | (8) | (9) | (10) | (11) | Mw | Mw/Mn |
|---|---|---|---|---|---|---|---|---|---|
| (A)-7 | 35 | 45 | — | 20 | — | — | — | 7000 | 1.8 |
| (A)-8 | — | 40 | 20 | — | 40 | — | — | 10000 | 2.0 |
| (A)-9 | 40 | — | — | 20 | — | — | 40 | 10000 | 2.0 |
| (A)-10 | 45 | — | — | 10 | — | — | 45 | 10000 | 1.8 |
| (A)-11 | — | 40 | — | 20 | — | 40 | — | 10000 | 1.8 |

The chemical structures of the resins (A)-7 to (A)-11 are shown below.

In the chemical formulas, the values that were appended to the lower right of 0 represent the ratio (mol %) of each structural unit.

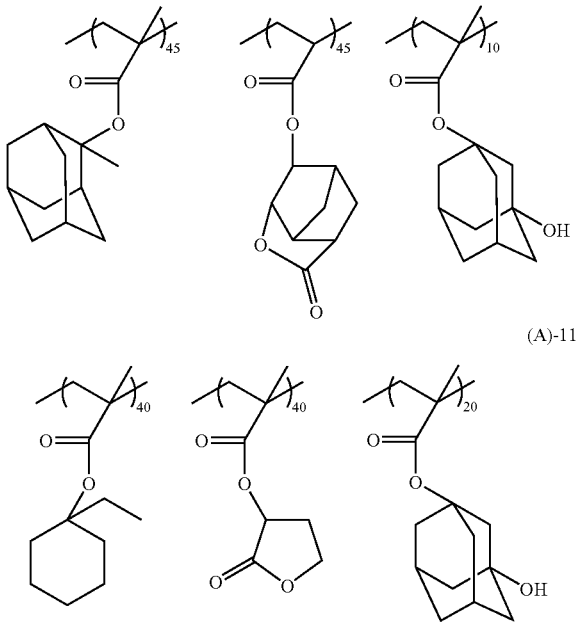

Examples 12 to 16 and Comparative Examples 4 to 6

The components as shown in Table 8 were mixed and dissolved to prepare a positive resist composition.

Each of the symbols in Table 8 has the meaning as follows, and the values in [ ] represent blending amounts (parts by mass).

Herein, (A)-4, (B)-1, (D)-1, and (S)-1 were the same as (A)-4, (B)-1, (D)-1, and (S)-1 used in the aforementioned Examples 1 to 11 and Comparative Examples 1 to 3.

(B)-2: triphenylsulfonium nonafluoro-n-butanesulfonate
(D)-2: Triethanolamine
(E)-1: Salicylic acid
(S)-2: mixed solvent of PGMEA/EL 60/40 (mass ratio)
(S)-3: mixed solvent of PGMEA/EL=80/20 (mass ratio)

The obtained positive resist composition solution was applied onto a silicon wafer with a diameter of 8 inch by using a spinner, and dried by prebaking at the temperature described in Table 9 for 60 seconds on a hot plate, to thereby form a resist film with a thickness of 175 nm.

For the obtained resist films, the measurement of the receding angle and the sliding angle, and the material elution evaluation were conducted in the same way as the aforementioned. The results are shown in Tables 9 and 10. As for the material elution evaluation, each of the elution quantities (mol/cm$^2$) of the cation portion (PAG+) and the anion portion (PAG−), and the sum thereof are shown.

TABLE 8

| | Component (A) | | | Component (B) | Component (D) | Component (E) | Component (S) |
|---|---|---|---|---|---|---|---|
| Example 12 | (A)-4 [1.0] | (A)-7 [100] | — | (B)-1 [8.0] | (D)-1 [1.2] | (E)-1 [1.32] | (S)-1 [2000] |
| Example 13 | (A)-4 [2.0] | (A)-7 [100] | — | (B)-1 [8.0] | (D)-1 [1.2] | (E)-1 [1.32] | (S)-1 [2000] |
| Comparative Example 4 | — | (A)-8 [100] | — | (B)-1 [4.0] | (D)-2 [0.25] | — | (S)-2 [2000] |
| Example 14 | (A)-4 [2.0] | (A)-8 [100] | — | (B)-1 [4.0] | (D)-2 [0.25] | — | (S)-2 [2000] |
| Comparative Example 5 | — | (A)-9 [100] | — | (B)-2 [3.5] | (D)-2 [0.1] | — | (S)-2 [2000] |
| Example 15 | (A)-4 [2.0] | (A)-9 [100] | — | (B)-2 [3.5] | (D)-2 [0.1] | — | (S)-2 [2000] |
| Comparative Example 6 | — | (A)-10 [80] | (A)-11 [20] | (B)-1 [3.0] | (D)-2 [0.15] | (E)-1 [0.15] | (S)-3 [2000] |
| Example 16 | (A)-1 [1.0] | (A)-10 [80] | (A)-11 [20] | (B)-1 [3.0] | (D)-2 [0.15] | (E)-1 [0.15] | (S)-3 [2000] |

TABLE 9

| | | Sliding Angle (°) | | Receding Angle (°) | |
|---|---|---|---|---|---|
| | PAB Temperature | Before exposure | After exposure | Before exposure | After exposure |
| Example 12 | 110° C. | 20.5 | 20.0 | 72.9 | 73.2 |
| Example 13 | 110° C. | 16.5 | 14.5 | 82.4 | 84.4 |
| Comparative Example 4 | 100° C. | 31.5 | 36.0 | 46.4 | 42.3 |
| Example 14 | 100° C. | 13.0 | 13.0 | 86.2 | 86.8 |
| Comparative Example 5 | 105° C. | 21.0 | 25.5 | 56.0 | 52.4 |
| Example 15 | 105° C. | 14.0 | 13.5 | 85.6 | 85.7 |
| Comparative Example 6 | 145° C. | 21.0 | 25.0 | 58.0 | 55.3 |
| Example 16 | 145° C. | 21.5 | 26.0 | 59.7 | 57.1 |

TABLE 10

| | Elution Quantity (×10⁻¹² mol/cm²) | | | | |
| --- | --- | --- | --- | --- | --- |
| | Before exposure | | After exposure | | |
| | PAG+ | PAG− | PAG+ | PAG− | Total |
| Example 12 | 4.95 | 5.58 | 0.29 | 11.40 | 22.22 |
| Example 13 | 1.42 | 1.64 | 0.12 | 4.82 | 8.00 |
| Comparative Example 4 | 23.09 | 29.86 | 0.03 | 35.15 | 88.14 |
| Example 14 | 0.47 | 1.52 | 0 | 4.55 | 6.54 |
| Comparative Example 5 | 11.34 | 10.74 | 0.01 | 17.33 | 39.43 |
| Example 15 | 1.45 | 1.13 | 0 | 3.89 | 6.47 |
| Comparative Example 6 | 12.85 | 13.24 | 0 | 18.83 | 44.92 |
| Example 16 | 5.25 | 7.24 | 0 | 11.90 | 24.39 |

As is clear from the results of Table 9, in the case of using the positive resist compositions of Examples 12 to 16 which used both of the resin (A)-4 corresponding to the resin (A1) and any one of the resins (A)-7 to (A)-11 corresponding to the resin (A2), the receding angles of the resist films were large in both cases before and after exposure, in comparison with Comparative Examples 4 to 6 which used the resin (A2) alone. Also, the difference between the receding angles before and after exposure was small.

Also, as is clear from the results of Table 10, in the case where the positive resist compositions of Examples 12 to 16 were used, the elution of the component (B) into the immersion medium (water) was inhibited before and after the exposure process. In particular, the effect of inhibiting the elution of the anion portion (PAG−) was remarkable. Among the aforementioned Examples, in Examples 13 to 15 where (A)-4 was blended at 2 parts by mass, the elution quantities were particularly small, and the effect of inhibiting the elution was high.

<Lithography Characteristics>

An organic anti-reflective film composition "ARC-29" (trademark, manufactured by Brewer Science, Inc.) was applied onto an 8-inch silicon wafer by using a spinner, and sintered at 205° C. for 60 seconds on a hot plate to form an organic anti-reflective film having a film thickness of 77 µm. Each of the positive resist composition solutions of Examples 12 to 16 and Comparative Examples 4 to 6 was applied onto the anti-reflective film by using a spinner, and dried by prebaking it on a hot plate at the PAB temperature described in Table 9 for 60 seconds to form a resist film having a film thickness of 175 nm.

Subsequently, the obtained resist film was selectively irradiated with an ArF excimer laser (193 µm) via a mask pattern by using an ArF exposure apparatus NSR-S302 (manufactured by Nikon Corporation, NA (numerical aperture)=0.60, 2/3 annular illumination). Then, PEB treatments were conducted at 110° C. for 60 seconds in Examples 12 and 13, at 100° C. for 60 seconds in Comparative Example 4 and Example 14, at 90° C. for 60 seconds in Comparative Example 5 and Example 15, and at 145° C. for 60 seconds in Comparative Example 6 and Example 16, respectively. Furthermore, developing was conducted for 30 seconds in an aqueous solution of tetramethylammonium hydroxide (TMAH) with a concentration of 2.38 mass % at 23° C., and then water rinsing was conducted with pure water for 30 seconds followed by shaken dry.

As a result, in any case of Examples 12 to 16 and Comparative Examples 4 to 6, a L/S pattern having a line width of 120 nm and a pitch of 240 nm was formed.

According to the aforementioned results, a resist composition of the present invention that simultaneously uses the resin (A1) and the resin (A2) is preferable for immersion lithography due to the effect of inhibiting the material elution, and is excellent in lithography characteristics.

INDUSTRIAL APPLICABILITY

The present invention can provide a resist composition for immersion lithography which is reduced in LWR. Therefore, the present invention is industrially applicable.

The invention claimed is:

1. A resist composition for immersion lithography comprising:
   a resin component (A) which exhibits changed alkali solubility under the action of acid; and
   an acid generator component (B) which generates acid on exposure, wherein
   the resin component (A) includes a resin (A1), which is a homopolymer of a structural unit (a) which is represented by the following general formula (a) and contains a fluorine atom and no acid-dissociable group, and a resin (A2) containing a structural unit (a') derived from an acrylic acid and no fluorine atom,
   the mass ratio of the resin (A1) and resin (A2) is 0.1-20: 99.9:80, and
   the resin (A1) contains a fluorinated hydroxyalkyl group,

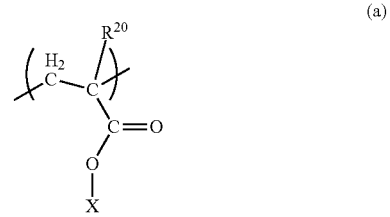

(a)

wherein $R^{20}$ represents a hydrogen atom, a halogen atom, an alkyl group, or a halogenated alkyl group; and X represents a monovalent organic group comprising the fluorinated hydroxyalkyl group.

2. The resist composition for immersion lithography according to claim 1, wherein the resin component (A) contains an acid-dissociable, dissolution-inhibiting group and exhibits increased alkali solubility under the action of acid.

3. The resist composition for immersion lithography according to claim 1, wherein the structural unit (a) is a structural units represented by general formula (a0-1) or (a0-2),

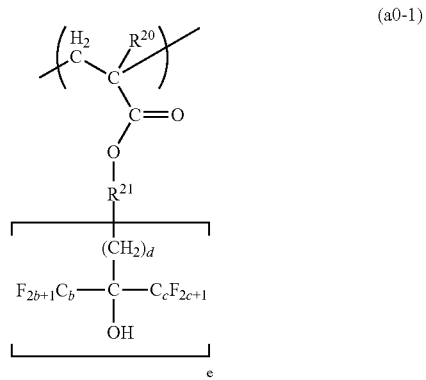

(a0-1)

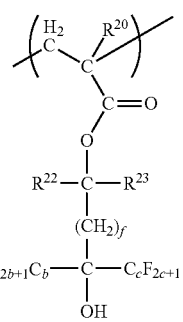

(a0-2)

[wherein, $R^{20}$ represents a hydrogen atom, an alkyl group, a halogen atom, or a halogenated alkyl group; $R^{21}$ represents an (e+1)-valent aliphatic cyclic group or (e+1)-valent chain-like saturated aliphatic hydrocarbon group; $R^{22}$ and $R^{23}$ each independently represents a hydrogen atom or a monovalent aliphatic cyclic group, and at least one of $R^{22}$ and $R^{23}$ represent the aliphatic cyclic group; d and f each independently represents an integer of 0 to 5; b and c each independently represents an integer of 1 to 5; and e represents an integer of 1 to 3.]

4. The resist composition for immersion lithography according to claim 1, wherein the resin (A2) contains a structural unit (a'1) derived from an acrylate ester containing no fluorine atom and containing an acid-dissociable, dissolution-inhibiting group.

5. The resist composition for immersion lithography according to claim 4, wherein the resin (A2) further contains a structural unit (a'2) derived from an acrylate ester containing no fluorine atom and containing a lactone-containing cyclic group.

6. The resist composition for immersion lithography according to claim 4, wherein the resin (A2) further contains a structural unit (a'3) derived from an acrylate ester containing no fluorine atom and containing a polar group-containing aliphatic hydrocarbon group.

7. The resist composition for immersion lithography according to claim 1, further comprising a nitrogen-containing organic compound (D).

8. The resist composition for immersion lithography according to claim 1, wherein the mass ratio of the resin (A1) and resin (A2) is 0.5-20:99.5-80.

9. A method for forming a resist pattern, comprising: forming a resist film on a substrate using a resist composition for immersion lithography according to any one of claims 1, 2, 3-7 and 8; conducting immersion exposure of the resist film; and developing the resist film to form the resist pattern.

* * * * *

UNITED STATES PATENT AND TRADEMARK OFFICE
CERTIFICATE OF CORRECTION

PATENT NO. : 8,394,569 B2
APPLICATION NO. : 12/278376
DATED : March 12, 2013
INVENTOR(S) : Makiko Irie et al.

It is certified that error appears in the above-identified patent and that said Letters Patent is hereby corrected as shown below:

In the Specification:

In Column 4, Line 16, please delete "dose" and insert --does-- therefor.

In Column 9, Line 58, please delete "hereinafter," and insert --(hereinafter,-- therefor.

In Column 10, Line 34, please delete "methylbuthane." and insert --methylbutane.-- therefor.

In Column 10, Line 44, please delete "(a0-11)" and insert --(a0-1)-- therefor.

In Column 10, Line 48, please delete "(a0-1)" and insert --(a0-1-1)-- therefor.

In Column 11, Line 35, please delete "norbonyl" and insert --norbornyl-- therefor.

In Column 12, Line 3, please delete "group" and insert --group.-- therefor.

In Column 13, Line 24, please delete "below" and insert --below.-- therefor.

In Column 65, Line 6, please delete "fiber" and insert --further-- therefor.

In Column 66, Line 16, please delete "110" and insert --10-- therefor.

In Column 66, Line 32, please delete "110" and insert --10-- therefor.

In Column 70, Lines 46-47, please delete "(methylsulfonyloxyiniino)" and insert --(methylsulfonyloxyimino)-- therefor.

In Column 73, Line 6, please delete "H111" and insert --H11-- therefor.

In Column 80, Line 52, please delete "0" and insert --()-- therefor.

In Column 86, Line 26, please delete "0" and insert --()-- therefor.

In Column 89, Line 42, please delete "μm." and insert --nm.-- therefor.

In Column 89, Line 50, please delete "μm)" and insert --nm)-- therefor.

Signed and Sealed this
Fifteenth Day of October, 2013

Teresa Stanek Rea
*Deputy Director of the United States Patent and Trademark Office*